United States Patent
Chuang et al.

(10) Patent No.: US 11,600,618 B2
(45) Date of Patent: Mar. 7, 2023

(54) INTEGRATED CIRCUIT STRUCTURE AND MANUFACTURING METHOD THEREOF

(71) Applicant: TAIWAN SEMICONDUCTOR MANUFACTURING COMPANY, LTD., Hsinchu (TW)

(72) Inventors: Harry-Hak-Lay Chuang, Hsinchu County (TW); Li-Feng Teng, Hsinchu (TW); Wei-Cheng Wu, Hsinchu County (TW); Fang-Lan Chu, Taichung (TW); Ya-Chen Kao, Taoyuan (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 41 days.

(21) Appl. No.: 17/206,076

(22) Filed: Mar. 18, 2021

(65) Prior Publication Data

US 2022/0302114 A1 Sep. 22, 2022

(51) Int. Cl.
| | |
|---|---|
| *H01L 27/092* | (2006.01) |
| *H01L 29/08* | (2006.01) |
| *H01L 29/423* | (2006.01) |
| *H01L 29/417* | (2006.01) |
| *H01L 29/49* | (2006.01) |

(Continued)

(52) U.S. Cl.
CPC .... *H01L 27/0922* (2013.01); *H01L 21/28088* (2013.01); *H01L 21/82385* (2013.01); *H01L 21/823814* (2013.01); *H01L 21/823821* (2013.01); *H01L 21/823842* (2013.01); *H01L 21/823864* (2013.01); *H01L 21/823871* (2013.01); *H01L 21/823878* (2013.01); *H01L 21/823892* (2013.01); *H01L 27/0924* (2013.01); *H01L 29/0847* (2013.01); *H01L 29/41791* (2013.01); *H01L 29/42376* (2013.01); *H01L 29/4966* (2013.01); *H01L 29/6656* (2013.01); *H01L 29/66492* (2013.01); *H01L 29/66545* (2013.01); *H01L 29/66636* (2013.01); *H01L 29/66795* (2013.01); *H01L 29/7833* (2013.01);

(Continued)

(58) Field of Classification Search
CPC .......... H01L 27/0922; H01L 21/28088; H01L 21/823814; H01L 21/823821; H01L 21/823842; H01L 21/82385; H01L 21/823864; H01L 21/823871; H01L 21/823878; H01L 21/823892; H01L 27/0924; H01L 29/0847; H01L 29/41791; H01L 29/42376; H01L 29/4966; H01L 29/66492; H01L 29/66545; H01L 29/6656; H01L 29/66636; H01L 29/66795; H01L 29/7833; H01L 29/7851; H01L 27/1104
See application file for complete search history.

(56) References Cited

U.S. PATENT DOCUMENTS

2018/0151447 A1* 5/2018 Lee ................. H01L 21/823431

\* cited by examiner

*Primary Examiner* — Karen Kusumakar
*Assistant Examiner* — Adam S Bowen
(74) *Attorney, Agent, or Firm* — Maschoff Brennan

(57) ABSTRACT

A includes depositing a gate electrode layer over a semiconductor substrate; patterning the gate electrode layer into a first gate electrode and a gate electrode extending portion; forming a first gate spacer alongside the first gate electrode; patterning the gate electrode extending portion into a second gate electrode after forming the first gate spacer; and forming a second gate spacer alongside the second gate electrode and a third gate spacer around the first spacer.

20 Claims, 71 Drawing Sheets

(51) Int. Cl.
*H01L 29/78* (2006.01)
*H01L 21/28* (2006.01)
*H01L 21/8238* (2006.01)
*H01L 29/66* (2006.01)
*H01L 27/11* (2006.01)

(52) U.S. Cl.
CPC ...... *H01L 29/7851* (2013.01); *H01L 27/1104* (2013.01)

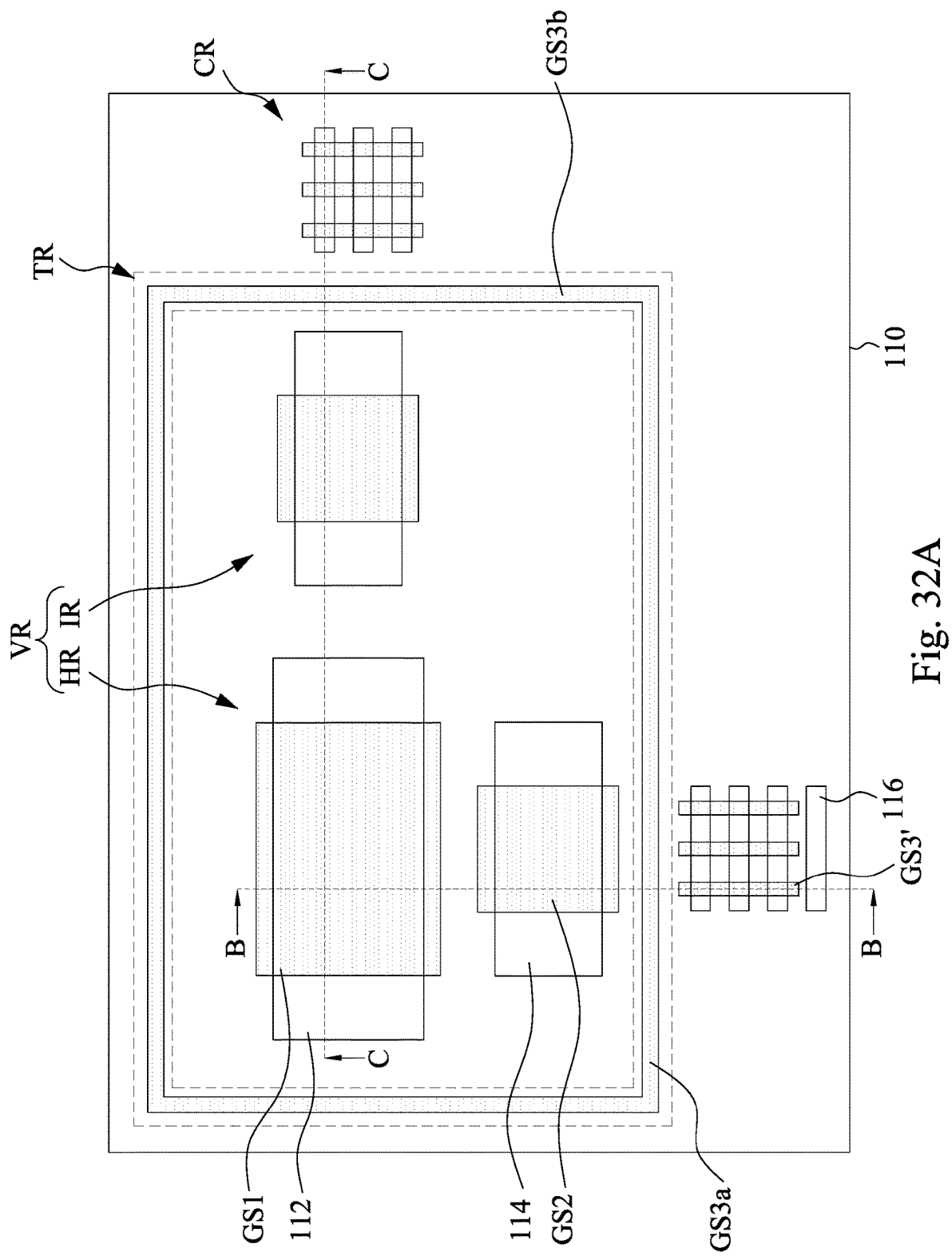

INTEGRATED CIRCUIT STRUCTURE AND MANUFACTURING METHOD THEREOF

BACKGROUND

As the semiconductor industry has strived for higher device density, higher performance, and lower costs, problems involving both fabrication and design have been encountered. One solution to these problems has been the development of a fin-like field effect transistor (FinFET). A FinFET includes a thin vertical 'fin' formed in a freestanding manner over a surface of a substrate. The source, drain, and channel regions are defined within this fin. The transistor's gate wraps around the channel region of the fin. This configuration allows the gate to induce current flow in the channel from three sides. Thus, FinFET devices have the benefit of higher current flow and reduced short-channel effects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
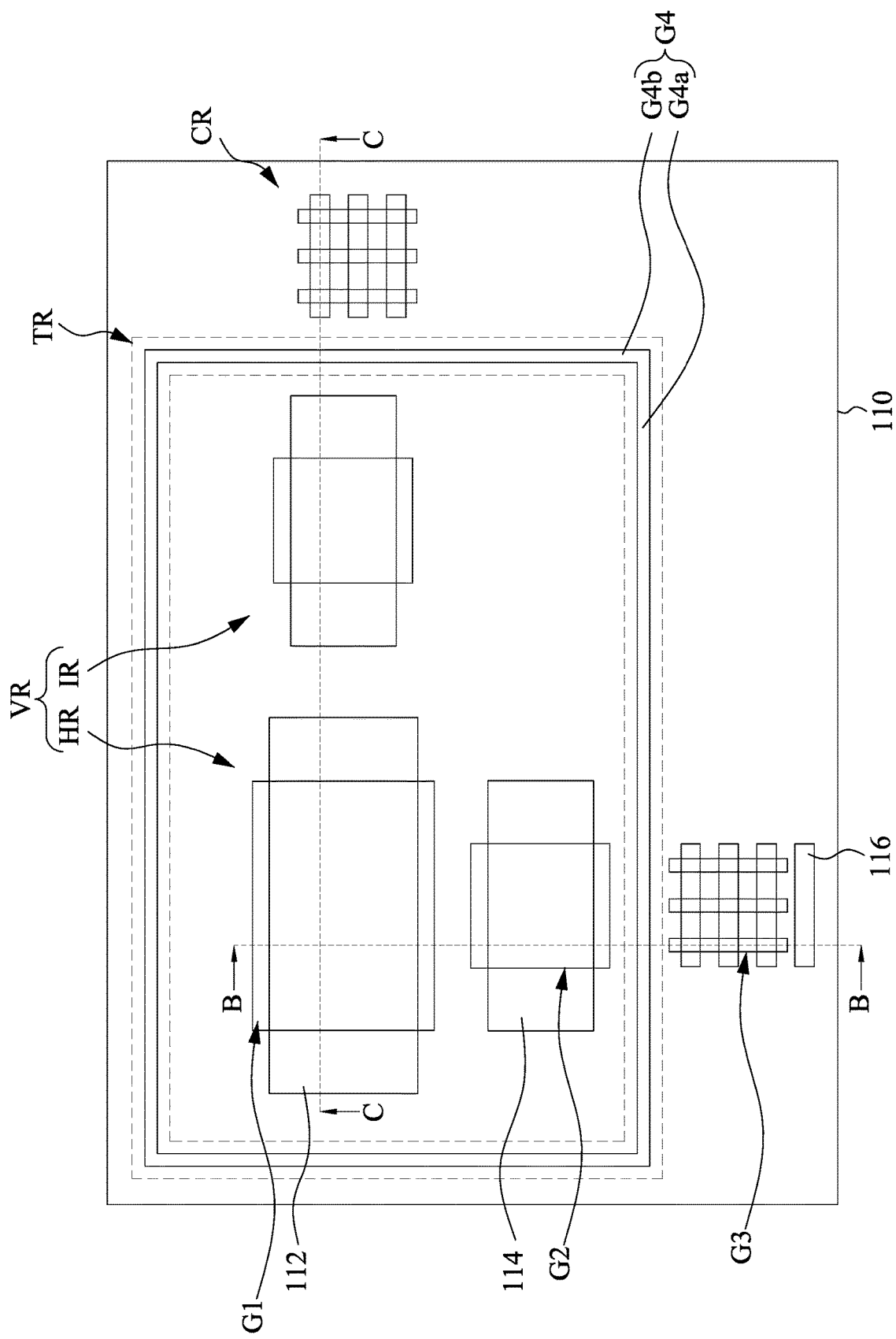
FIG. 1A is a top view of an integrated circuit (IC) structure in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be indirect contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. As used herein, "around," "about," "approximately," or "substantially" shall generally mean within 20 percent, or within 10 percent, or within 5 percent of a given value or range. Numerical quantities given herein are approximate, meaning that the term "around," "about," "approximately," or "substantially" can be inferred if not expressly stated.

Fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in some embodiments, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

Figure 1B:
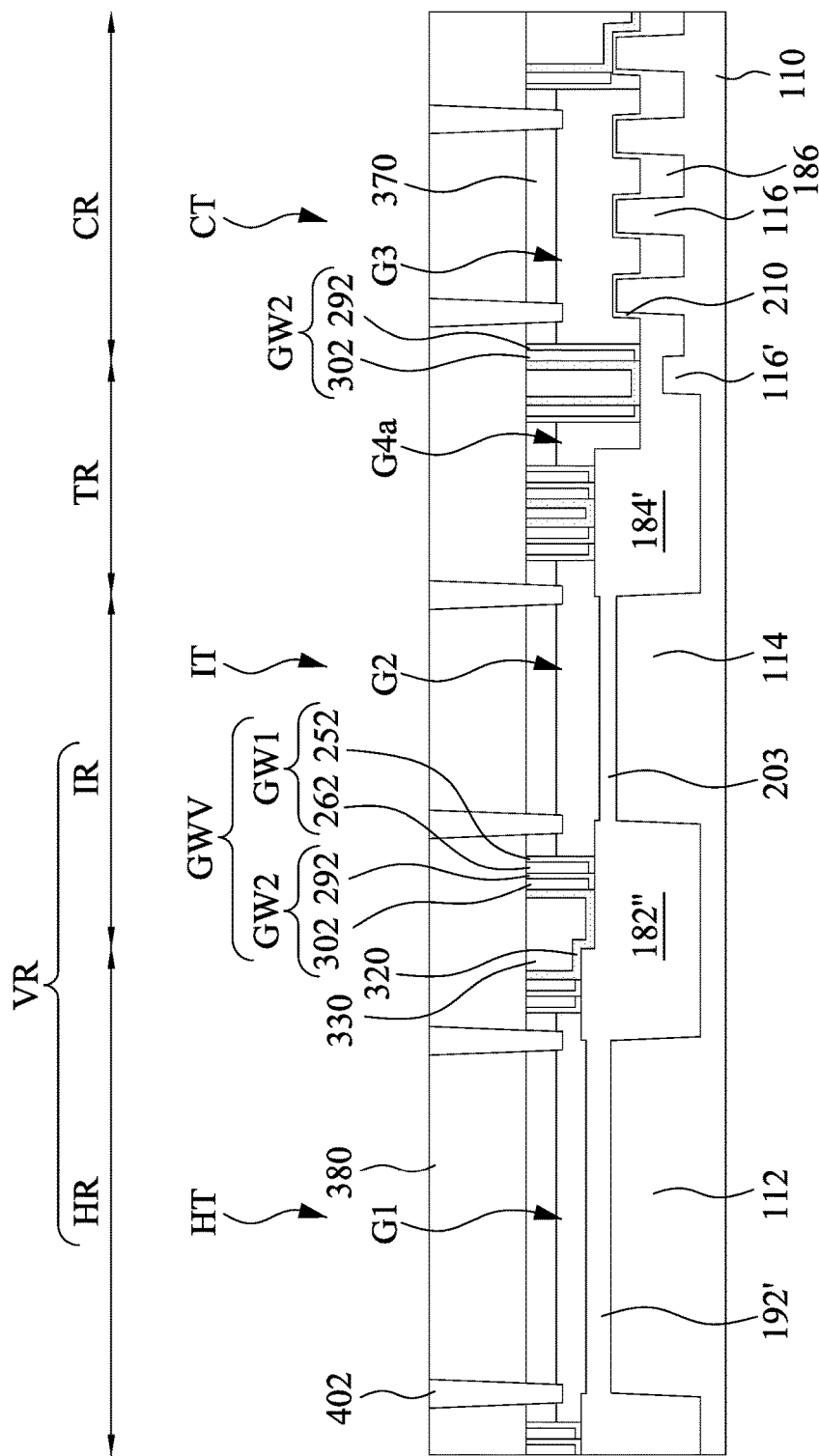
FIG. 1B is a cross-sectional view taken along line B-B in FIG. 1A.
Figure 1C:
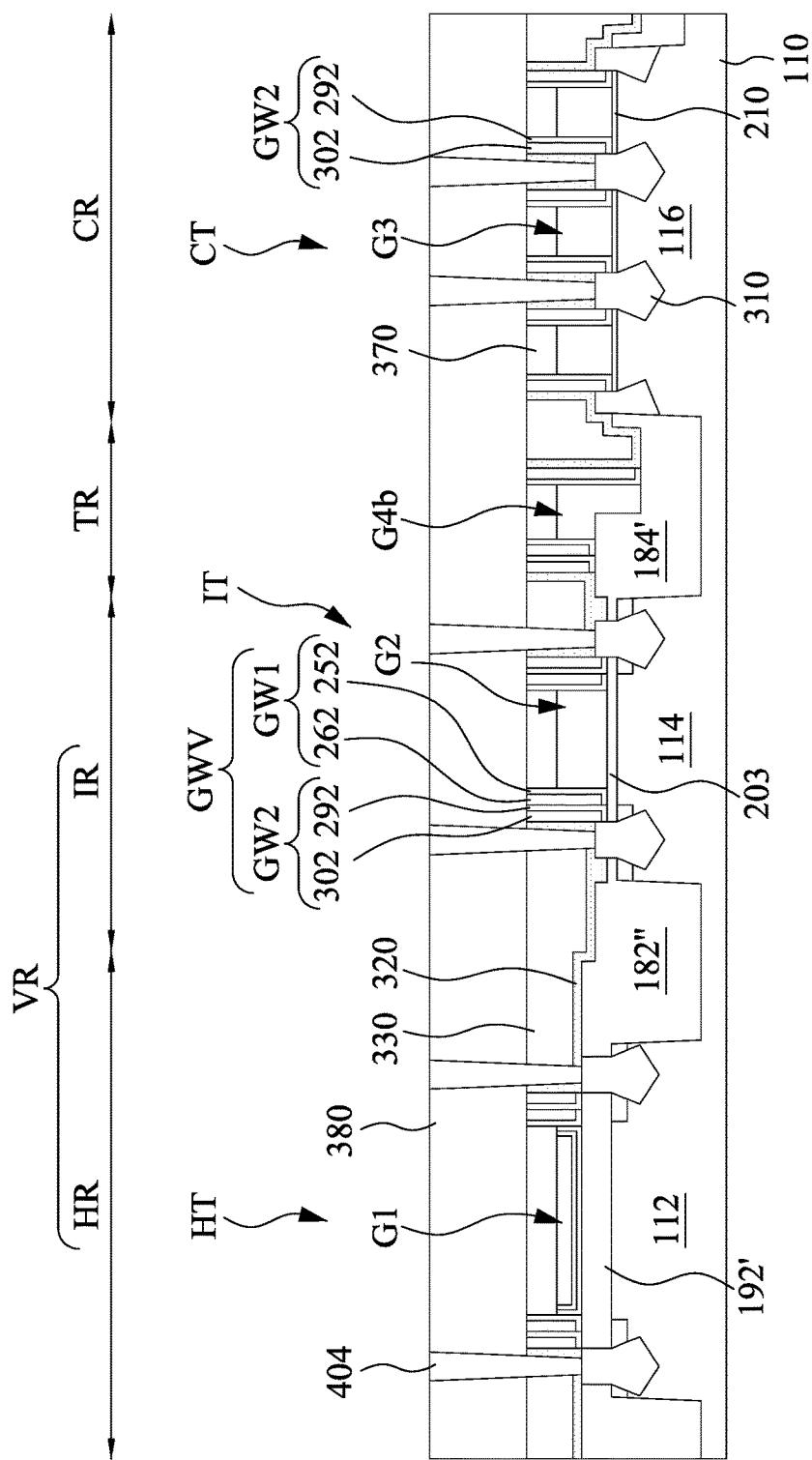
FIG. 1C is a cross-sectional view taken along line C-C in FIG. 1A.

FIG. 1A is a top view of an integrated circuit (IC) structure in accordance with some embodiments. FIG. 1B is a cross-sectional view taken along line B-B in FIG. 1A. FIG. 1C is a cross-sectional view taken along line C-C in FIG. 1A. The IC structure includes a substrate 110, and a high voltage device HT, a I/O device IT, and a core device CT over the substrate 110.

In some embodiments, the substrate 110 includes a core region CR, a region VR adjacent the core region CR, and a transition region TR disposed between the core region CR and the region VR. In some embodiments, the region VR may include a high-voltage region HR, one or more input/output (I/O) region IR, or the combination thereof. The high-voltage region HR, I/O region IR, and the core region CR may respectively accommodate the high voltage device HT, the I/O device IT, and the core device CT. In some embodiments, the high voltage device HT and the I/O device IT over the region VR may operate with a voltage higher than an operating voltage of the core device CT over the core region CR. For example, the core device CT may operate with voltage lower than 1.1 Volts, the high voltage device HT may operate with a voltage greater than 5 Volts, and the I/O device IT may operate with a voltage from about 1.62 Volts to about 3.63 Volts. In some embodiments, the I/O region IR may include a region operating with a voltage of about 1.8 Volts, a region operating with a voltage of about 2.5 Volts, or the combination thereof. In some embodiments, the core region CR may accommodate multi-channel transistors, such as FinFet. In some embodiments, the high-voltage region HR and/or the I/O region IR may accommodate planar transistors. For example, the high voltage device HT may be a FinFet, and the I/O device IT and a core device CT may be planar transistors. In some embodiments, some of plural core devices CT may form static random access memory (SRAM). In some embodiments, some of plural core devices CT, some of plural high voltage devices HT, and some of plural I/O devices IT may form intellectual property core (IP).

In some embodiments, the high voltage device HT may include an active region 112 of the substrate 110, a dielectric layer 192' over the active region 112, a gate structure G1 over the dielectric layer 192', and epitaxial source/drain structures 310. In some embodiments, the I/O device IT may include an active region 114 of the substrate 110, a dielectric layer 203 over the active region 112, a gate structure G2 over the dielectric layer 203, and epitaxial source/drain structures 310. In some embodiments, the core device CT may include semiconductor fins 116 of the substrate 110, a dielectric layer 210 over the semiconductor fins 116, a gate structure G3 over the dielectric layer 210, and epitaxial source/drain structures 310. In some embodiments, contacts 402 and 404 are electrically connected to the gate structures G1-G3 and the epitaxial source/drain structures 310, respectively. In some embodiments, the gate structure G1-G3 may include a doped semiconductor material (e.g., doped polysilicon). In some alternatively embodiments, the gate structure G1-G3 may include a dielectric layer (including interfacial layer and high k dielectric layer) and a metal material. The gate structures G1 and G2 may have a size greater than that of the gate structure G3 from the top view. In other words, the gate structures G1 and G2 are larger than the gate structure G3 from a top view. In some embodiments where the gate structure G3 include the dielectric layer and the metal material, the dielectric layer 210 may be omitted. Masks 370 may be optionally formed over the gate structure G1-G3.

In some embodiments, the IC structure may include composite gate spacers. For example, gate spacers GWV are formed alongside the gate structures G1 and G2 over the region VR, and gate spacers GW2 are formed alongside the gate structure G3 over the core region CR. Each of the gate spacers GW2 over the core region CR may include a seal layer 292 and a spacer 302. Each of the gate spacers GWV over the region VR may include a gate spacer GW2 including a seal layer 292 and a spacer 302 and a gate spacer GW1 including a seal layer 252 and a spacer 262. Since the gate spacers GWV is thicker than the gate spacers GW2 over the core region CR, a distance between the gate structure G1/G2 and adjacent source/drain structures 310 in the region VR is greater than a distance between the gate structure G3 and adjacent source/drain structures 310 in the core region CR. Therefore, for the high voltage devices HT in the high voltage region HR and/or the I/O devices IT in the I/O region IR, better hot carrier injection (HCI) reliability performance can be achieved.

The IC structure may further include isolation feature 182", 184', and 186'. The isolation features 182" may space plural active regions (e.g., active regions 112 and/or 114) from each other. The isolation features 186' may space the semiconductor fins 116 from each other. In some embodiments, the isolation feature 184' is over the transition region TR and spaces the semiconductor fins 116 over the core region CR from the active regions (e.g., active regions 112 and/or 114) over the region VR.

The IC structure may further include a dummy gate structure G4 over the transition region TR, for example, over the isolation feature 184'. In some embodiments, the dummy gate structure G4 is not connected with a contact 402. Stated differently, the dummy gate structure G4 is electrically floating and thus does not serve as a functional gate. The dummy gate structure G4 may encircle the region VR and space the region VR from the core region CR. In some embodiments, the dummy gate structure G4 may include dummy gate structure G4a and dummy gate structure G4b extending along a direction intersecting an extending direction of the dummy gate structure G4a. For example, the dummy gate structure G4a extends along a direction that the semiconductor fin 116 extends along, and the dummy gate structure G4b extends along a direction that the gate structure G1-G3 extends along.

FIGS. 2 to 36B illustrate various stages of manufacturing an IC structure in accordance with some embodiments. It is understood that additional steps may be implemented before, during, or after the manufacturing process, and some of the steps described may be replaced or eliminated for other embodiments of the method.

Figure 2:
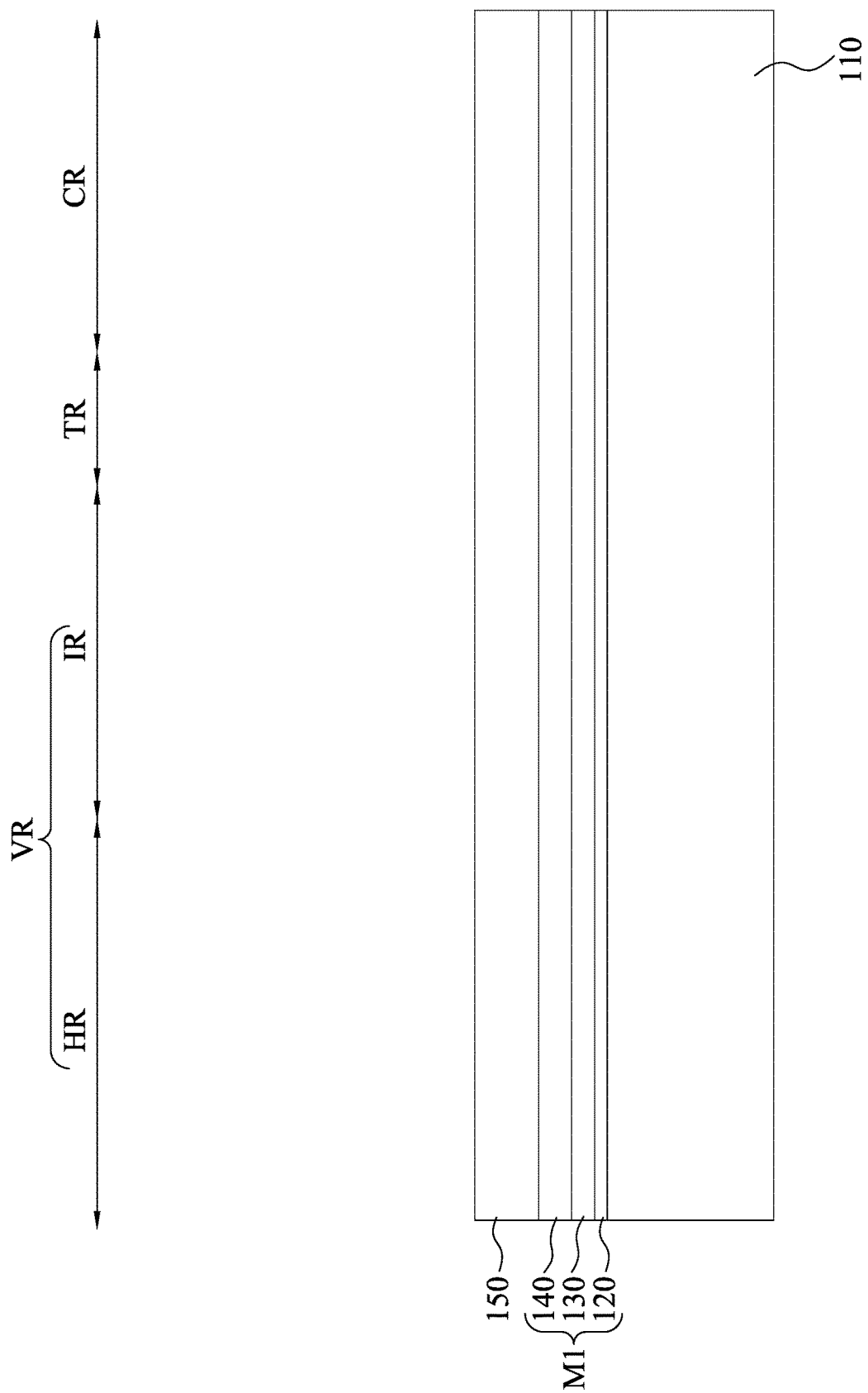
FIGS. 2 to 37B illustrate various stages of manufacturing an IC structure in accordance with some embodiments.

Reference is made to FIG. 2. A substrate 110 is provided. In some embodiments, the substrate 110 can be a semiconductor substrate, such as a bulk silicon substrate, a germanium substrate, a compound semiconductor substrate, or other suitable substrate. The substrate 110 may include an epitaxial layer overlying a bulk semiconductor, a silicon germanium layer overlying a bulk silicon, a silicon layer overlying a bulk silicon germanium, or a semiconductor-on-insulator (SOI) structure.

In some embodiments, a material layer M1 to be patterned is formed over the substrate 110. The material layer M1 may include multiple layer structures, such as a tri-layer stack, which includes a first layer 120, a second layer 130, and a third layer 140. In some embodiments, the first layer 120, the second layer 130, and the third layer 140 include suitable semiconductor materials and/or different dielectric materials to achieve desired etching selectivity, such as silicon, amorphous silicon, semiconductor oxide (e.g., silicon oxide ($SiO_2$)), semiconductor nitride (e.g., silicon nitride (SiN)), semiconductor oxynitride (e.g., silicon oxynitride (SiON)), and/or semiconductor carbide (e.g., silicon carbide (SiC)), the like, or the combination thereof. In some alternative embodiments, the material layer M1 may include any number of material layers, masking layers, sacrificial layers, resist layers and/or other layers formed upon the substrate 110.

Suitable materials for these layers may be selected, in part, based on etchant selectivity. For example, in the tri-layer stack, the second layer 130 may be made of a material different than that of the first layer 120 and the third layer 140, such that each layer (e.g., the first layer 120 or the second layer 130) can be removed using a corresponding etchant without significantly etching of the underlying layer. In other words, the first layer 120, the second layer 130, and the third layer 140 include materials having different etch rates. In some embodiments, the third layer 140 can serve as an etch mask for patterning the second layer 130; the second layer 130 can serve as an etch mask for patterning the first layer 120 and/or the substrate 110; and the first layer 120 can serve as an etch mask for patterning the substrate 110. For example, in some embodiments, the first layer 120 includes silicon oxide, the second layer 130 includes silicon nitride, and the third layer 140 includes silicon oxide.

In some embodiments, the first layer 120 may be referred to as a pad oxide layer formed using atomic layer deposition (ALD), chemical vapor deposition (CVD), thermal oxidation, the like, or the combination thereof. In some embodiments, the second layer 130 may be referred to as a hard mask layer formed using atomic layer deposition (ALD), chemical vapor deposition (CVD), the like, or the combination thereof. In some embodiments, the third layer 140 may be formed using atomic layer deposition (ALD), chemical vapor deposition (CVD), the like, or the combination thereof.

In some embodiments, a sacrificial layer 150 is formed over the material layer M1. The sacrificial layer 150 includes a different material than the material layer M1, thereby exhibiting different etchant sensitivity. In various embodiments, the sacrificial layer 150 includes a semiconductor material (e.g., amorphous silicon) and/or a dielectric material (e.g., a semiconductor oxide, semiconductor nitride, semiconductor oxynitride), the like, or the combination thereof. In some embodiments where the first layer 120 includes silicon oxide, the second layer 130 includes silicon nitride, and the third layer 140 includes silicon oxide, the sacrificial layer 150 may include amorphous silicon, other suitable material, the like, or the combination thereof. The sacrificial layer 150 may be formed by suitable deposition process, such as CVD, sputter, the like, or the combination thereof.

Figure 3:
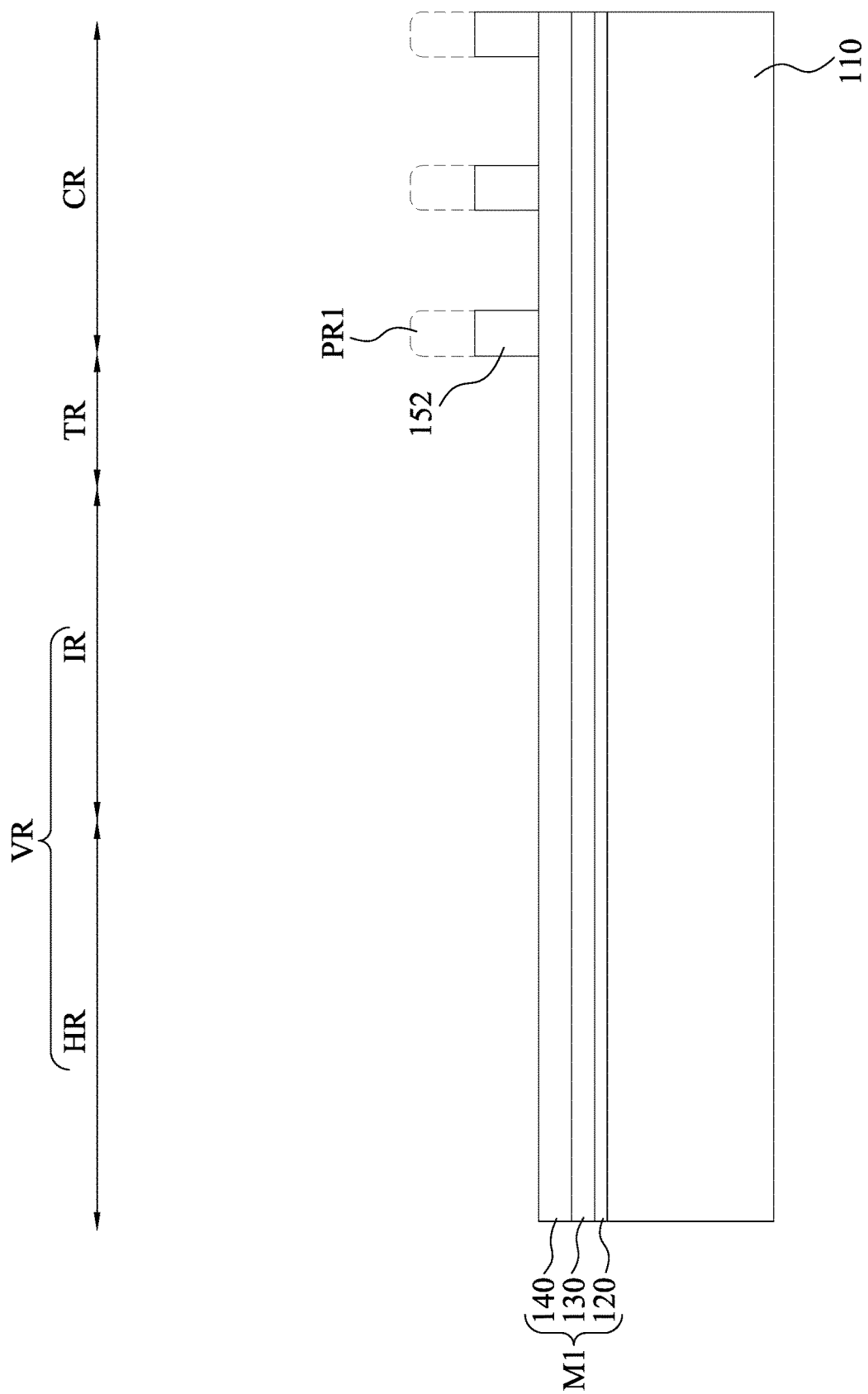

Reference is made to FIG. 3. A patterned resist layer PR1 is formed on the sacrificial layer 150 (referring to FIG. 2). The patterned resist layer PR1 may include plural layers made of suitable material or composition. In some embodiments, the patterned resist layer PR1 may be a photoresist mask formed by suitable photolithography process. For example, the photolithography process may include spin-on coating a photoresist layer over the structure as illustrated in FIG. 2, performing post-exposure bake processes, and developing the photoresist layer to form the patterned resist layer PR1. In some embodiments, patterning the resist to form the patterned mask element may be performed using an electron beam (e-beam) lithography process or an extreme ultraviolet (EUV) lithography process. In some other embodiments, the patterned resist layer PR1 may be tri-layer resist layer, for example, including a bottom layer (e.g., $C_xH_yO_z$), a middle layer (e.g., $SiC_xH_yO_z$), and a photoresist top layer.

The pattern is transferred from the resist layer PR1 to the sacrificial layer 150 (referring to FIG. 2) to form one or more mandrels 152. Mandrels 152 are a feature shape that may be used to align subsequently formed spacers rather than to pattern the material layer M1 directly. The transfer may include suitable etching process including wet etching, dry etching, reactive ion etching, ashing, and/or other suitable technique. The resist layer PR1 may act as an etch mask in the etching process. The etching process and/or etching reagents may be selected to etch the sacrificial layer 150 (referring to FIG. 2) without significantly etching of the material layer M1, and after the etching process, remaining portions of the sacrificial layer 150 (referring to FIG. 2) are referred to as mandrels 152. After the formation of the mandrels 152, remaining resist PR1 may be removed by suitable stripping methods.

Figure 4:
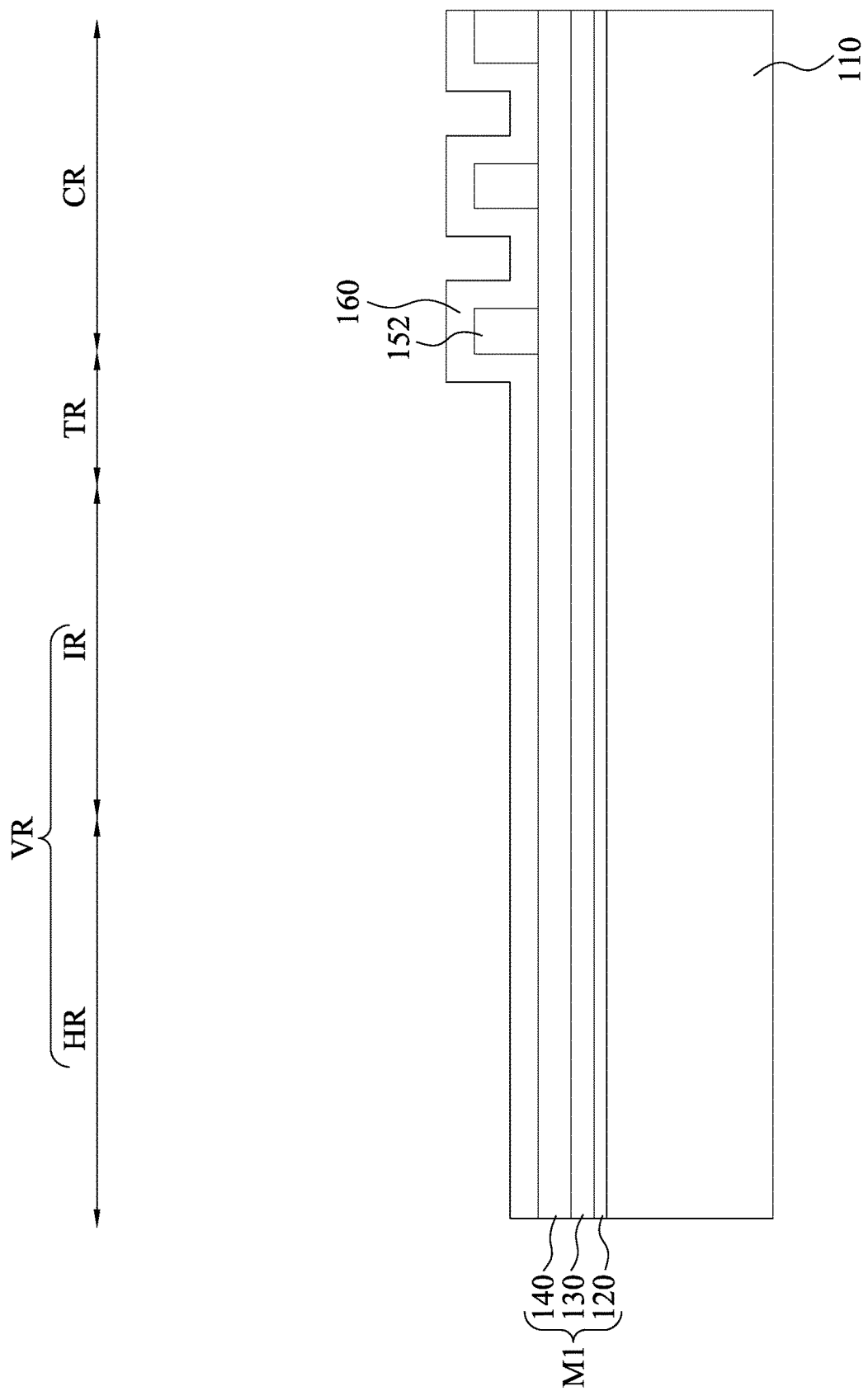

Reference is made to FIG. 4. A first spacer layer 160 is conformally deposited over the structure of FIG. 3. In some embodiments, material of the first spacer layer 160 is selected to have different etchant sensitivity from the mandrels 152 and the third layer 140 of the material layer M1. For example, the first spacer layer 160 may include suitable semiconductor, semiconductor oxide, semiconductor nitride, semiconductor oxynitride, or other dielectric material. In some embodiments where the mandrels 152 include amorphous silicon and the third layer 140 include silicon oxide, the first spacer layer 160 may include silicon nitride. The first spacer layer 160 may be deposited by atomic layer deposition (ALD), chemical vapor deposition (CVD), plasma-enhanced CVD (PECVD), or other suitable deposition techniques.

Figure 5:
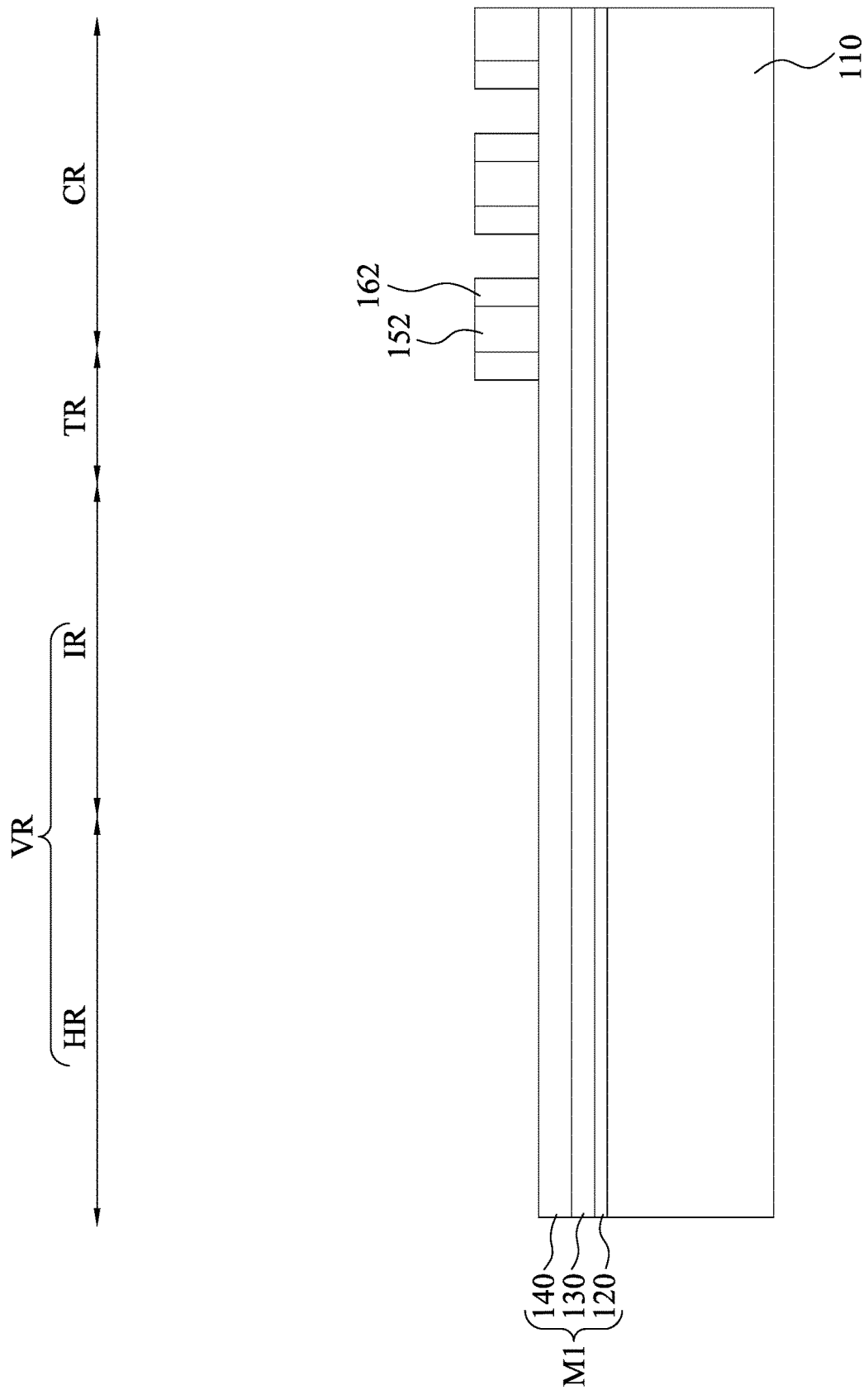

Reference is made to FIG. 5. An anisotropic etching process is performed to remove horizontal portions of the first spacer layer 160 (referring to FIG. 4), thereby forming the spacer masks 162 on sidewalls of the mandrels 152. The anisotropic etching process may be a dry etching process, such as plasma etching. The spacer masks 162 will act as an etch mask in subsequent process of patterning the material layer M1.

Figure 6:
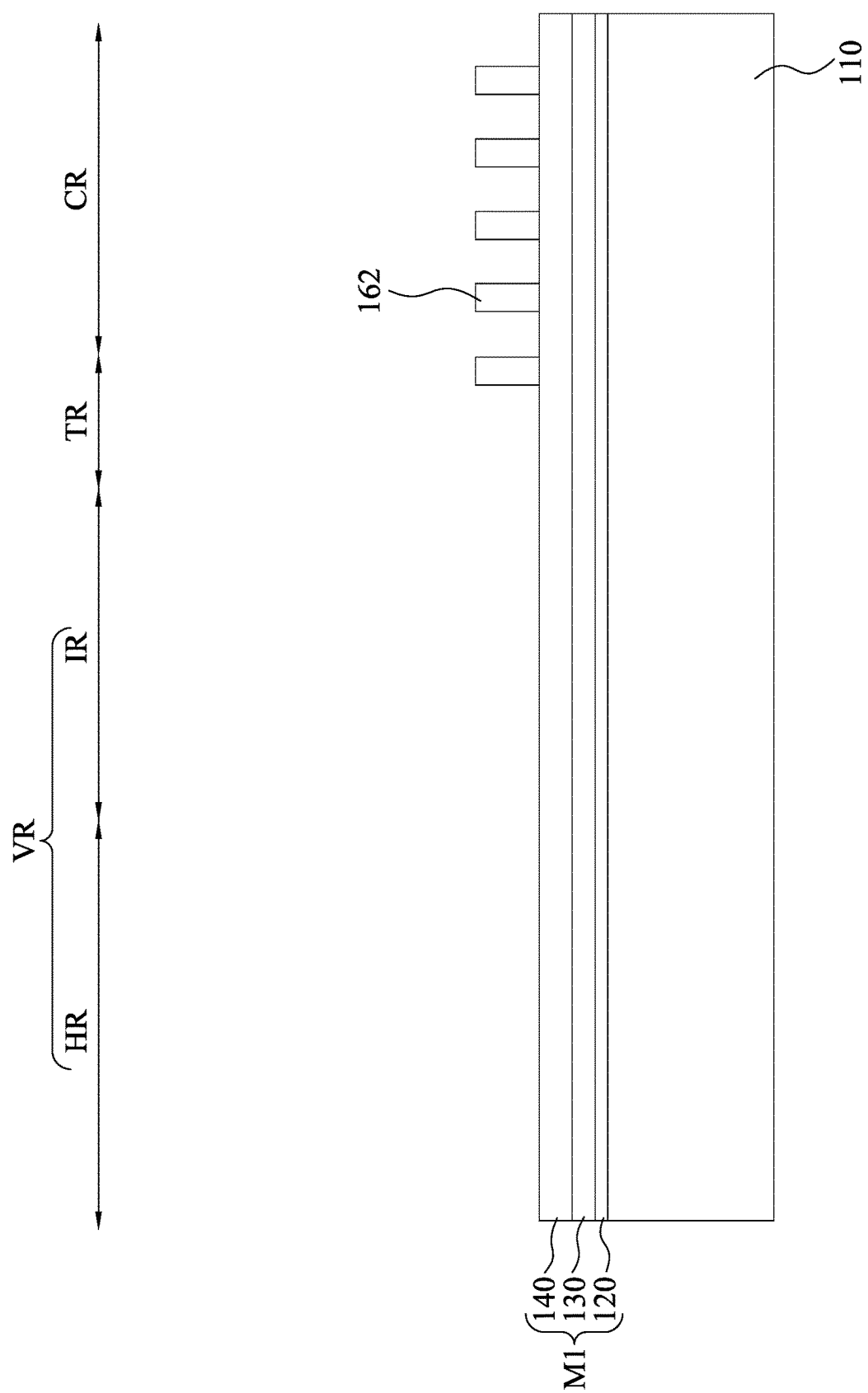

Reference is made to FIG. 6. The mandrels 152 (referring to FIG. 5) are removed, for example, by a selective etching process, leaving spacer masks 162 over the material layer M1. The removal of the mandrels 152 (referring to FIG. 5) may result in a space between the spacer masks 162.

Figure 7:
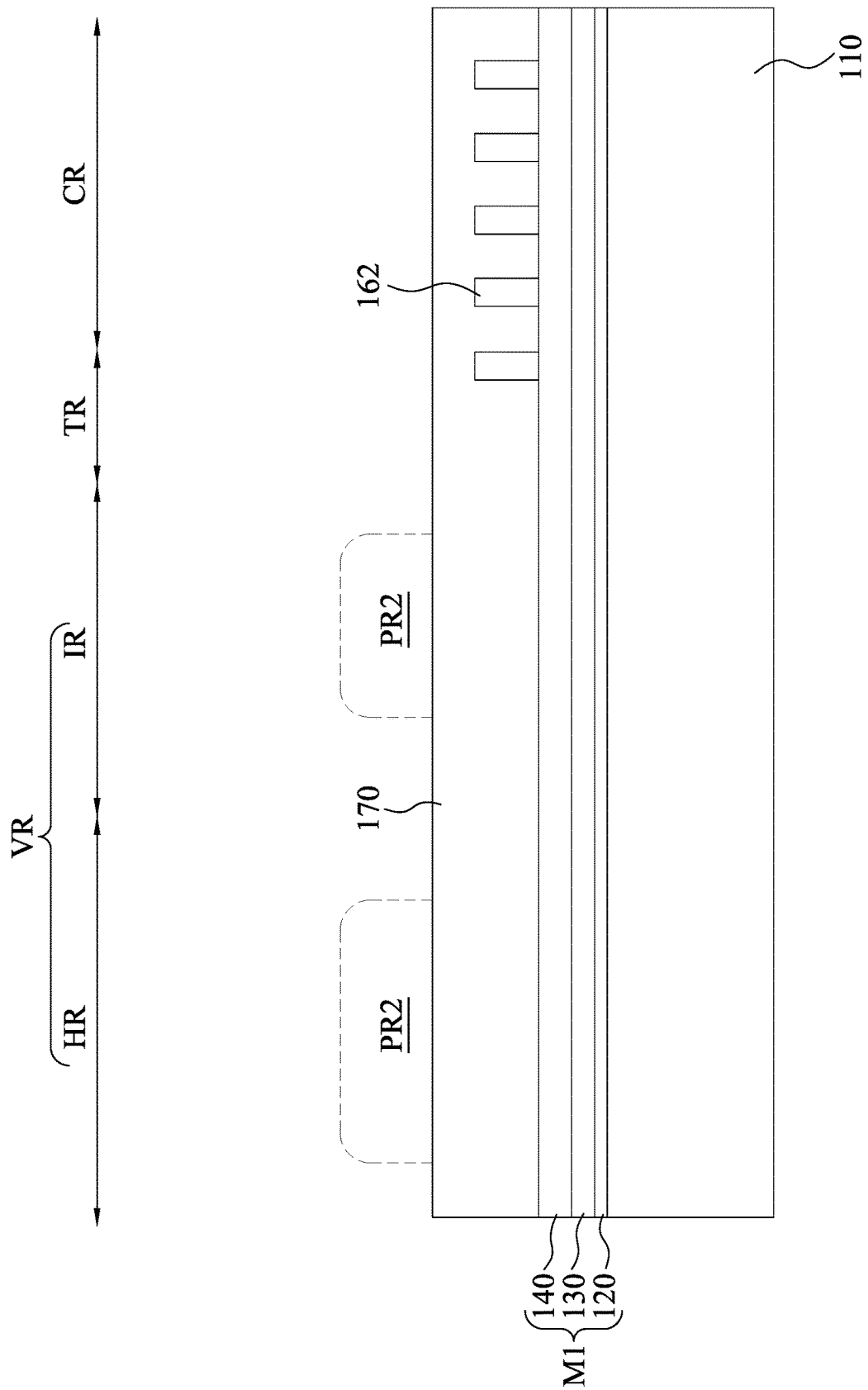

Reference is made to FIG. 7. A bottom anti-reflection coating (BARC) layer 170 is coated over the material layer M1 and the spacer masks 162. The BARC layer 170 may include silicon rich oxide, silicon oxycarbide (SiOC), the like, or the combination thereof. The BARC layer 170, formed with good flowability, may fill the recesses in the amorphous silicon material mandrels 152, and provide a more smooth topography than underlying structures. In some embodiments, the BARC layer 170 is used to reduce reflection during the photolithography process.

A patterned resist layer PR2 is then formed and subsequently patterned on the BARC layer 170. In some embodiments, the patterned resist layer PR2 may be a photoresist mask formed by suitable photolithography process. For example, the photolithography process may include spin-on coating a photoresist layer over the BARC layer 170, performing post-exposure bake processes, and developing the photoresist layer to form the patterned resist layer PR2. In some embodiments, patterning the resist to form the patterned mask element may be performed using an electron beam (e-beam) lithography process or an extreme ultraviolet (EUV) lithography process.

Figure 8:
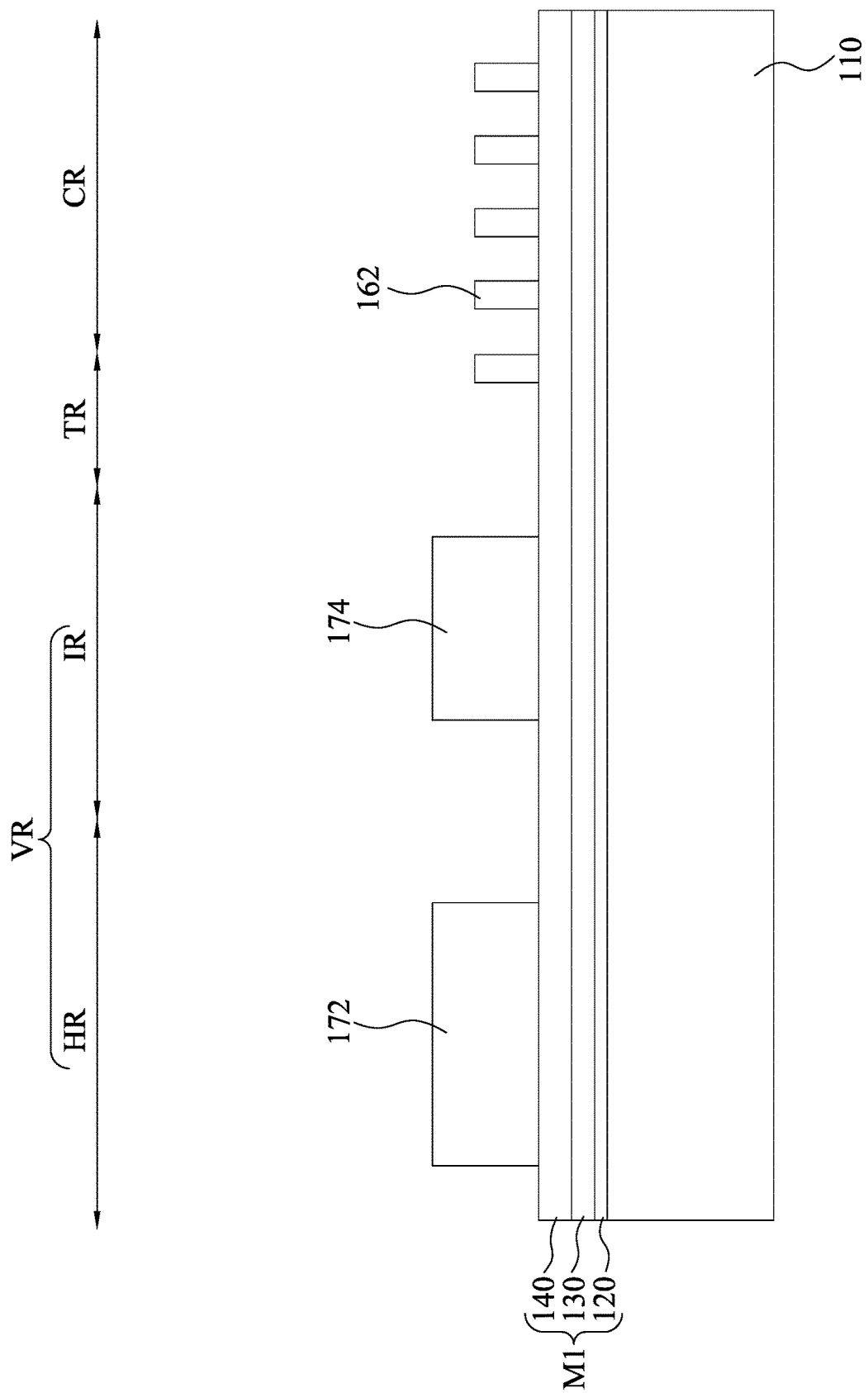

Reference is made to FIG. 8. The pattern is transferred from the resist layer PR2 to the BARC layer 170 (referring to FIG. 7) to form one or more masks 172 and 174. The masks 172 and 174 will act as an etch mask in subsequent process of patterning the material layer M1. The transfer may include suitable etching process including wet etching, dry etching, reactive ion etching, ashing, and/or other suitable technique. The resist layer PR2 may act as an etch mask in the etching process. The etching process and/or etching reagents may be selected to etch the BARC layer 170 (referring to FIG. 7) without significantly etching of the material layer M1, and after the etching process, remaining portions of the BARC layer 170 (referring to FIG. 7) are referred to as masks 172 and 174. After the formation of the masks 172 and 174, remaining resist PR2 may be removed by suitable stripping methods.

Figure 9A:
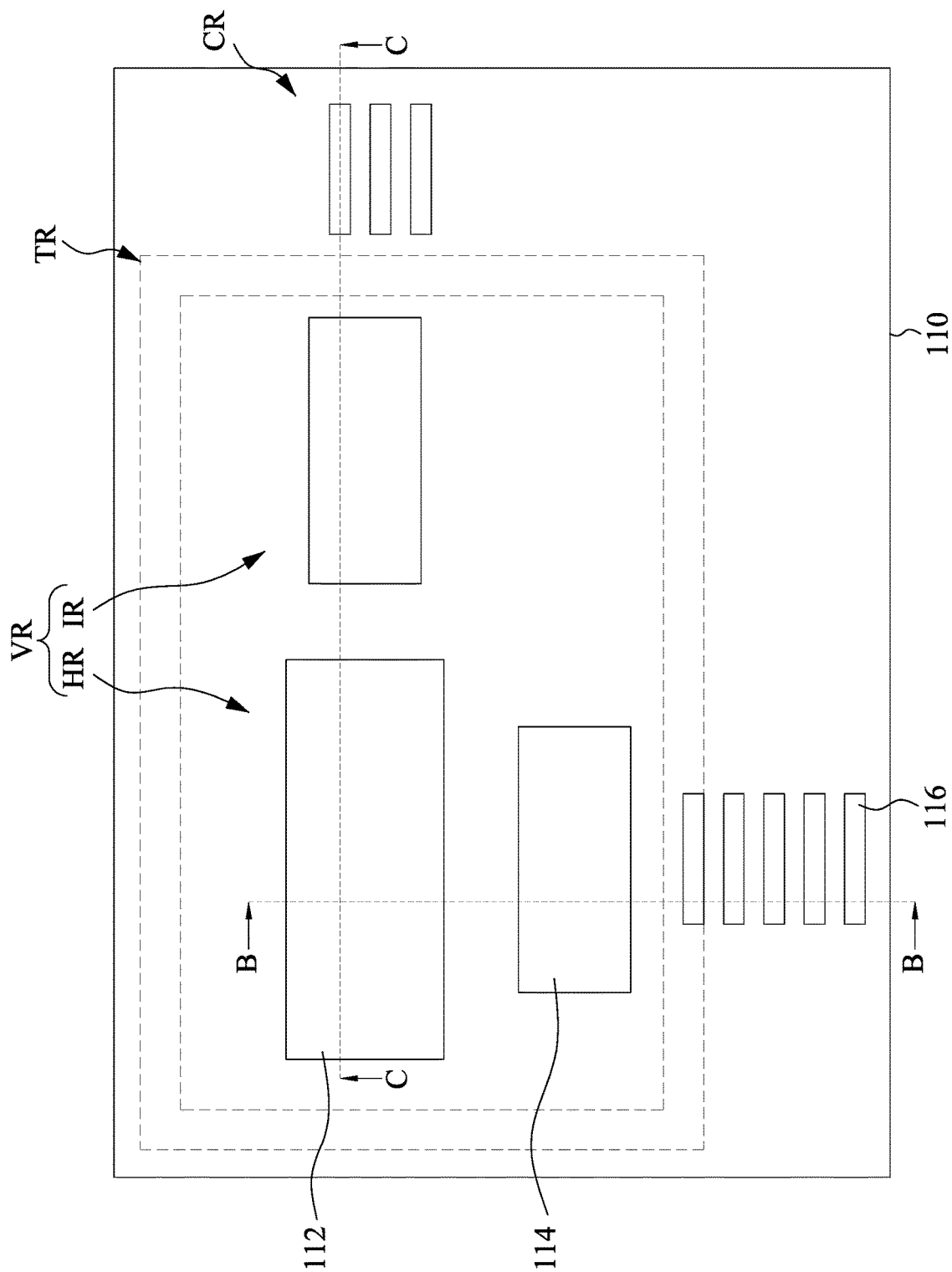
Figure 9B:
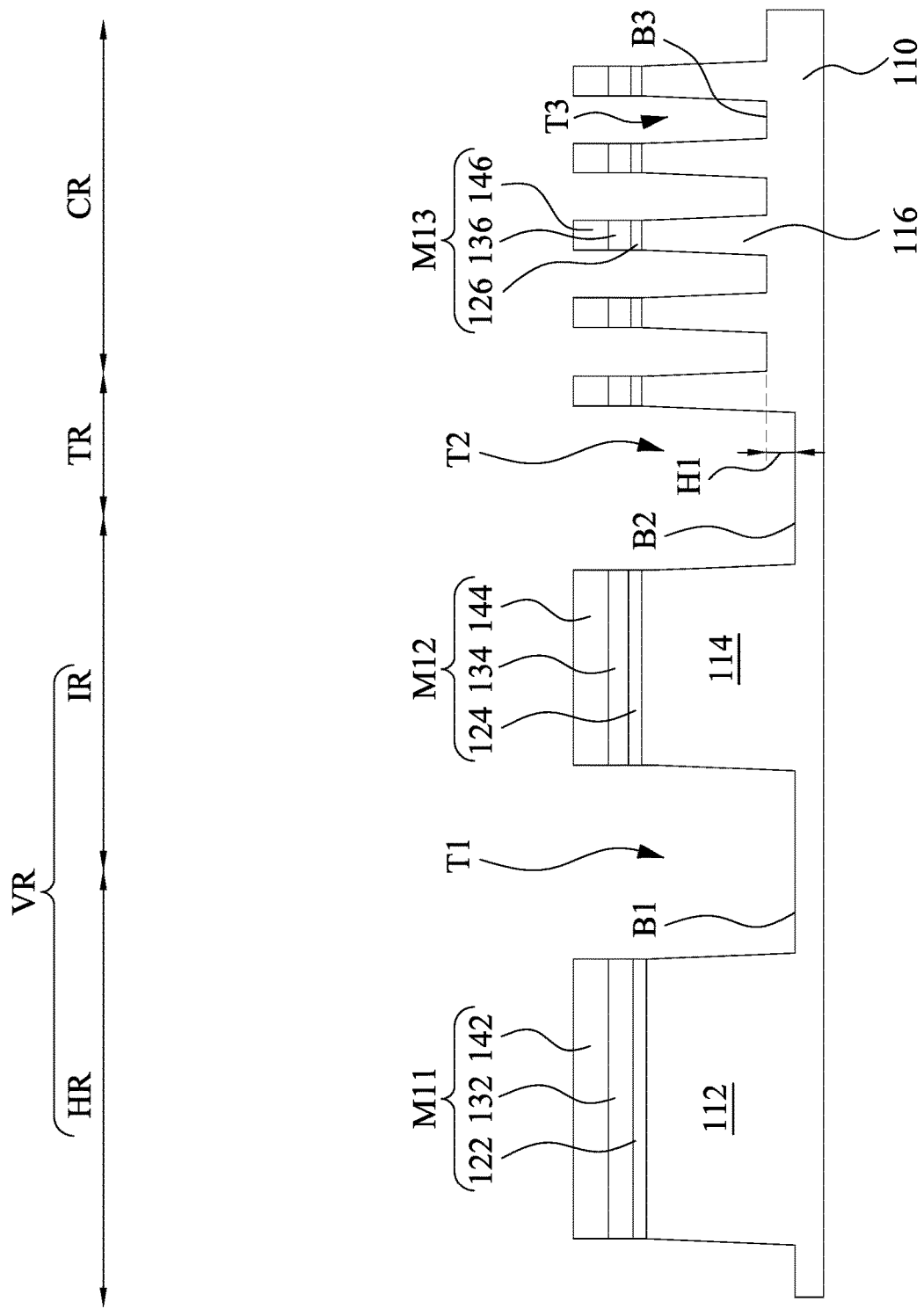
Figure 9C:
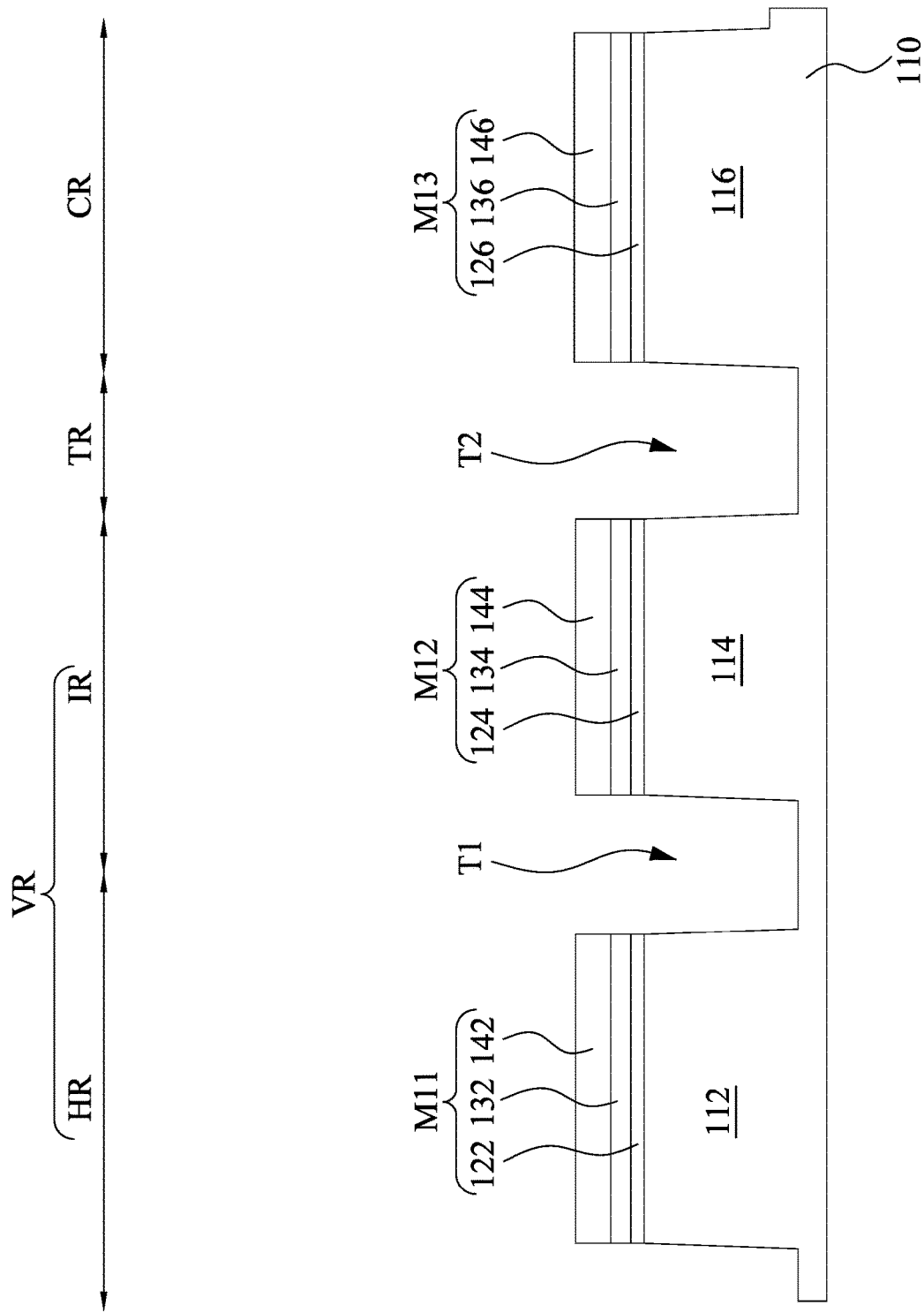

Reference is made to FIGS. 9A-9C. FIG. 9B is a cross-sectional view taken along line B-B in FIG. 9A. FIG. 9C is a cross-sectional view taken along line C-C in FIG. 9A. The material layer M1 is etched through the masks 172 and 174 (referring to FIG. 8), exposing underlying substrate 110. Subsequently, the exposed portions of the substrate 110 are etched, thereby forming trenches T1-T3 in the substrate 110.

In some embodiments, etching the material layer M1 and the substrate 110 may include a first etching process, a second etching process, and a third etching process. The first to third etching processes may include a dry etching process, a wet etching process, or combinations thereof. The first etching process is performed to pattern the third layer 140 (referring to FIG. 8) in to third layers 142, in which the first etching process may use a first etchant that show etch selectivity between the third layer 140 and the second layer 130 (referring to FIG. 8), The masks 172 and 174 and the second layer 130 (referring to FIG. 8) may have a higher etch resistance to the first etching process than that of the material layer M1 (e.g., the third layer 140 in FIG. 8), thereby may respectively serve as etch masks and an etch stop layer in etching the third layer 140 (e.g., referring to FIG. 8). Subsequently, the second etching process is performed to pattern the second layer 130 (referring to FIG. 8) into second layers 132, in which the second etching process may use a second etchant that show etch selectively between the second layer 130 and the first layer 120 (referring to FIG. 8). The third layers 142 and the first layer 120 (referring to FIG. 8) may have a higher etch resistance to the second etching process than that of the second layer 130 (referring to FIG. 8), thereby may respectively serve as etch masks and an etch stop layer in etching the second layer 130 (referring to FIG. 8). Then, the third etching process is performed to pattern the first layer 120 (referring to FIG. 8) into first layers 122 and pattern the substrate 110 to form the trenches T1-T3, in which the third etching process may use a etchant that show etch selectively between the second layer 130 and the substrate 110. The second layers 132 may have a higher etch resistance to the third etching process than that of the first layer 120 (referring to FIG. 8) and the substrate 110, thereby may serve as etch masks in etching the first layer 120 (referring to FIG. 8) and the substrate 110. In some other embodiments, the third etching process may also consume the third layers 142.

By these etching processes, the material layer M1 is patterned into plural material layers M11-M13 respectively in the regions HR, IR, and CR, and the material layers M11-M13 exposes portions of the substrate. By the etching process, the substrate 110 is patterned to form active regions 112, 114, and plural semiconductor fins 116 respectively in the regions HR, IR, and CR. The active regions 112 and 114 in the region VR are spaced apart from each other by the trench T1. The semiconductor fins 116 in the core region CR are spaced apart from each other by the trenches T3. And, the trench T2 is located in the transition region TR for spacing the active regions 112 and 114 in the region VR apart from the semiconductor fins 116 in the core region CR.

For regions with different exposed areas (areas to be etched), it is difficult to control etch uniformity due to the loading effect. Depending on the etching strategy, the loading effect is the etch rate for a larger exposed area being either faster or slower than it is for a smaller exposed area. In other words, the loading effect is that the etch rate in large area is mismatched with the etch rate in small area. This means that the loading effect may be affected by the pattern density difference among various regions throughout the wafer. Therefore, while etching the substrate 110 in the core region CR with a pattern density greater than the substrate 110 in the region VR, it is more difficult to control the uniformity of the etch depth. In some embodiments, as a result of etch loading effect, a bottom surface B3 of the trenches T3 is level with or higher than bottom surfaces B1 and B2 of the trenches T1 and T2. For example, a vertical distance difference H1 between the bottom surface B2 and the bottom surface B3 may be in a range from about 0 angstrom to about 500 angstroms.

Figure 10A:
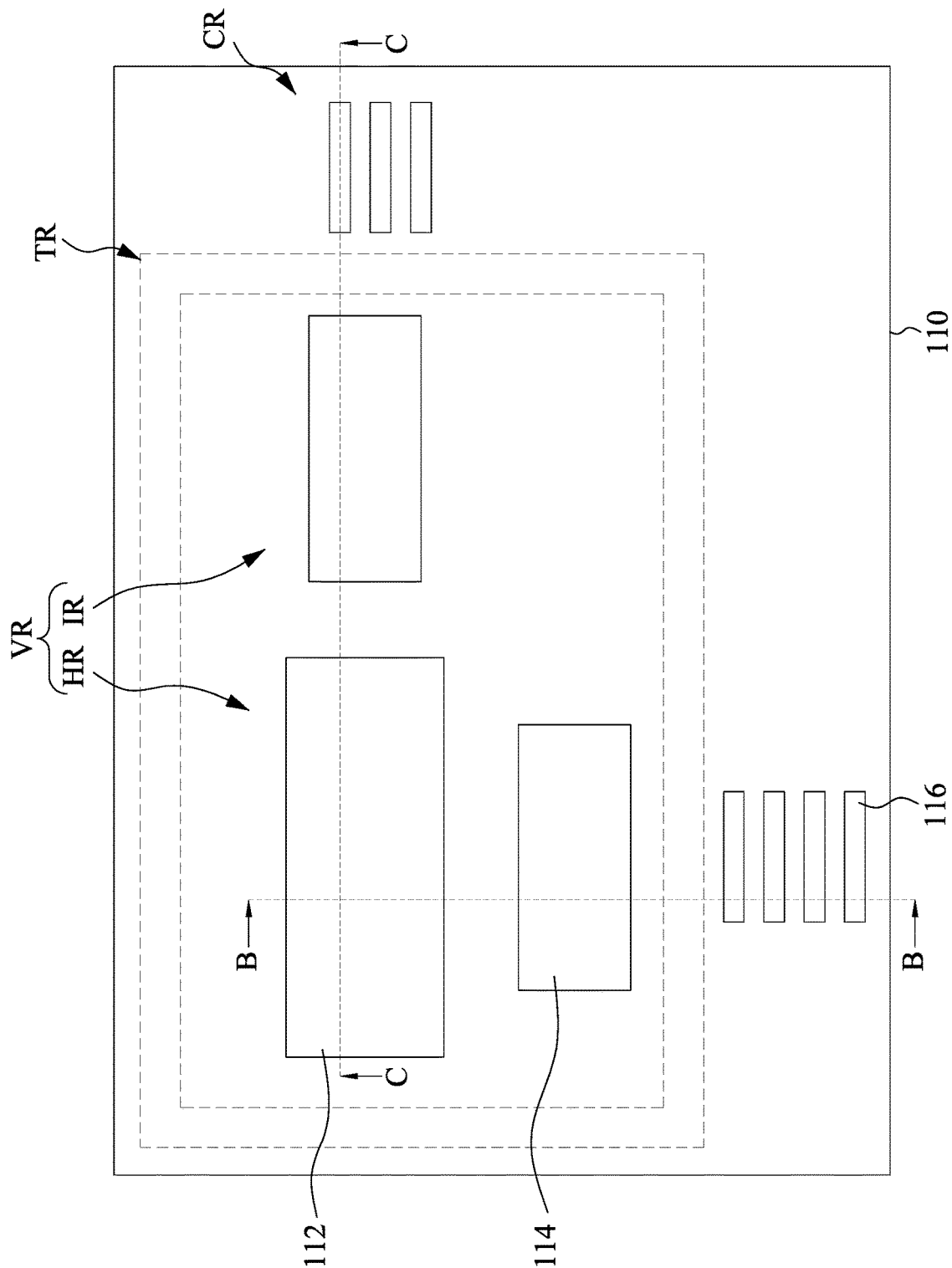
Figure 10B:
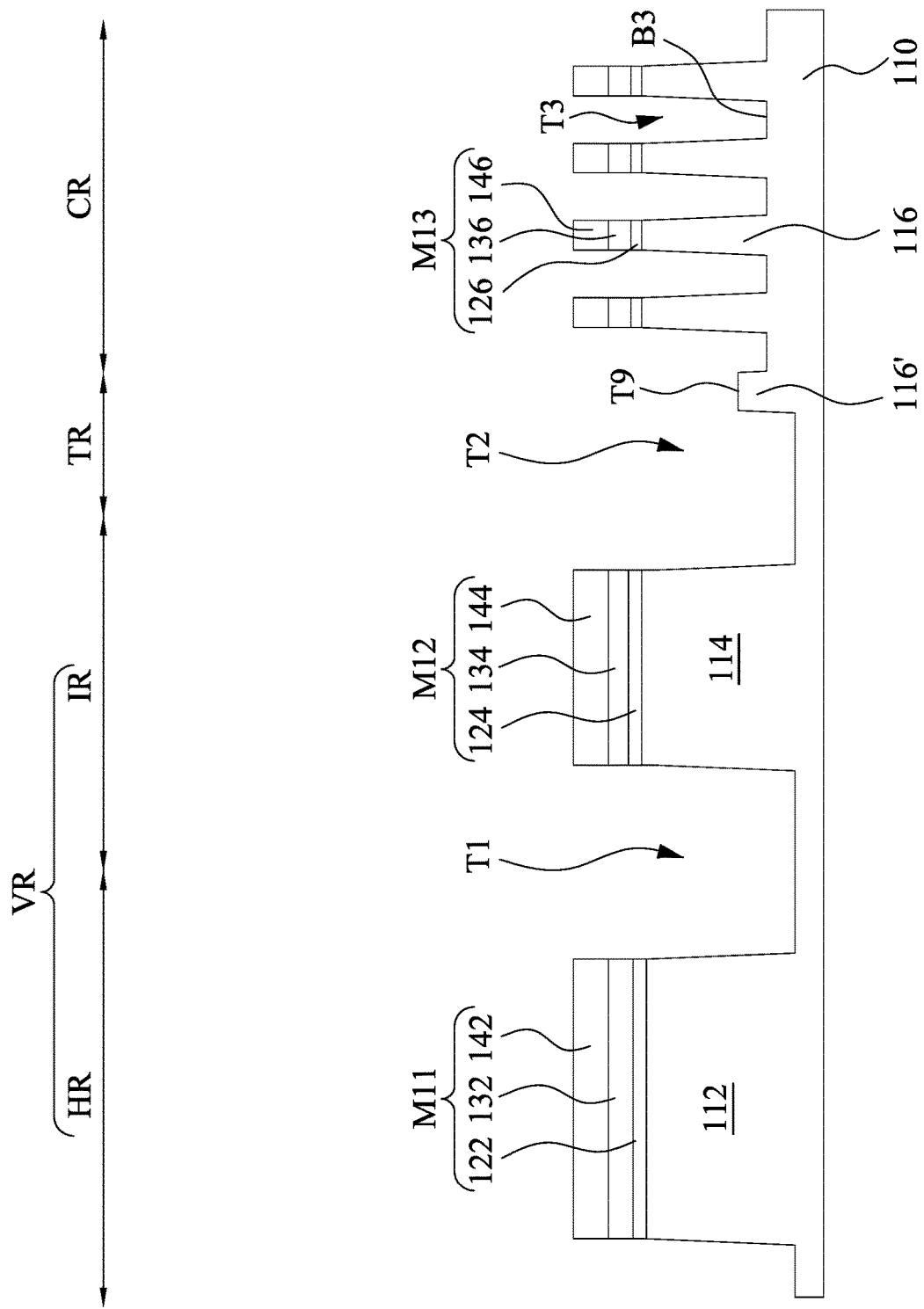
Figure 10C:
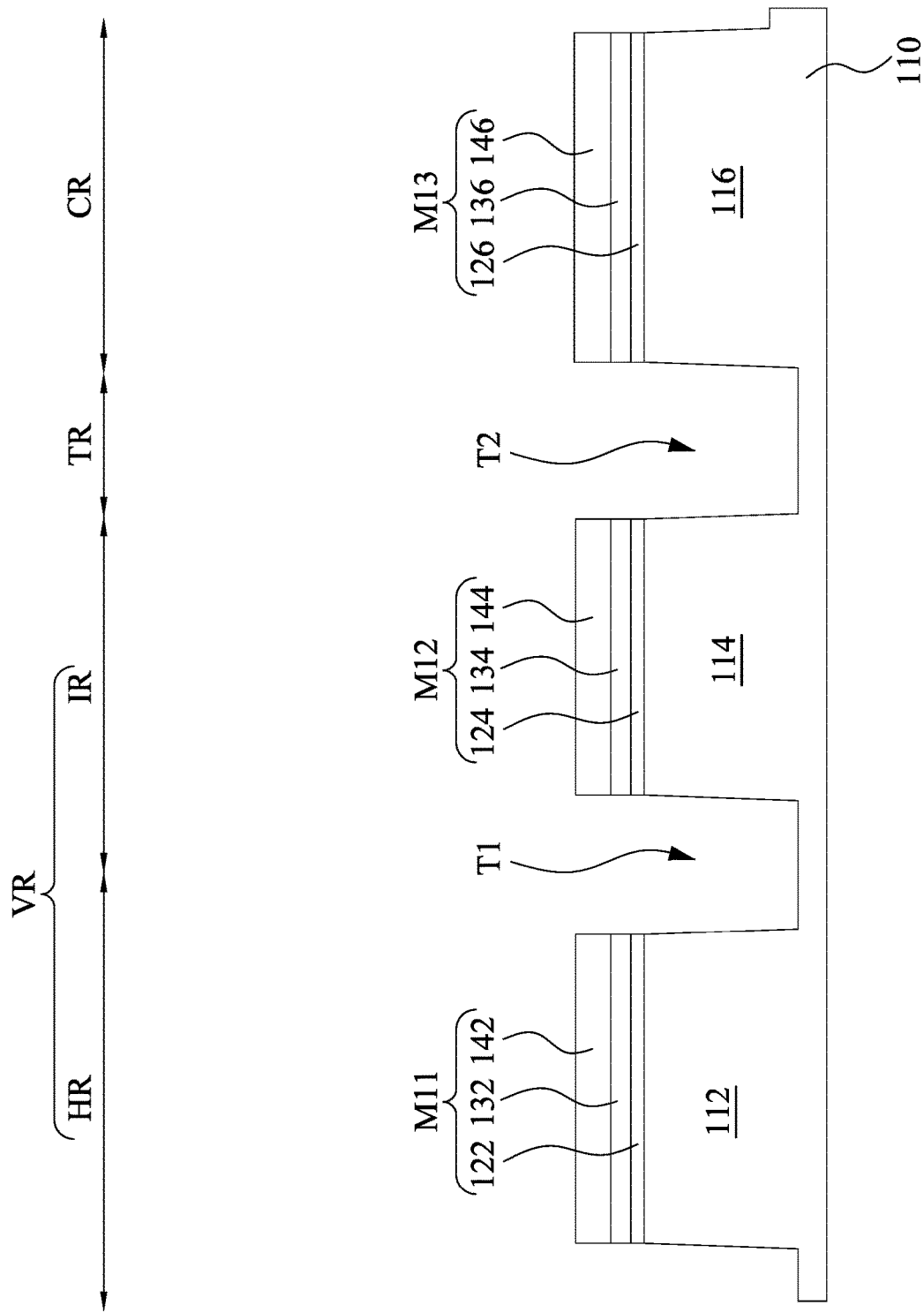

Reference is made to FIGS. 10A-10C. FIG. 10B is a cross-sectional view taken along line B-B in FIG. 10A. FIG. 10C is a cross-sectional view taken along line C-C in FIG. 10A. One of the semiconductor fins 116 adjoining the trench T2 is etched back by suitable etching process. The etched back semiconductor fin is referred to as dummy semiconductor fin 116' herein after. For example, a top surface T9 of the dummy semiconductor fin 116' is lower than a top surface of the semiconductor fin 116 but higher than the bottom surface B3 of trenches T3.

Figure 11:
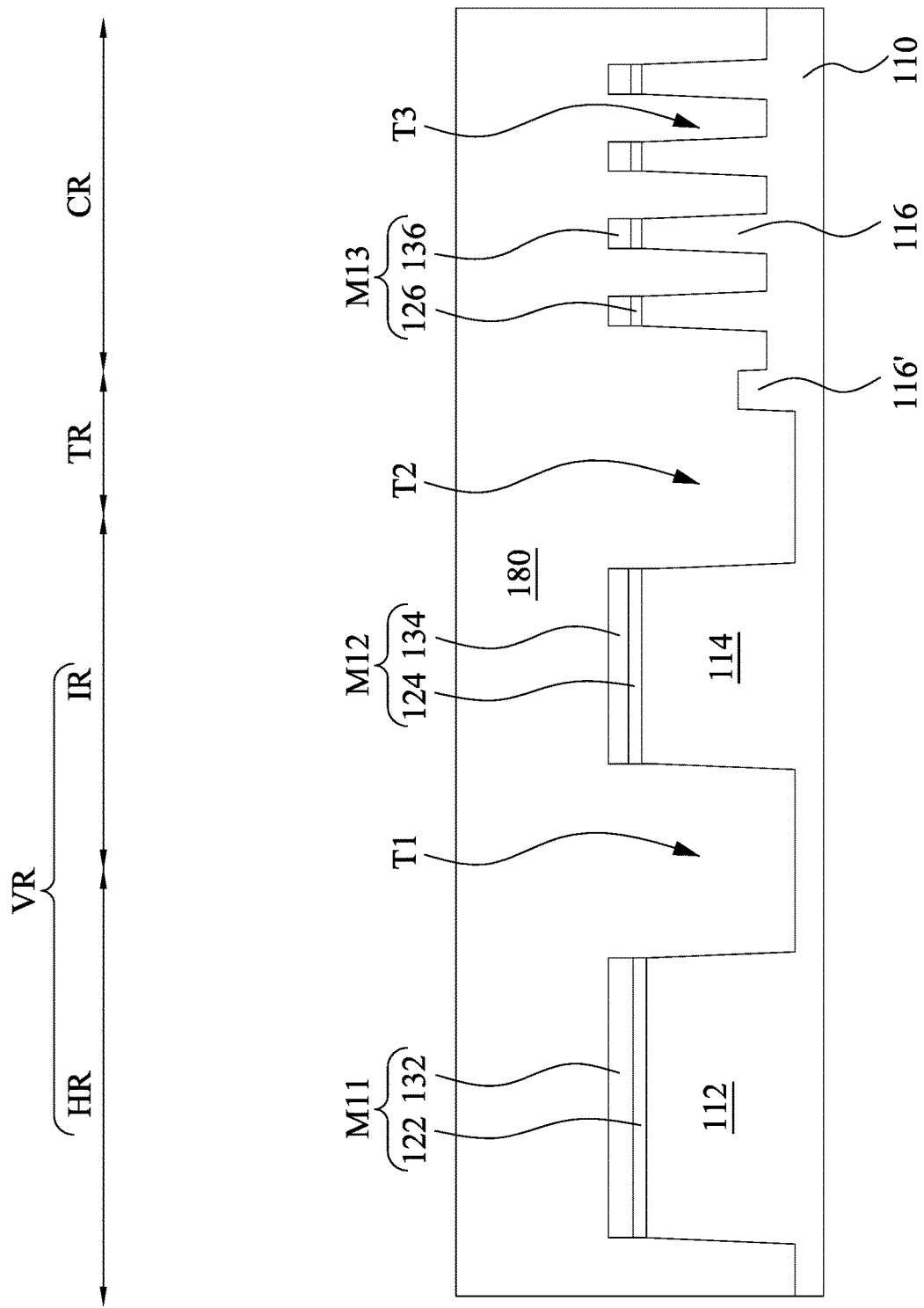

Reference is made to FIG. 11. A dielectric material 180 is deposited over the structure of FIGS. 10A-10C. In some embodiments, the dielectric material 180 is made of silicon oxide, silicon nitride, silicon oxynitride, fluoride-doped silicate glass (FSG), or other low-K dielectric materials. In some embodiments, prior to the deposition of the dielectric material 180, the third layers 142-146 (referring to FIGS. 10A-10C) are removed by suitable etching process.

Figure 12:
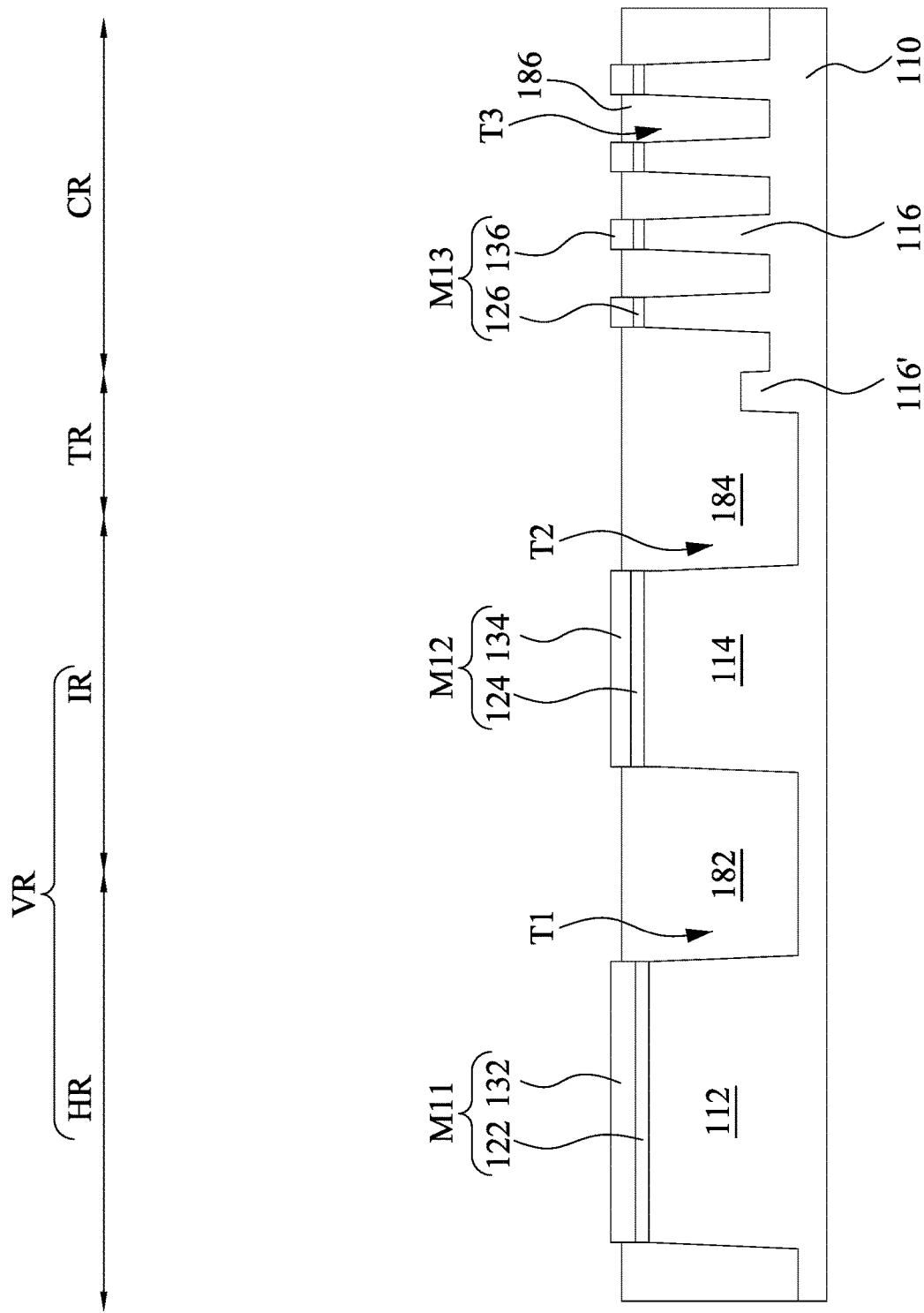

Reference is made to FIG. 12. A planarization process (e.g., chemical mechanical polish (CMP) process) is performed to remove a portion of the dielectric material 180 (referring to FIG. 11) higher than top surfaces of the material layers M11-M13. After the planarization process, remaining portions of the dielectric material 180 (referring to FIG. 11) form isolation features 182, 184, and 186 between the active regions 112, 114 and plural semiconductor fins 116. The isolation features 182, 184, and 186 may be referred to as shallow trench isolation (STI) features in some embodiments. The planarization process may stop when the second layers 132-136 are exposed. In some embodiments, the second layers 132-136 may have a higher resistance to the planarization process than that of the dielectric material 180 (referring to FIG. 11), a top surface of the formed isolation features 182, 184, and 186 may be lower than a top surface of the second layers 132-136 after the planarization process.

Figure 13:
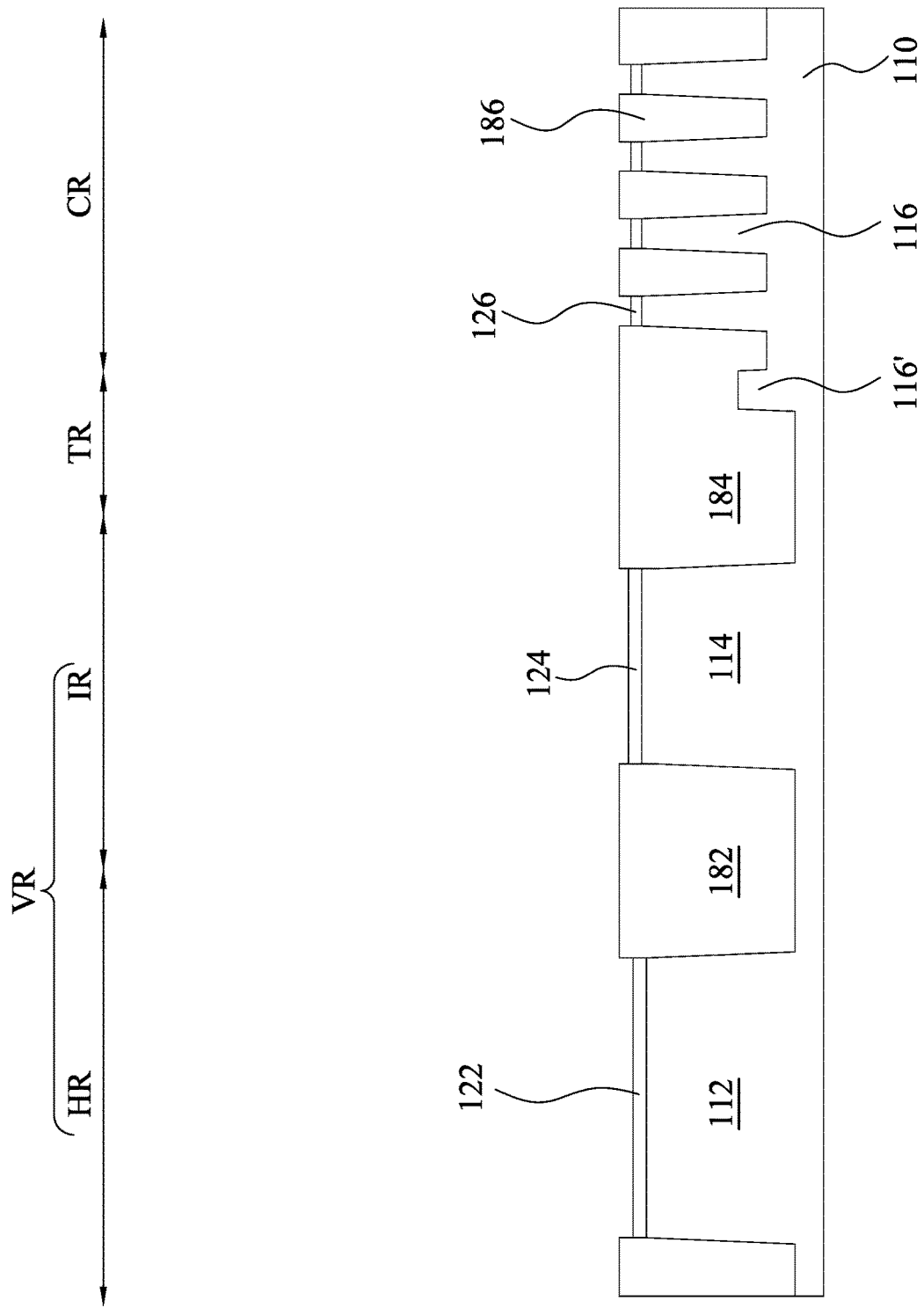

Reference is made to FIG. 13. The second layers 132-136 are removed by suitable etching process. In some embodiments, the etching process may include dry etch, wet etch, or the combination thereof. The first layers 122-126 and the isolation features 182, 184, and 186 (which may include silicon oxide) may have a higher etch resistance to the etching process than that of the second layers 132-136 (which may include silicon nitride), such that the first layers 122-126 and the isolation features 182, 184, and 186 may not be substantially etched by the etching process.

Figure 14:
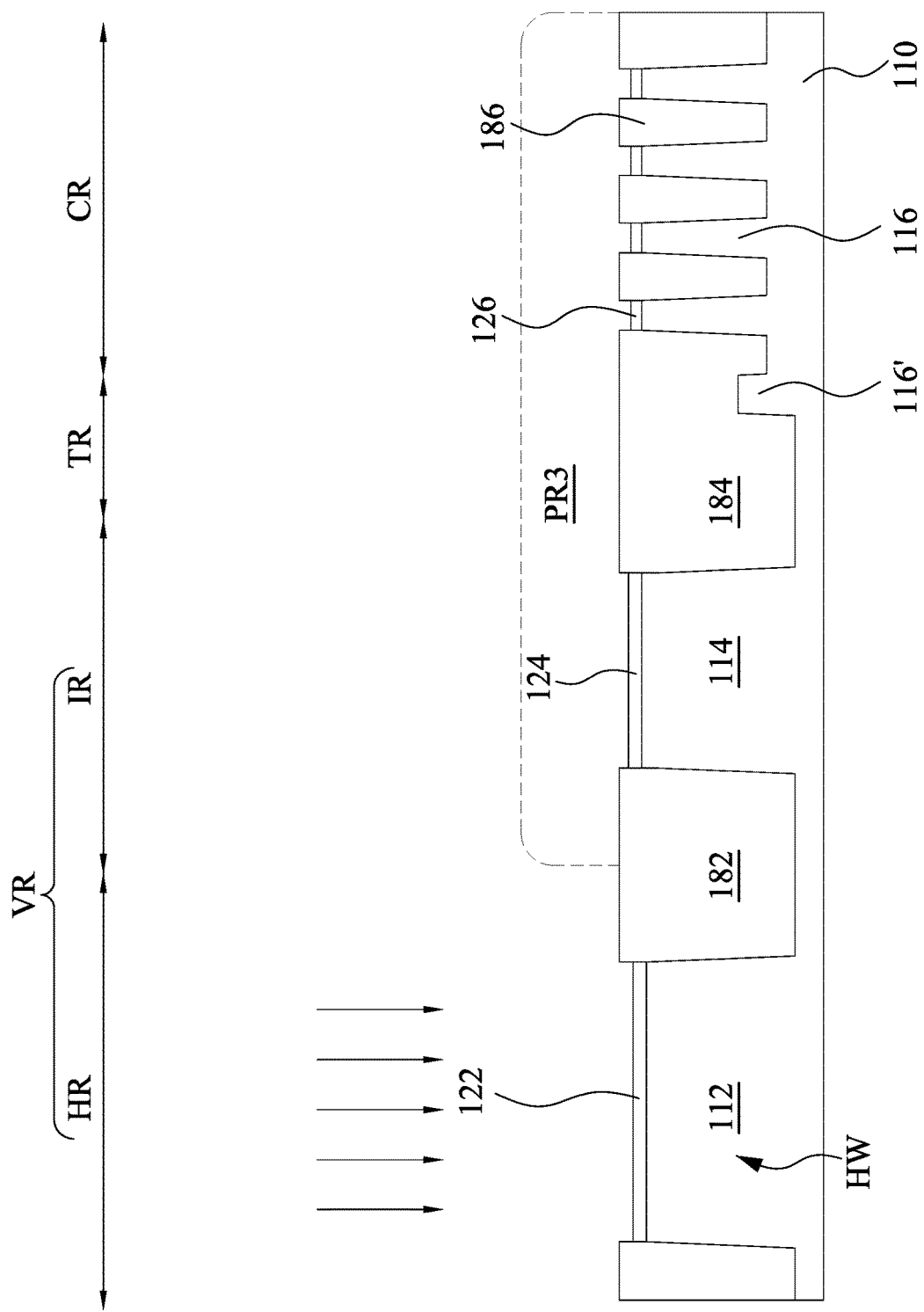

Reference is made to FIG. 14. An implantation process is performed to dope the active region 112 in the high voltage region HR, thereby forming well regions HW in the active region 112. The implantation process may be performed with n-type dopants, such as phosphorus or arsenic, and/or p-type dopants, such as boron or $BF_2$, depending on design requirements. The first layer 122 may serve as a screen oxide during the implantation process. In some embodiments, the screen oxide is beneficial for stopping the low energy debris that comes along with the high-energy ion beam. In some embodiments, the screen oxide may scatter the main ion beam and thus prevent deep penetration of the ions if the beam happens to be aligned with a major crystallographic direction.

In some embodiments, prior to the implantation process, a patterned resist layer PR3 is formed to cover the core region CR, the transition region TR, and the I/O region IR and expose the high voltage region HR. The patterned resist layer PR3 may serve as an implantation mask and protect the core region CR, the transition region TR, and the I/O region IR from being doped when doping the high voltage region HR. The patterned resist layer PR3 may include plural layers made of suitable material or composition. In some embodiments, the patterned resist layer PR3 may be a photoresist mask formed by suitable photolithography process. For example, the photolithography process may include spin-on coating a photoresist layer over the structure FIG. 13, performing post-exposure bake processes, and developing the photoresist layer to form the patterned resist layer PR3. In some embodiments, patterning the resist to form the patterned mask element may be performed using an electron beam (e-beam) lithography process or an extreme ultraviolet (EUV) lithography process. In some other embodiments, the patterned resist layer PR3 may be tri-layer resist layer, for example, including a bottom layer (e.g., $C_xH_yO_z$), a middle layer (e.g., $SiC_xH_yO_z$), and a photoresist top layer. After the implantation process, the patterned resist layer PR3 may be removed by suitable stripping methods.

Figure 15:
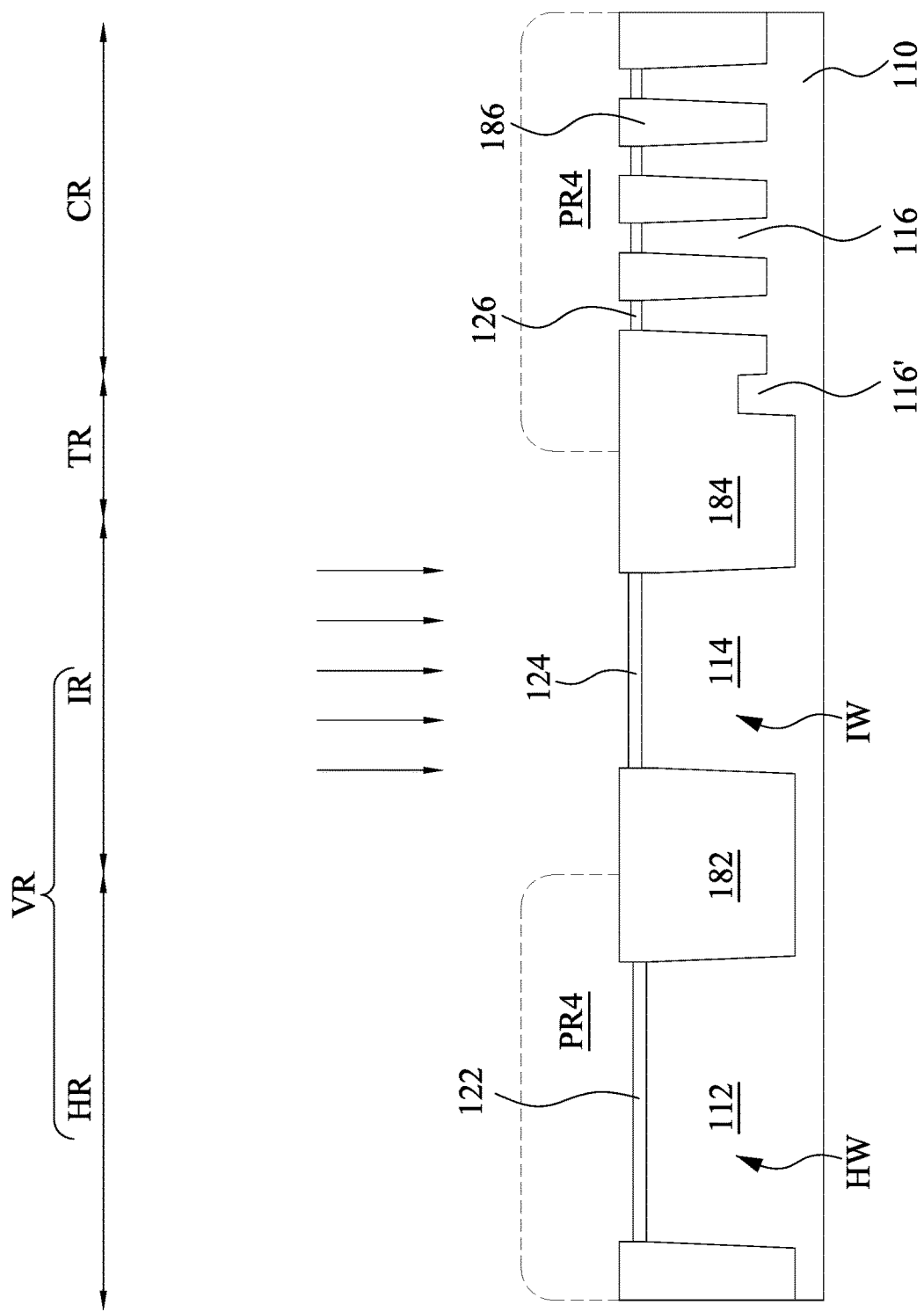

Reference is made to FIG. 15. An implantation process is performed to dope the active region 114 in the I/O region IR, thereby forming well regions IW in the active region 114. The implantation process may be performed with n-type dopants, such as phosphorus or arsenic, and/or p-type dopants, such as boron or $BF_2$, depending on design requirements. The first layer 124 may serve as a screen oxide during the implantation process.

In some embodiments, prior to the implantation process, a patterned resist layer PR4 is formed to cover the core region CR, the transition region TR, and the high voltage region HR and expose the I/O region. The patterned resist layer PR4 may serve as an implantation mask and protect the core region CR, the transition region TR, and the high voltage region HR from being doped when doping the I/O region. The patterned resist layer PR4 may include plural layers made of suitable material or composition. In some embodiments, the patterned resist layer PR4 may be a photoresist mask formed by suitable photolithography process. For example, the photolithography process may include spin-on coating a photoresist layer over the structure of FIG. 14, performing post-exposure bake processes, and developing the photoresist layer to form the patterned resist layer PR4. In some embodiments, patterning the resist to form the patterned mask element may be performed using an electron beam (e-beam) lithography process or an extreme ultraviolet (EUV) lithography process. In some other embodiments, the patterned resist layer PR4 may be tri-layer resist layer, for example, including a bottom layer (e.g., $C_xH_yO_z$), a middle layer (e.g., $SiC_xH_yO_z$), and a photoresist top layer. After the implantation process, the patterned resist layer PR4 may be removed by suitable stripping methods.

Figure 16:
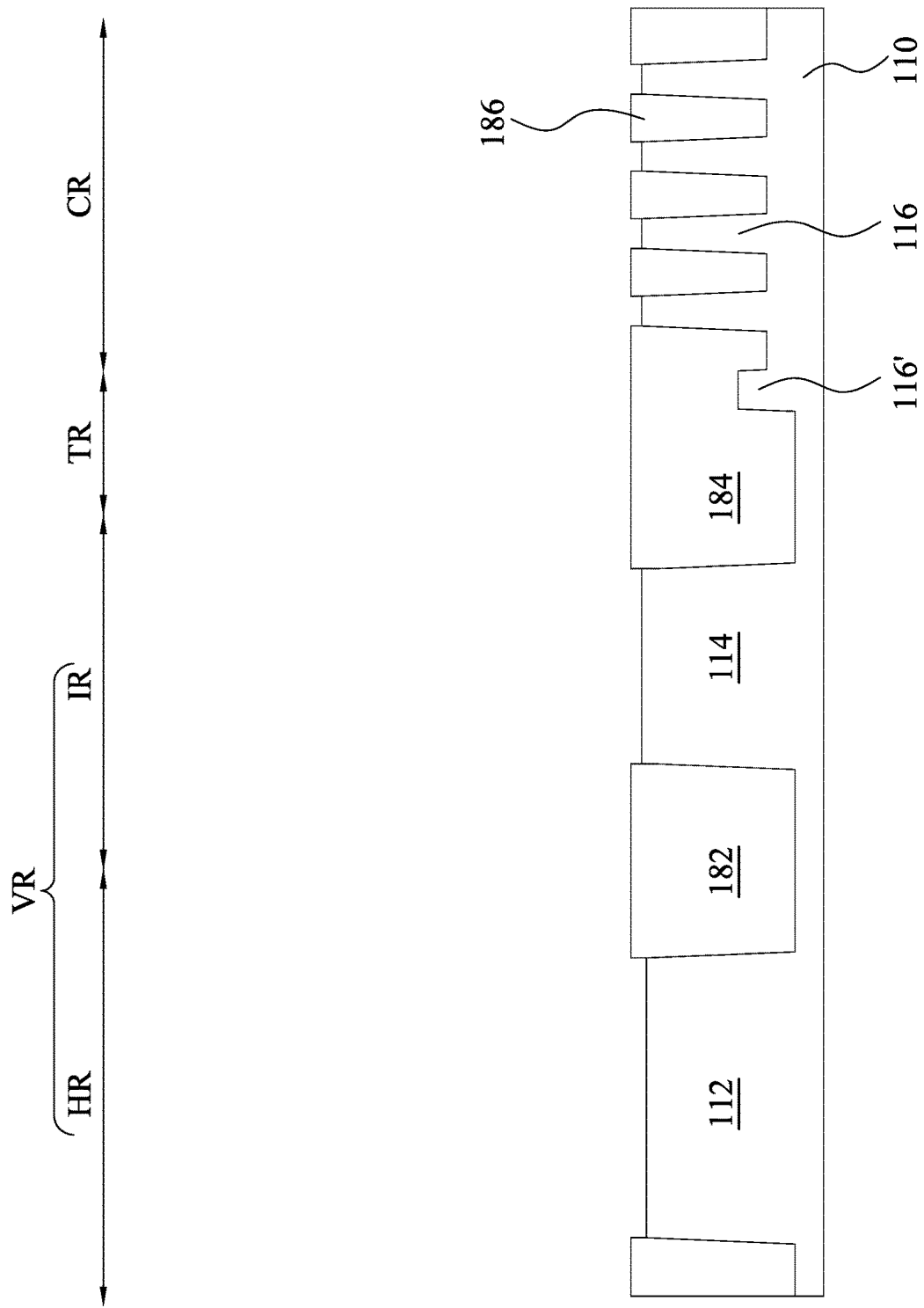

Reference is made to FIG. 16. The first layers 122-126 are removed by suitable etching/cleaning process. In some embodiments, the etching/cleaning process may be performed using diluted hydrofluoric (HF) acid, for example. After the etching process, top surfaces of the active regions 112 and 114 and the semiconductor fin 116 may be exposed.

Figure 17:
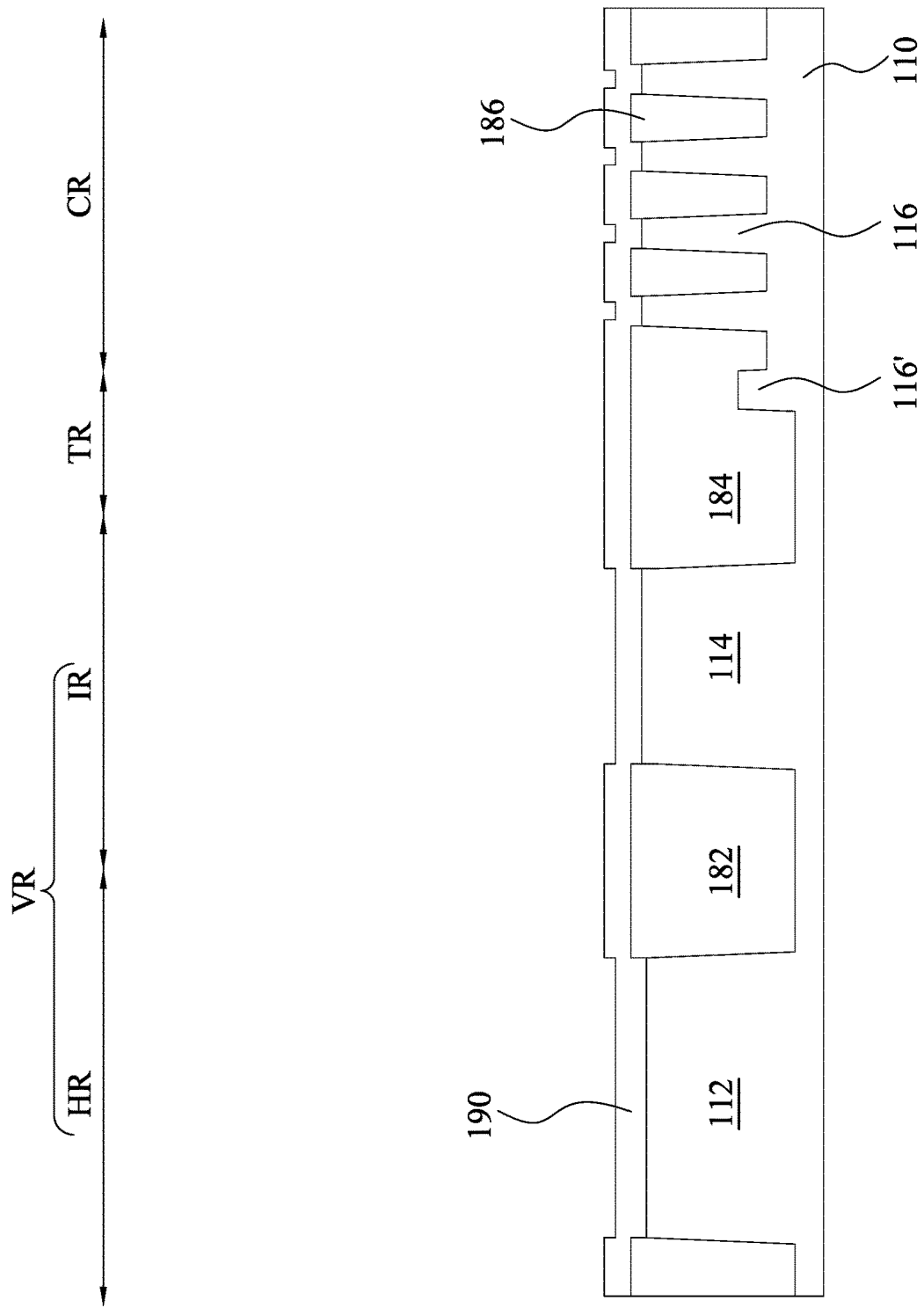

Reference is made to FIG. 17. A dielectric layer 190 is deposited over the structure of FIG. 16. In some embodiments, the dielectric layer 190 includes suitable dielectric materials, such as silicon oxide, the like, or the combination thereof. The dielectric layer 190 may be formed using atomic layer deposition (ALD), chemical vapor deposition (CVD), thermal oxidation, the like, or the combination thereof. In some embodiments, formation of the dielectric layer 190 may include oxide a portion of the active regions 112, 114, and the semiconductor fins 116, such that the top surfaces of the active regions 112, 114, and the semiconductor fins 116 may be lowered after the deposition of the dielectric layer 190.

In some embodiments, a thickness of the dielectric layer 190 is in a range of about 100 angstroms to about 300 angstroms. If the thickness of the dielectric layer 190 is less than about 100 angstroms, the formed gate dielectric may break down under high-voltage operations, which will result in poor reliability. If the thickness of the dielectric layer 190 is greater than about 300 angstroms, a conductive current may be reduce, which may result in poor device performance.

Figure 18:
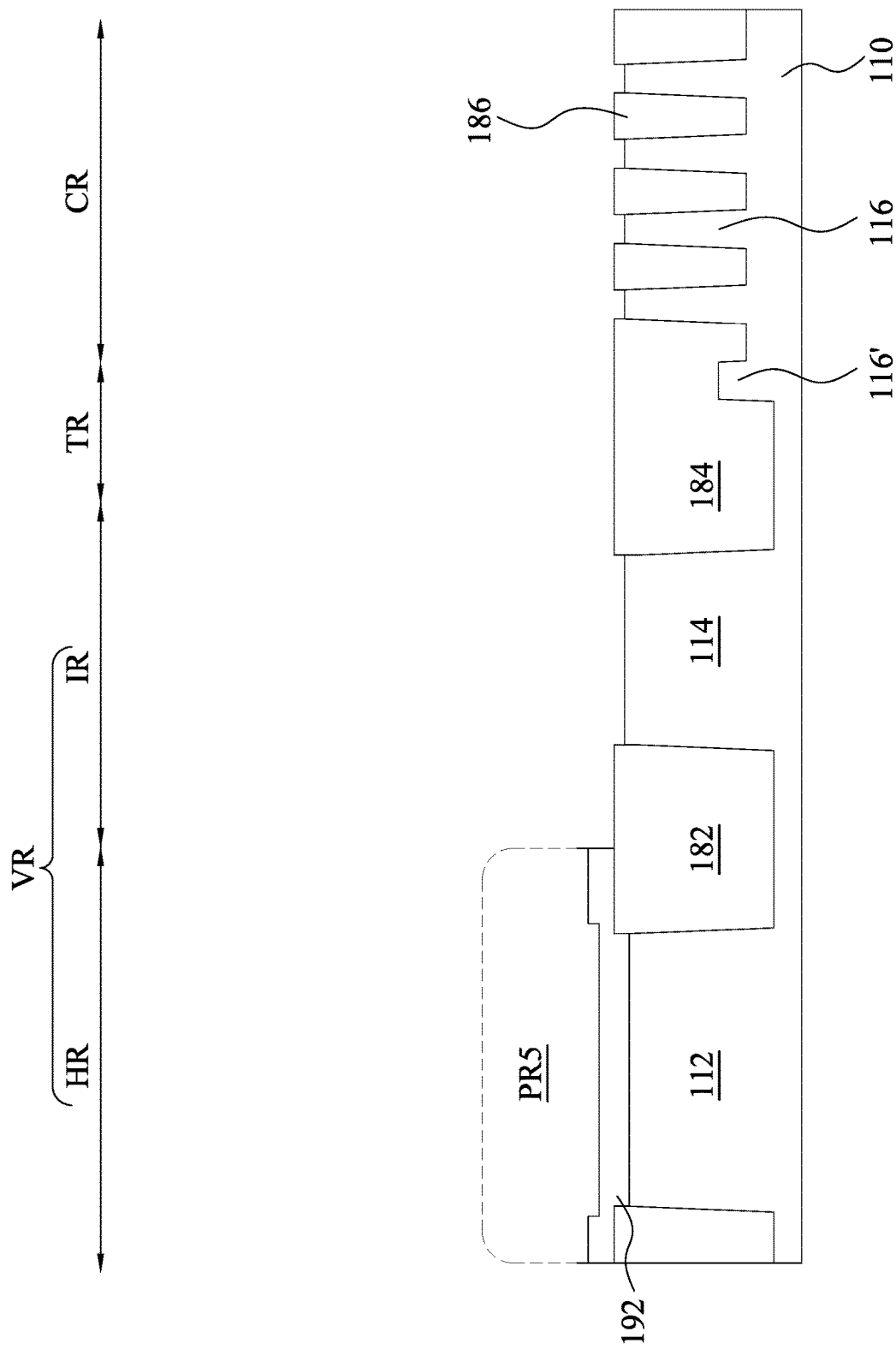

Reference is made to FIG. 18. The dielectric layer 190 (referring to FIG. 17) is patterned to one or more dielectric layers 192 in the high voltage region HR. A patterned resist layer PR5 is formed to cover the portion of the dielectric layer 190 (referring to FIG. 17) in the high-voltage region HR and expose the portion of the dielectric layer 190 (referring to FIG. 17) in the regions IR, TR, and CR. Subsequently, an etching process is performed to remove a portion of the dielectric layer 190 out of the high-voltage region HR (e.g., in the regions IR, TR, and CR) uncovered by the patterned resist layer PR5. After the etching process, the remaining portion of the dielectric layer 190 in the high-voltage region HR forms the dielectric layer 192. In some embodiments, the etching process may also lower top surfaces of the isolation features 182-186 uncovered by the patterned resist layer PR5. As a result, a portion of the top surfaces of the isolation features 182 out of the high-voltage region HR and the top surfaces of the isolation features 184 and 186 are lower than a portion of the top surfaces of the isolation features 182 in the high-voltage region HR.

In some embodiments, the patterned resist layer PR5 may include plural layers made of suitable material or composition. In some embodiments, the patterned resist layer PR5 may be a photoresist mask formed by suitable photolithography process. For example, the photolithography process may include spin-on coating a photoresist layer over the structure FIG. 17, performing post-exposure bake processes, and developing the photoresist layer to form the patterned resist layer PR5. In some embodiments, patterning the resist to form the patterned mask element may be performed using an electron beam (e-beam) lithography process or an extreme ultraviolet (EUV) lithography process. In some other embodiments, the patterned resist layer PR5 may be tri-layer resist layer, for example, including a bottom layer (e.g., $C_xH_yO_z$), a middle layer (e.g., $SiC_xH_yO_z$), and a photoresist top layer. The patterned resist layer PR5 may be removed by suitable stripping methods after the etching process.

Figure 19:
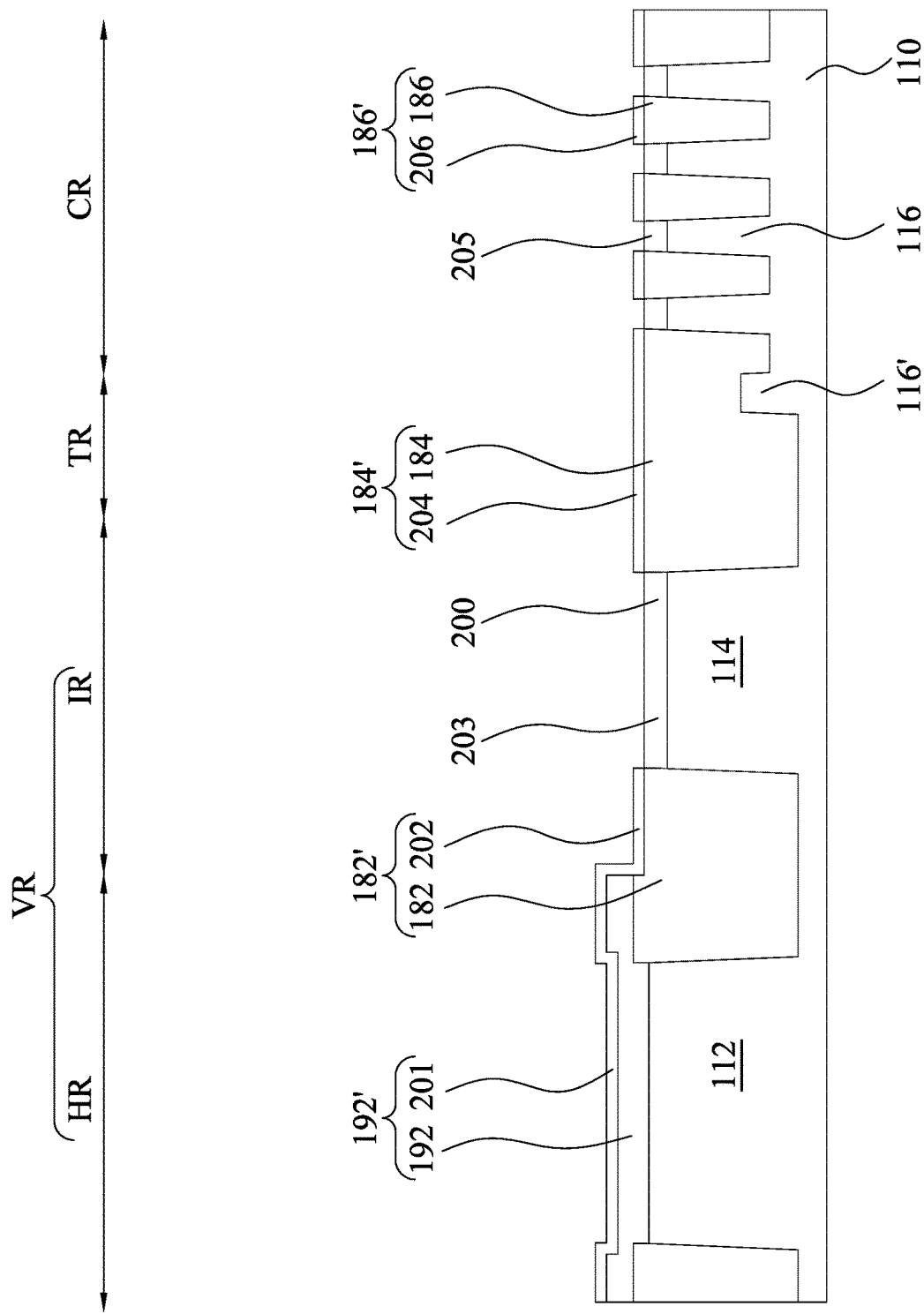

Reference is made to FIG. 19. A dielectric layer 200 is deposited over the structure of FIG. 18. In some embodiments, the dielectric layer 200 includes suitable dielectric materials, such as silicon oxide, the like, or the combination thereof. The dielectric layer 200 may be formed using atomic layer deposition (ALD), chemical vapor deposition (CVD), thermal oxidation, the like, or the combination thereof. The dielectric layer 200 may include portions 201-206 over the dielectric layer 192, the isolation feature 182, the active region 114, the isolation feature 184, the semiconductor fins 116, and the isolation features 186, respectively.

In some embodiments, formation of the dielectric layer 200 may include oxidizing portions of semiconductor materials (e.g., the active region 114 and the semiconductor fins 116), such that the top surfaces of the active region 114 and the semiconductor fins 116 may be lowered after the deposition of the dielectric layer 200. For example, the top surfaces of the active region 114 and the semiconductor fins 116 are lower than the top surface of the active region 112 after the deposition of the dielectric layer 200. In some embodiments, by oxidize portions of semiconductor materials, a thickness of the dielectric layer 200 over dielectric materials is less than a thickness of the dielectric layer 200 over semiconductor materials. For example, a thickness of portions 201, 202, 204, and 206 of the dielectric layer 200 is less than a thickness of portions 203 and 205 of dielectric layer 200.

In some embodiments, a thickness of the dielectric layer 200 is less than a thickness of the dielectric layer 190 (referring to FIG. 17). For example, a thickness of the dielectric layer 200 over the active region 114 and the semiconductor fins 116 (e.g., the portions 203 and 205 of the dielectric layer 200) is in a range of about 25 angstroms to about 80 angstroms. If the thickness of the dielectric layer 200 is less than about 25 angstroms, the formed gate dielectric may break down under high-voltage operations, which will result in poor reliability. If the thickness of the dielectric layer 200 is greater than about 85 angstroms, a conductive current may be reduce, which may result in poor device performance.

The deposition of the dielectric layer 200 may thicken the dielectric layer 192 and the isolation features 182-184 (referring to FIG. 18), and the thickened elements are referred to as dielectric layer 192' and the isolation features 182'-184' hereinafter. For clear illustration, a combination of the dielectric layer 192 and the portion 201 of the dielectric layer 200 formed thereon are referred to as dielectric layer 192' hereinafter. A combination of the isolation feature 182 and the portion 202 of the dielectric layer 200 formed thereon are referred to as isolation feature 182' hereinafter. A combination of the isolation feature 184 and the portion 204 of the dielectric layer 200 formed thereon are referred to as isolation feature 184' hereinafter. A combination of the isolation feature 186 and the portion 206 of the dielectric layer 200 formed thereon are referred to as isolation feature 186' hereinafter.

Figure 20:
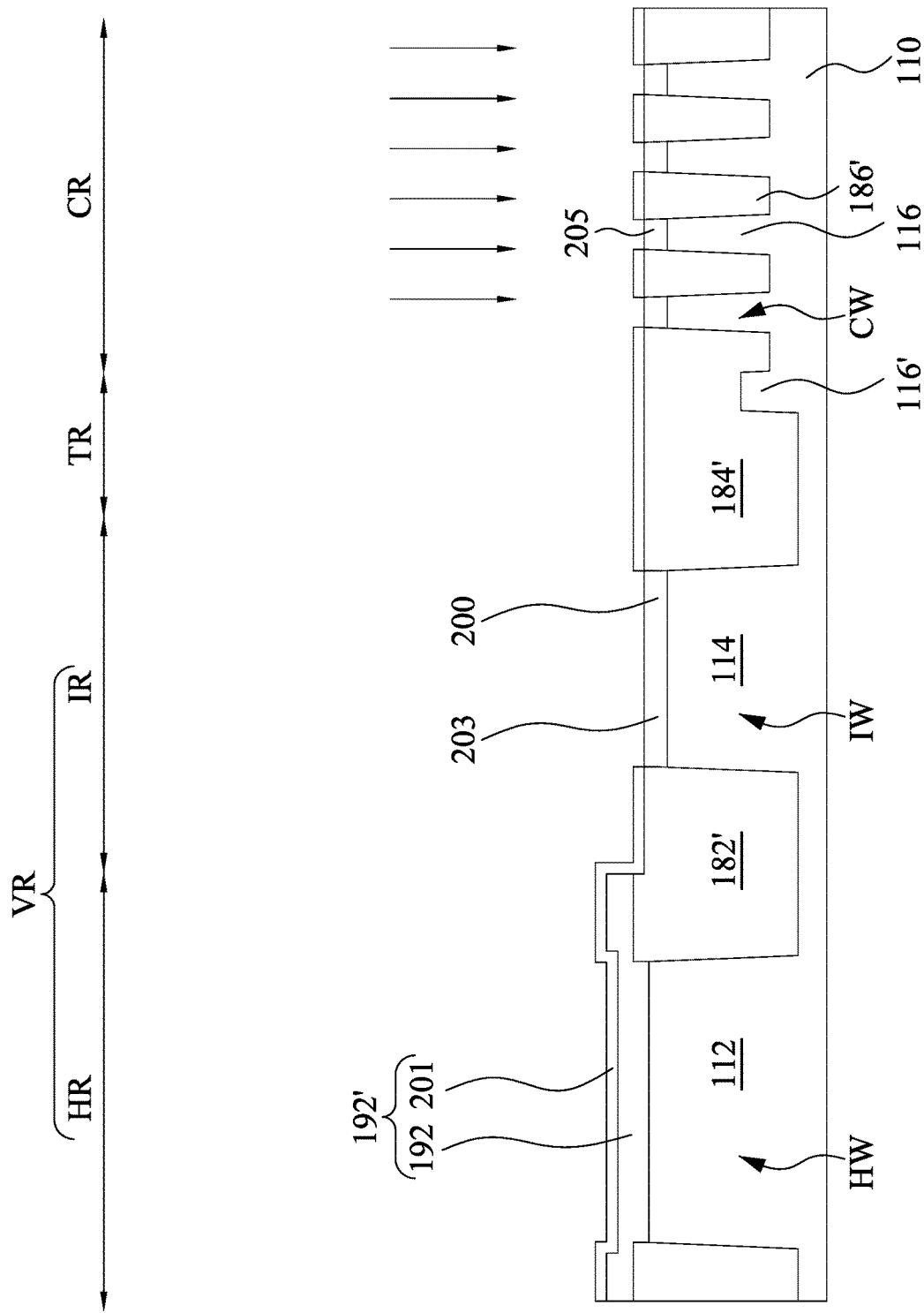

Reference is made to FIG. 20. In some embodiments, after the deposition of the dielectric layer 200, an implantation process is performed to dope the semiconductor fins 116 in the core region CR, thereby forming well regions CW in the semiconductor fins 116. The implantation process may be performed with n-type dopants, such as phosphorus or arsenic, and/or p-type dopants, such as boron or $BF_2$, depending on design requirements. The portion 205 of the dielectric layer 200 may serve as a screen oxide during the implantation process, and be removed in later gate replacement process. Regions to be doped may be selected according to design and requirements. In some other embodiments, the implantation process may be omitted, and the semiconductor fins 116 may be free of doping at this stage.

In some embodiments, prior to the implantation process, a patterned resist layer (not shown) is formed to cover the high voltage region HR and the I/O region and expose some of the core region CR. The patterned resist layer (not shown) may serve as an implantation mask and protect the high voltage region HR and the I/O region from being doped when doping the core region CR. The patterned resist layer (not shown) may include plural layers made of suitable material or composition. In some embodiments, the patterned resist layer (not shown) may be a photoresist mask formed by suitable photolithography process. For example, the photolithography process may include spin-on coating a photoresist layer over the structure of FIG. 19, performing post-exposure bake processes, and developing the photoresist layer to form the patterned resist layer PR4. In some other embodiments, the patterned resist layer (not shown) may be tri-layer resist layer, for example, including a bottom layer (e.g., $C_xH_yO_z$), a middle layer (e.g., $SiC_xH_yO_z$), and a photoresist top layer. After the implantation process, the patterned resist layer (not shown) may be removed by suitable stripping methods.

Figure 21A:
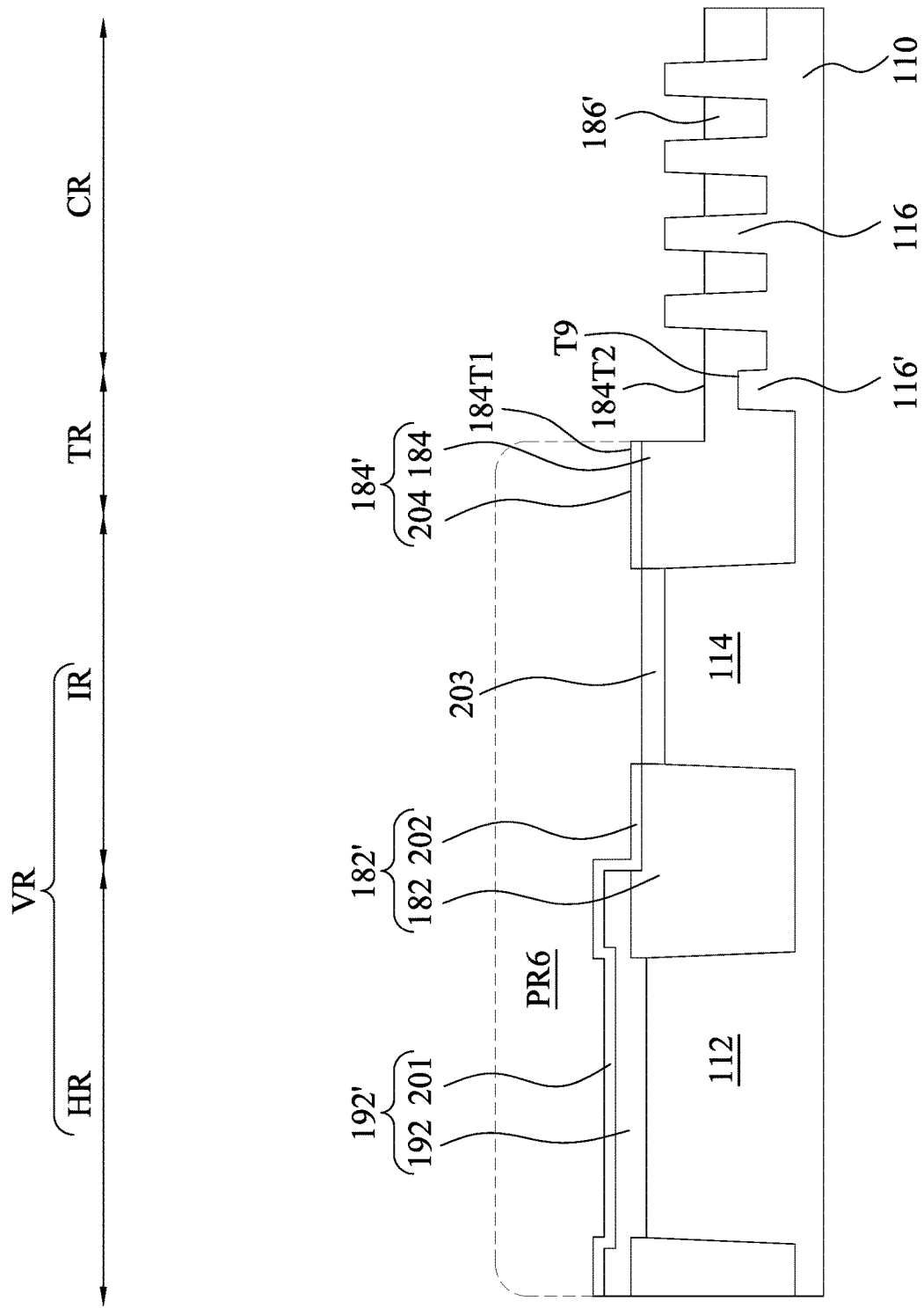
Figure 21B:
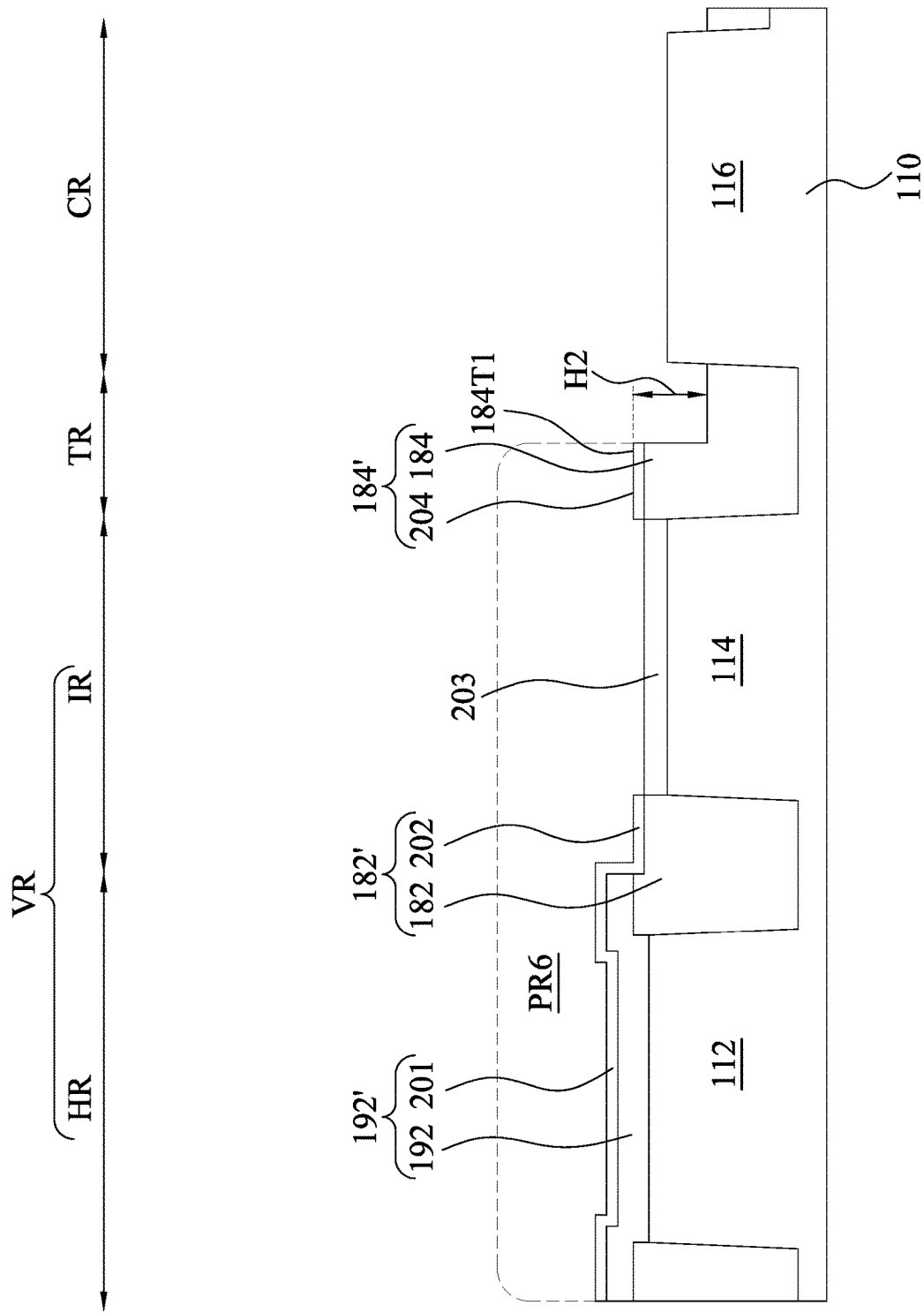

Reference is made to FIGS. 21A and 21B. The dielectric layer 200 (referring to FIG. 20) is patterned. In some embodiments, a patterned resist layer PR6 is formed to cover the regions HR and IR and expose the core region CR. In some embodiments, the patterned resist layer PR6 may cover a portion of the transition region TR and expose another portion of the transition region TR. Subsequently, an etching process is performed to remove a portion of the dielectric layer 200 (e.g., portions 205 referring to FIG. 20) in the core region CR. The remaining portion 203 may be referred to as a dielectric layer 203 hereinafter. The etching process may also recess top surfaces of the isolation features 186', such that fins 116 protrude from top surfaces of the isolation features 186'. For example, after the etching process, the top surfaces of the isolation features 186' are lower than top surfaces of the isolation features 182' in the region VR.

The patterned resist layer PR6 may include plural layers made of suitable material or composition. In some embodiments, the patterned resist layer PR6 may be a photoresist mask formed by suitable photolithography process. For example, the photolithography process may include spin-on coating a photoresist layer over the structure FIG. 20, performing post-exposure bake processes, and developing the photoresist layer to form the patterned resist layer PR6. In some embodiments, patterning the resist to form the patterned mask element may be performed using an electron beam (e-beam) lithography process or an extreme ultraviolet (EUV) lithography process. In some other embodiments, the patterned resist layer PR6 may be tri-layer resist layer, for example, including a bottom layer (e.g., $C_xH_yO_z$), a middle layer (e.g., $SiC_xH_yO_z$), and a photoresist top layer. The patterned resist layer PR6 may be removed by suitable stripping methods after the etching process.

In some embodiments, during the etching process, a portion of the top surface of the isolation feature 184' (e.g., the top surface 184T1) in the transition region TR is protected from being recessed by the resist layer PR6, and another portion of the top surface of the isolation feature 184' near the region CR (e.g., the top surface 184T2) is recessed by the etching process. As a result, after the etching process, the surface 184T1 of the isolation feature 184' is higher than top surface 184T2 of the isolation feature 184'. For example, a vertical distance difference H2 between the top surfaces 184T1 and 184T2 of the isolation feature 184' may be in a range of about 600 angstroms to about 1500 angstroms. If the vertical distance difference H2 is out of the corresponding ranges, step difference may become serious, and/or number of defects may increase, thereby reducing yield rate. Also, in some embodiments, a vertical distance difference between the top surface 184T1 of the isolation feature 184' and a top surface of the isolation feature 186' may be in a range of about 600 angstroms to about 1500 angstroms. As shown in the figure, the top surface 184T2 of the isolation feature 184' is lower than the top surfaces of the semiconductor fins 116 but higher than the top surface T9 of the dummy semiconductor fin 116'.

Figure 22A:
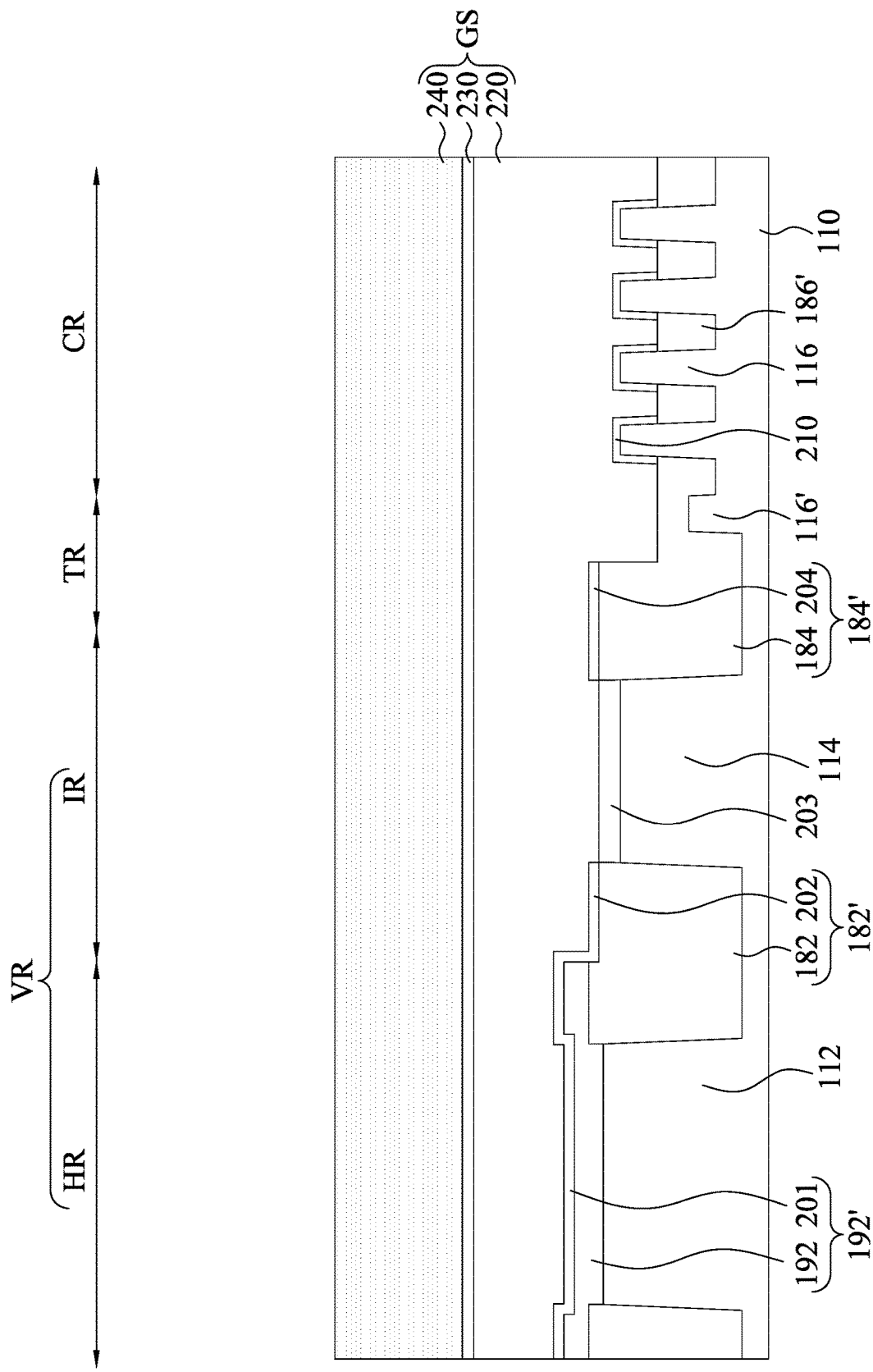
Figure 22B:
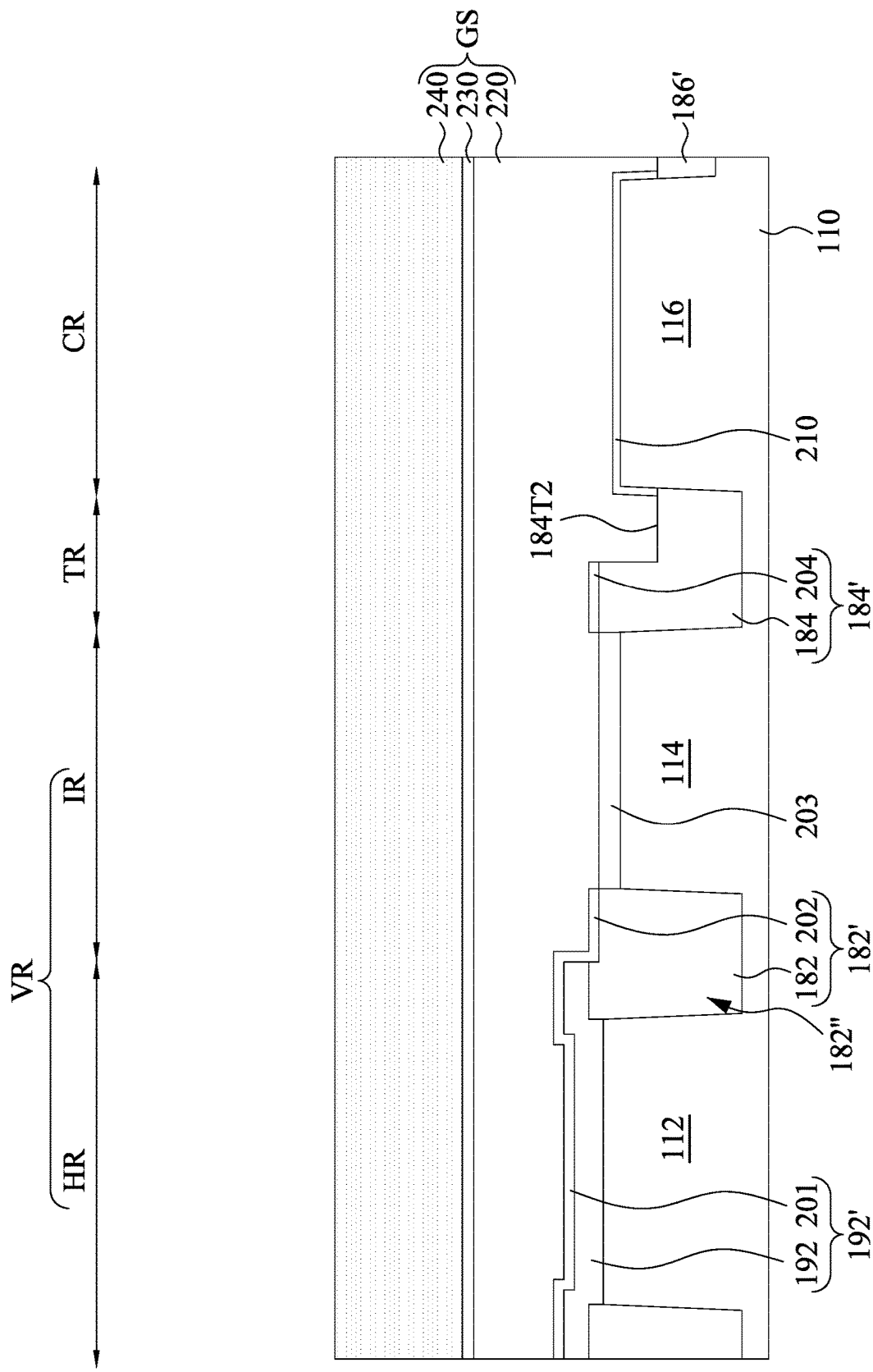

Reference is made to FIGS. 22A and 22B. A dielectric layer 210, a gate electrode layer 220, a hard mask layer 230, and an oxide mask layer 240 are formed over the structure of FIGS. 21A and 21B in a sequence. The gate electrode layer 220, the hard mask layer 230, and the oxide mask layer 240 are referred to as a gate electrode stack layer GS in the context.

In some embodiments, the dielectric layer 210 includes suitable dielectric materials, such as silicon oxide. The dielectric layer 210 may be formed using thermal oxidation, atomic layer deposition (ALD), chemical vapor deposition (CVD), the like, or the combination thereof. In some embodiments, the deposition of the dielectric layer 210 may also form a thin oxide layer over the dielectric layer 192', the dielectric layer 203, and the isolation features 182'-186' (referring to FIGS. 21A and 21B), thereby thickening the dielectric layer 192', the dielectric layer 203, and the isolation features 182'-186'. In some embodiments, since the dielectric layer 210 is mostly formed by oxidizing silicon material, a thickness of the dielectric layer 210 over the semiconductor fins 116 is thicker than a thickness of the formed thin oxide layer over the dielectric layer 192', 203 and isolation features 182'-186'. For clear illustration, a combination of the isolation feature 182' and a portion of the dielectric layer 192' over the isolation feature 182' may be referred to as an isolation feature 182".

After the dielectric layer 210 is formed, the gate electrode layer 220 is formed over the dielectric layer 210. In some embodiments, the gate electrode layer 220 may include polycrystalline-silicon (poly-Si), poly-crystalline silicon-germanium (poly-SiGe), metallic nitrides, metallic silicides, metallic oxides, or metals. In some embodiments, the gate electrode layer 220 includes a metal-containing material such as TiN, TaN, TaC, Co, Ru, Al, combinations thereof, or multi-layers thereof. The gate electrode layer 220 may be deposited by CVD, physical vapor deposition (PVD), sputter deposition, or other techniques suitable for depositing conductive materials. In some embodiments, after the deposition of the gate electrode layer 220, a planarization process (e.g., CMP) may be performed to planarize a top surface of the gate electrode layer 220.

In some embodiments, the hard mask layer 230 includes suitable dielectric materials, such as semiconductor nitride (e.g., silicon nitride (SiN)), semiconductor oxynitride (e.g., silicon oxynitride (SiON)), the like, or the combination thereof. In some embodiments, the hard mask layer 230 may be formed by ALD, CVD, the like, or the combination thereof. In some embodiments, the oxide mask layer 240 includes suitable dielectric materials, such as tetraethoxysilane (TEOS). The oxide mask layer 240 may be formed using, for example, CVD, spin-on-glass (SOG) or other suitable techniques.

Figure 23A:
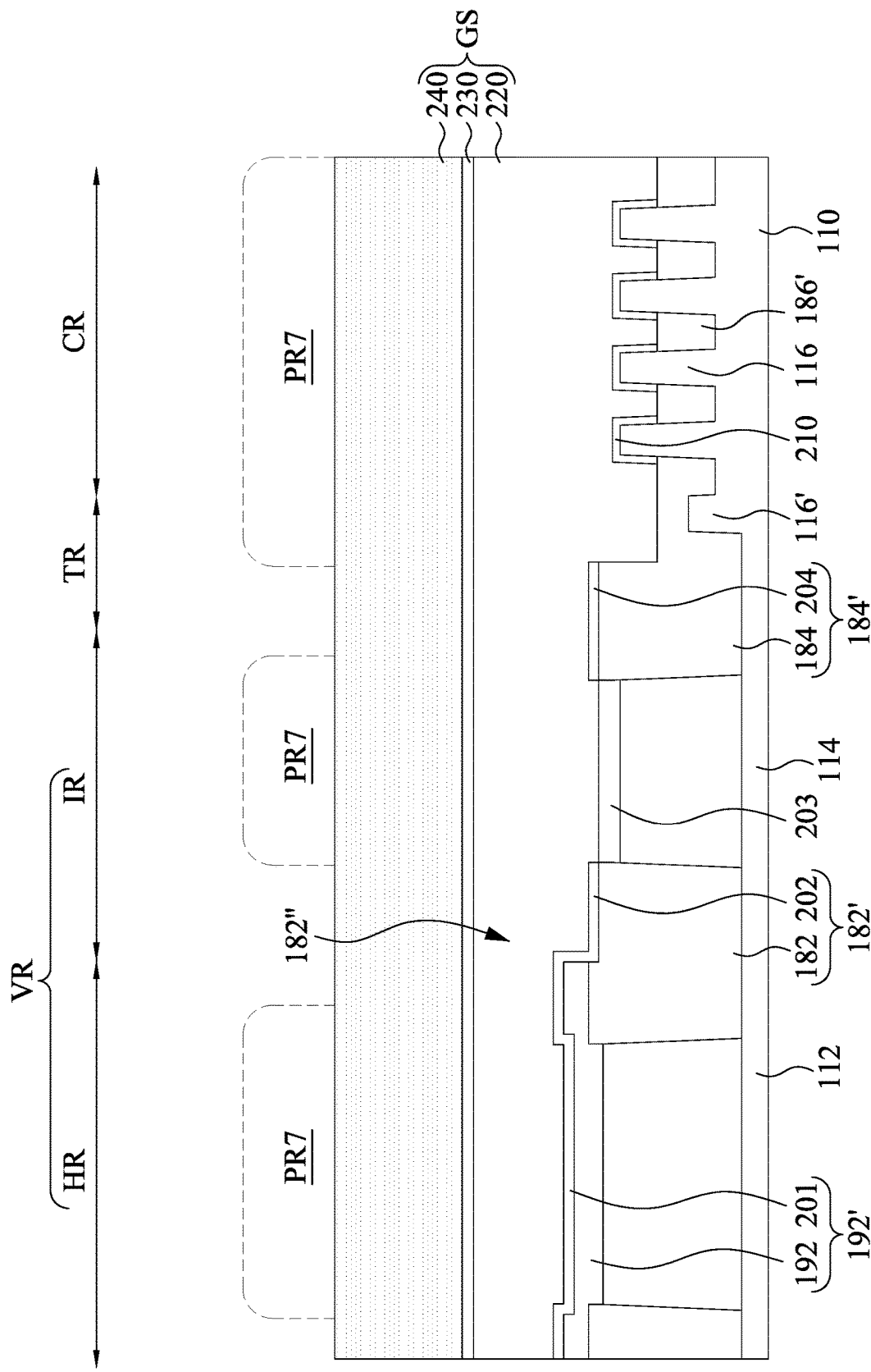
Figure 23B:
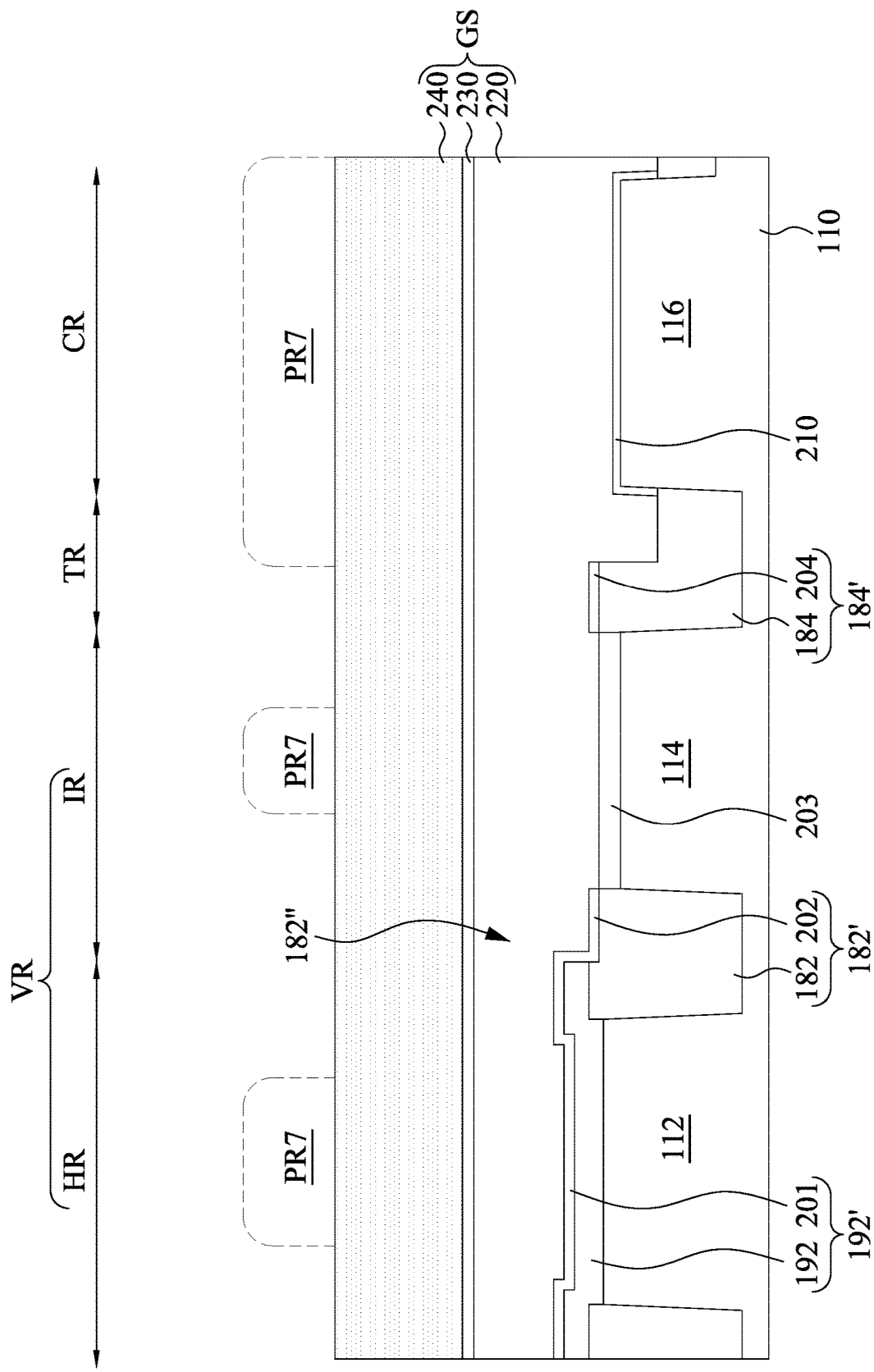

Reference is made to FIGS. 23A and 23B. A patterned resist layer PR7 is formed over the structure of FIGS. 22A and 22B. The patterned resist layer PR7 may include plural layers made of suitable material or composition. In some embodiments, the patterned resist layer PR7 may be a photoresist mask formed by suitable photolithography process. For example, the photolithography process may include spin-on coating a photoresist layer over the structure of FIGS. 22A and 22B, performing post-exposure bake processes, and developing the photoresist layer to form the patterned resist layer PR7. In some embodiments, patterning the resist to form the patterned mask element may be performed using an electron beam (e-beam) lithography process or an extreme ultraviolet (EUV) lithography process. In some other embodiments, the patterned resist layer PR7 may be tri-layer resist layer, for example, including a bottom layer (e.g., $C_xH_yO_z$), a middle layer (e.g., $SiC_xH_yO_z$), and a photoresist top layer.

Figure 24A:
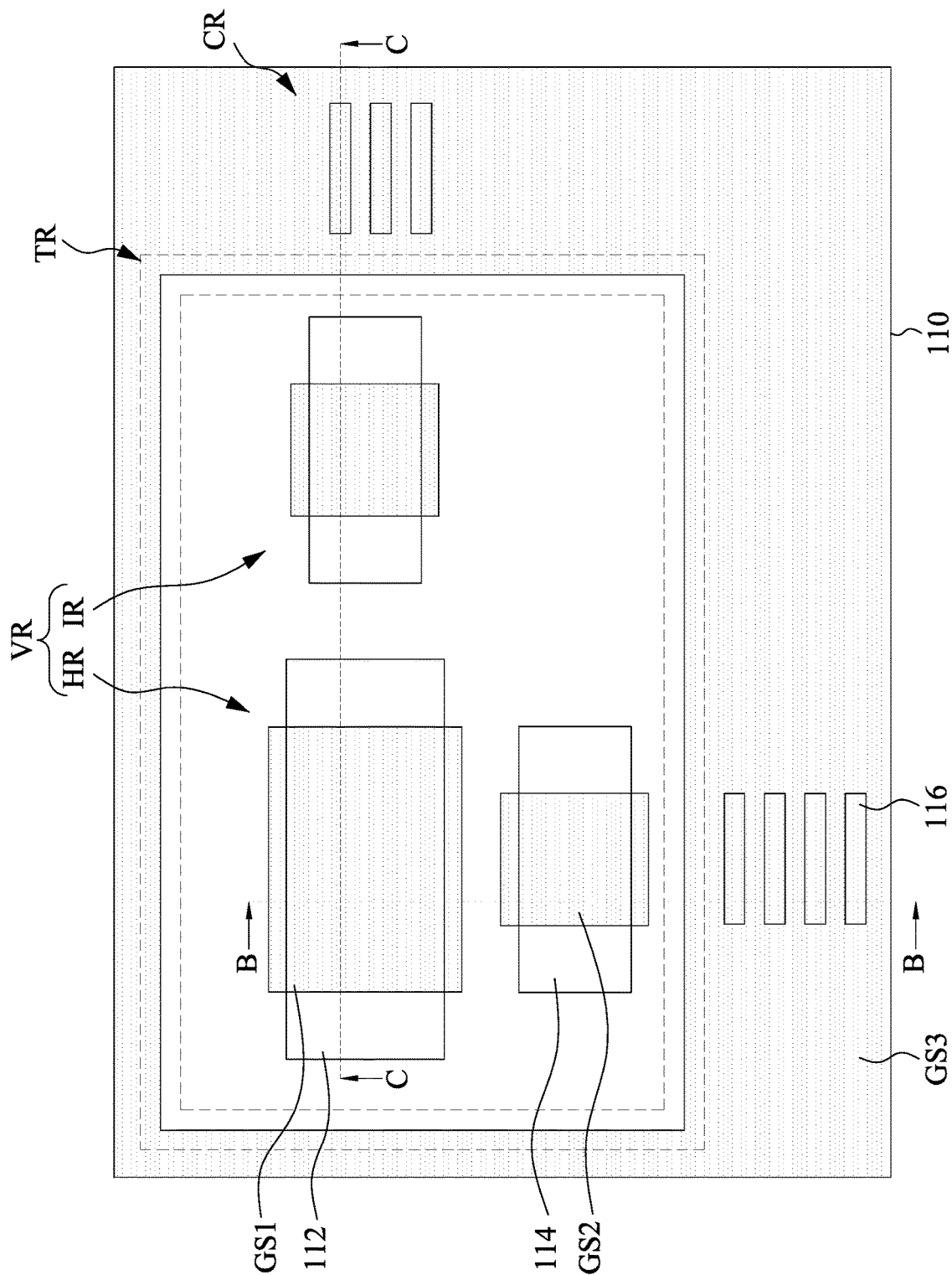
Figure 24B:
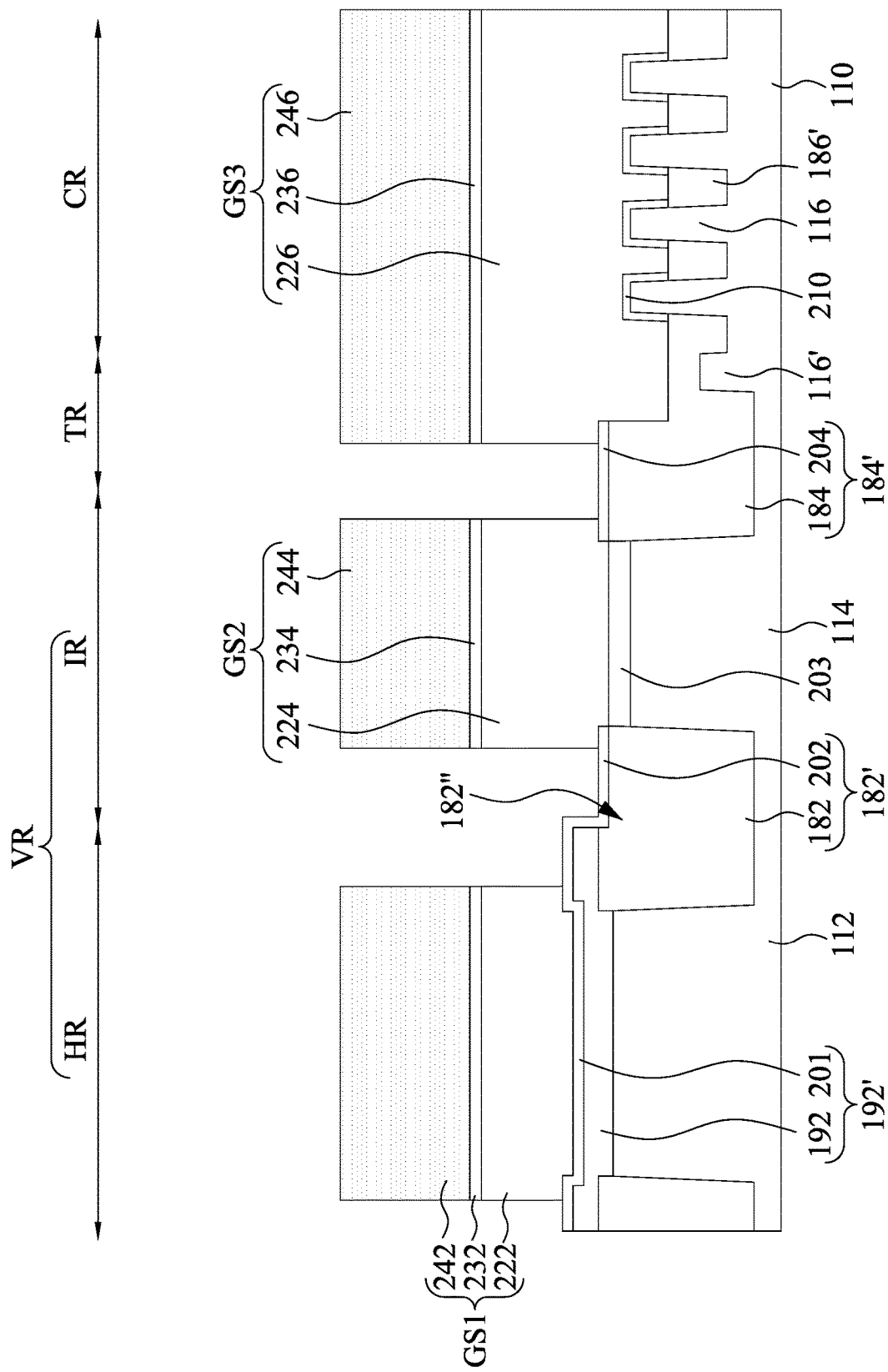
Figure 24C:
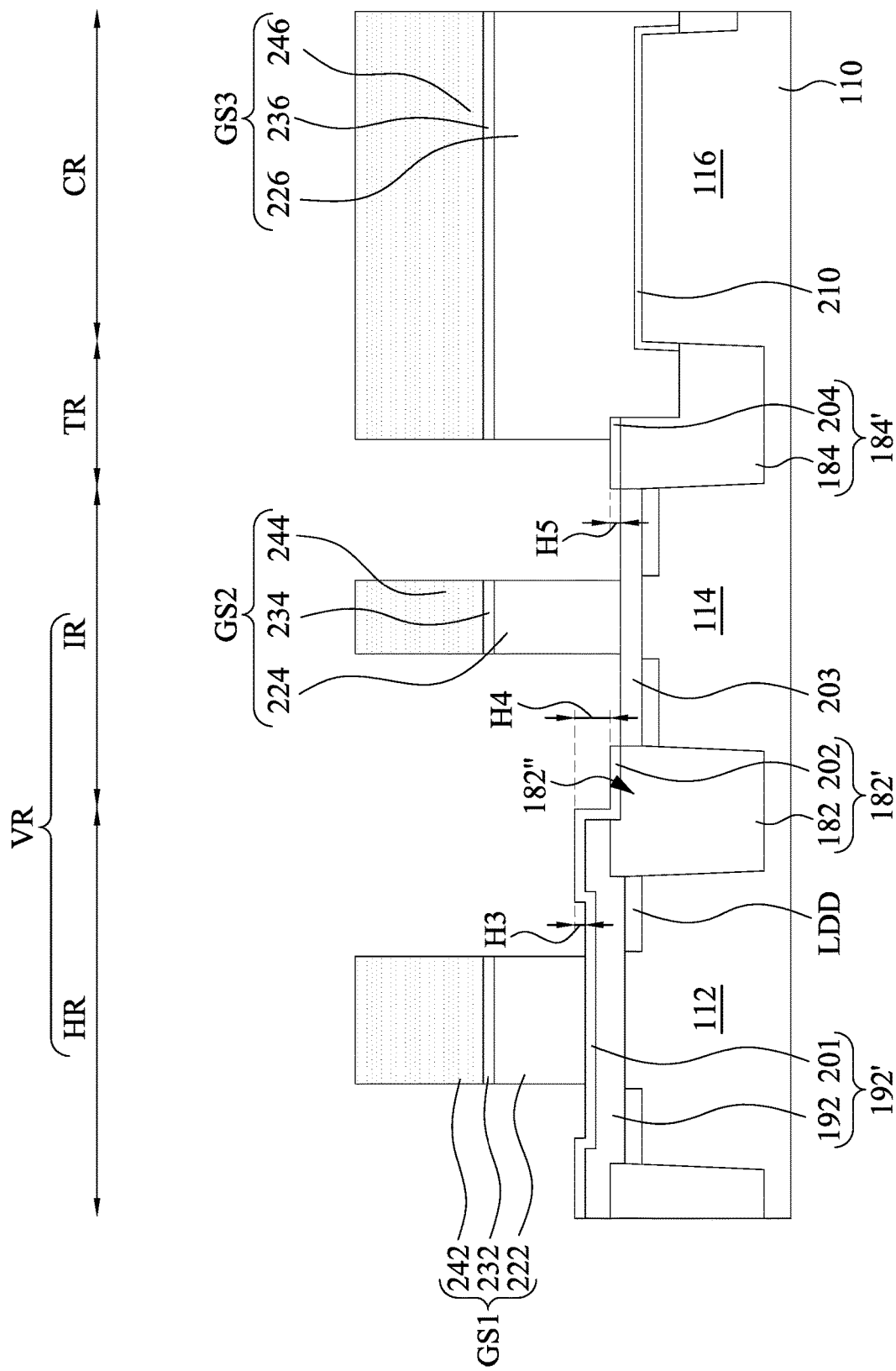

Reference is made to FIGS. 24A-24C. FIG. 24B is a cross-sectional view taken along line B-B in FIG. 24A. FIG. 24C is a cross-sectional view taken along line C-C in FIG. 24A. The gate electrode stack layer GS is patterned into gate stacks GS1 and GS2 and a gate electrode extending portion GS3 by suitable etching process. The gate stacks GS1 and GS2 and the gate electrode extending portion GS3 are respectively in the regions HR, IR, and CR. The etching processes may include dry etching, wet etching, and/or other etching methods (e.g., reactive ion etching).

An etching process is performed using the patterned resist layer PR7 (referring to FIGS. 23A and 23B) as an etch mask, and the patterned resist layer PR7 (referring to FIGS. 23A and 23B) is removed after the etching. The resulting structure is shown in FIGS. 24A-24C. The gate stack GS1 may include a gate electrode 222, a hard mask layer 232 over the gate electrode 222, and an oxide mask 242 over the hard mask layer 232. The gate stack GS2 may include a gate electrode 224, a hard mask layer 234 over the gate electrode 224, and an oxide mask 244 over the hard mask layer 234. The gate electrode extending portion GS3 may include a gate electrode layer 226, a hard mask layer 236 over the gate electrode layer 226, and an oxide mask layer 246 over the hard mask layer 236. The masks 242 and 244 and the oxide mask layer 246 are patterned from the oxide mask layer 240 (referring to FIGS. 23A and 23B). The hard mask layers 232-236 are patterned from the hard mask layer 230 (referring to FIGS. 23A and 23B). The gate electrodes 222 and 224 and the gate electrode layer 226 are patterned from the gate electrode layer 220 (referring to FIGS. 23A and 23B). After the etching process, the patterned resist layer PR7 may be removed by suitable stripping methods.

Figure 25A:
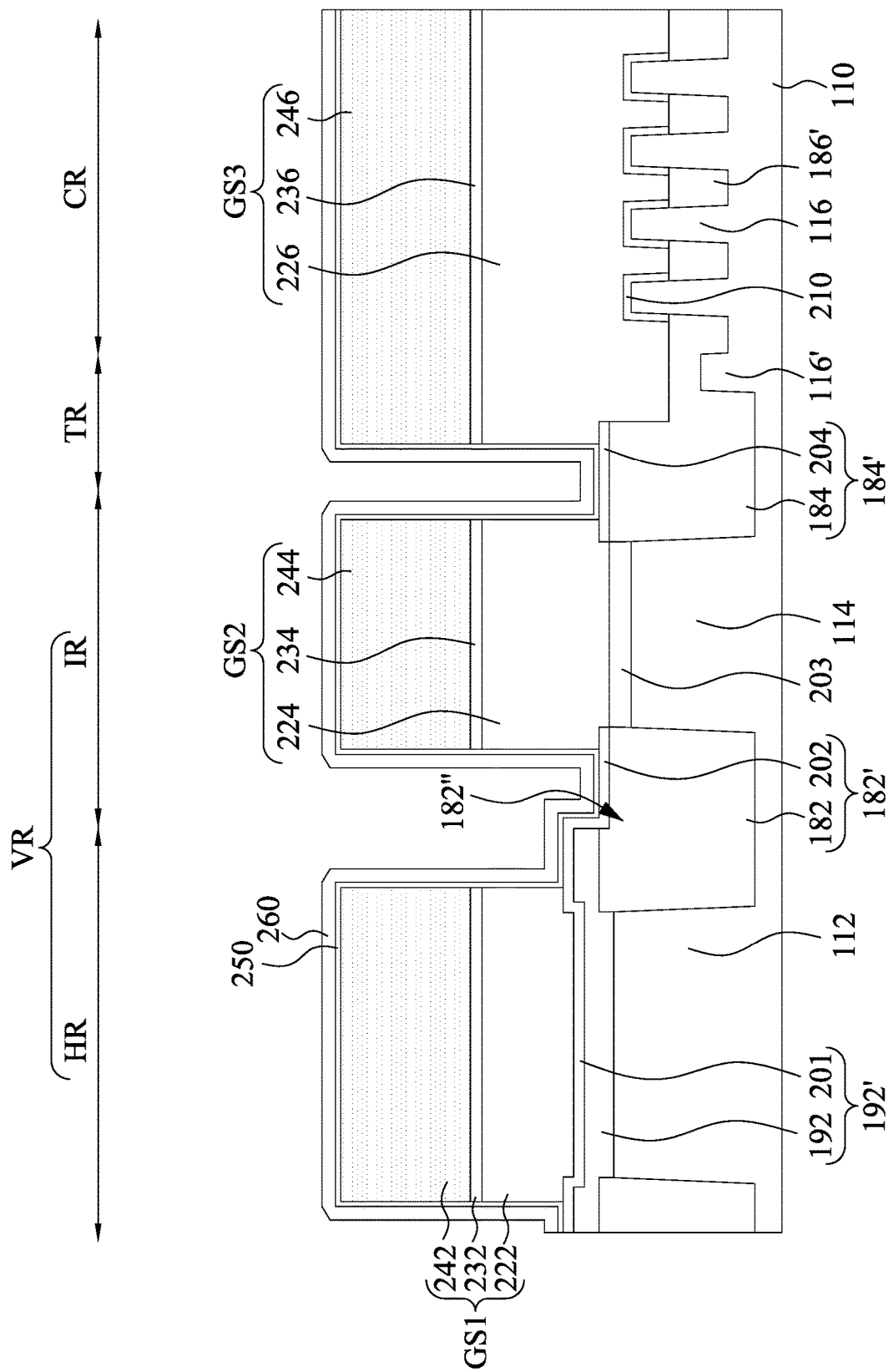
Figure 25B:
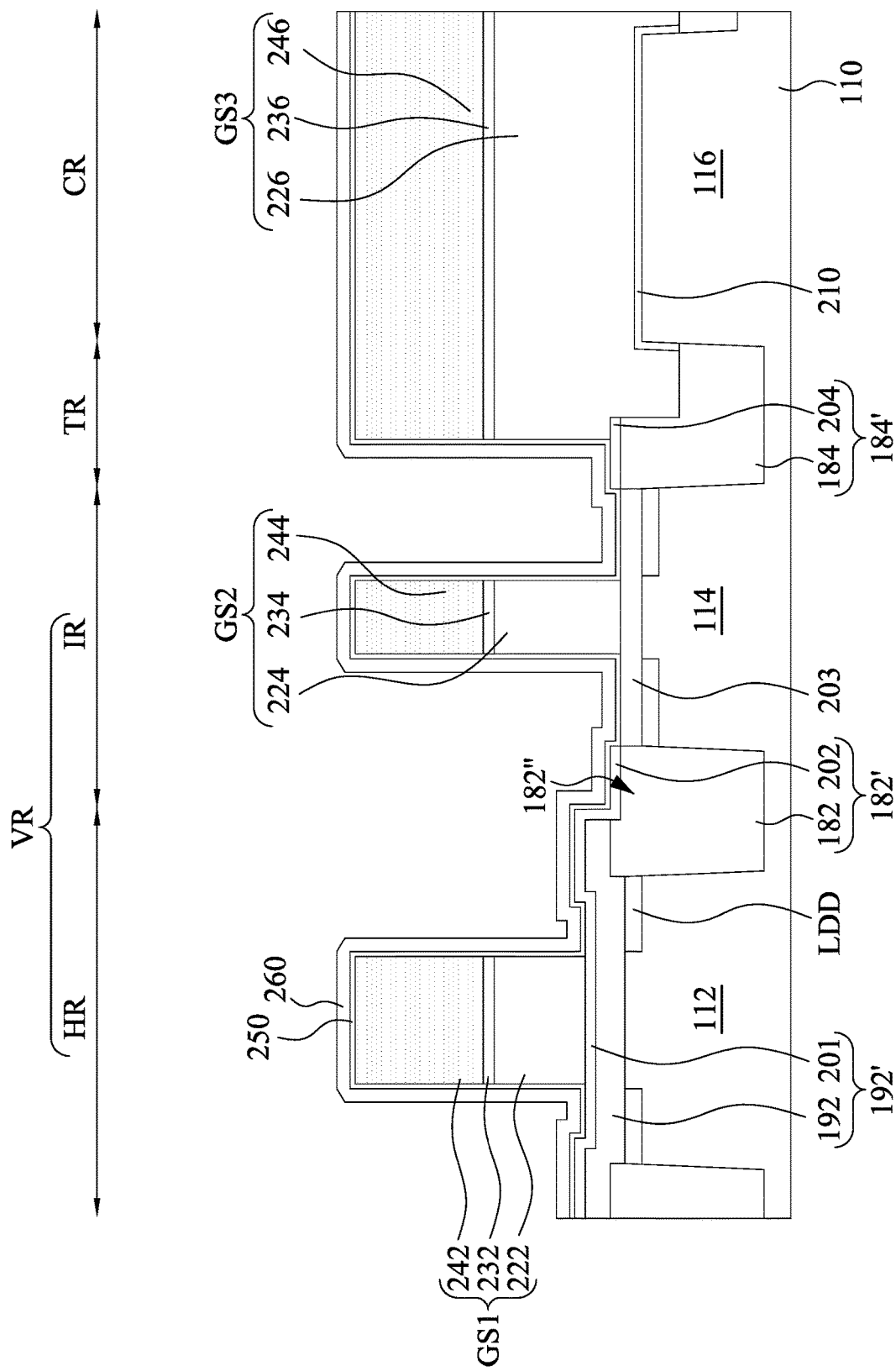

Reference is made to FIGS. 25A and 25B. After the formation of the gate electrode stacks GS1 and GS2 and the gate electrode extending portion GS3, a seal layer 250 and a spacer layer 260 are conformally formed on the structure of FIGS. 24A, 24B and 24C. The seal layer 250 may include suitable dielectric materials, such as semiconductor nitride (e.g., silicon nitride (SiN)), semiconductor oxynitride (e.g., silicon oxynitride (SiON)), the like, or the combination thereof. In some embodiments, after the formation of the gate electrode stacks GS1 and GS2 and the gate electrode extending portion GS3, a seal layer 250 is conformally deposited on sidewalls and top surfaces of the gate electrode stacks GS1 and GS2 and the gate electrode extending portion GS3. Lightly doped regions LLD may be formed in the region VR (e.g., regions HR and IR) by suitable implantation processes after depositing seal layer 250. The implantation process may be performed with n-type dopants, such as phosphorus or arsenic, and/or p-type dopants, such as boron or $BF_2$, depending on design requirements. In some embodiments, the formation of the lightly doped regions LLD may also include plural process, such as the formation of photoresist masks by photolithography process, cleaning process, or the like. Following the formation of the lightly doped regions LLD, a spacer layer 260 is conformally deposited on the seal layer. The spacer layer 260 may include suitable dielectric materials, such as semiconductor nitride (e.g., silicon nitride (SiN)), semiconductor oxynitride (e.g., silicon oxynitride (SiON)), the like, or the combination thereof. The deposition of the seal layer 250 and the spacer layer 260 may include ALD, CVD, the like, or the combination thereof.

In some embodiments, the seal layer 250 is a thin film that formed directly after the formation of gate electrode stacks GS1 and GS2, thereby protecting the gate electrode stacks GS1 and GS2 and the gate electrode extending portion GS3 from contamination in subsequent process, e.g., the photolithography process and/or cleaning process in the formation of the lightly doped regions LLD. For example, a thickness of the seal layer 250 is in a range of from about 1 angstrom to about 50 angstroms. In some embodiments, a thickness of the spacer layer 260 is greater than that of the seal layer 250. For example, a thickness of the spacer layer 260 is in a range of from about 30 angstroms to about 300 angstroms. If the thickness is greater than about 300 angstroms, a distance from source/drain feature to channel region may be so large such that a conductive current is reduced, which may result in poor device performance. If the thickness is less than about 30 angstroms, hot carrier injection (HCI) may become serious.

In some embodiments, a vertical distance difference H3 between a top surface of the dielectric layer 192' over the active region 112 and a top surface of the isolation feature 182" (e.g., a combination of the isolation feature 182' and a portion of the dielectric layer 192' thereon) adjacent the high voltage region HR may be in a range of about 600 angstroms to about minus 800 angstroms. For example, the top surface of the dielectric layer 192' over the active region 112 may be higher than, horizontally aligned with, or lower than the top surface of the isolation feature 182" adjacent the high voltage region HR. In some embodiments, a vertical distance difference H4 between a top surface of the isolation feature 182" adjacent the high voltage region HR and a top surface of the isolation feature 182" adjacent the I/O region IR may be in a range of about 1 angstrom to about 800 angstroms. In some embodiments, a vertical distance difference H5 between a top surface of the dielectric layer 203 over the active region 114 and a top surface of the isolation feature 184' adjacent the I/O region IR may be in a range of about 770 angstroms to about minus 800 angstroms. For example, the top surface of the dielectric layer 203 over the active region 114 may be higher than, horizontally aligned with, or lower than the top surface of the isolation feature 184' adjacent the I/O region IR. If the vertical distance differences H3-H5 are out of the corresponding ranges, step difference may become serious, and/or number of defects may increase, thereby reducing yield rate.

In some embodiments, the vertical distance difference H3 is a difference between a distance from a top surface of the dielectric layer 192' over the active region 112 to the top surface of the semiconductor substrate 110 and a distance from the top surface of the isolation feature 182" adjacent the high voltage region HR to the top surface of the semiconductor substrate 110. In some embodiments, the vertical distance difference H4 is a difference between a distance from a top surface of the isolation feature 182" adjacent the high voltage region HR to the top surface of the semiconductor substrate 110 and a distance from the top surface of the isolation feature 182" adjacent the I/O region IR to the top surface of the semiconductor substrate 110. In some embodiments, the vertical distance difference H5 is a difference between a distance from a top surface of the dielectric layer 203 over the active region 114 to the top surface of the semiconductor substrate 110 and a distance from the top surface of the isolation feature 184' adjacent the I/O region IR to the top surface of the semiconductor substrate 110.

Figure 26A:
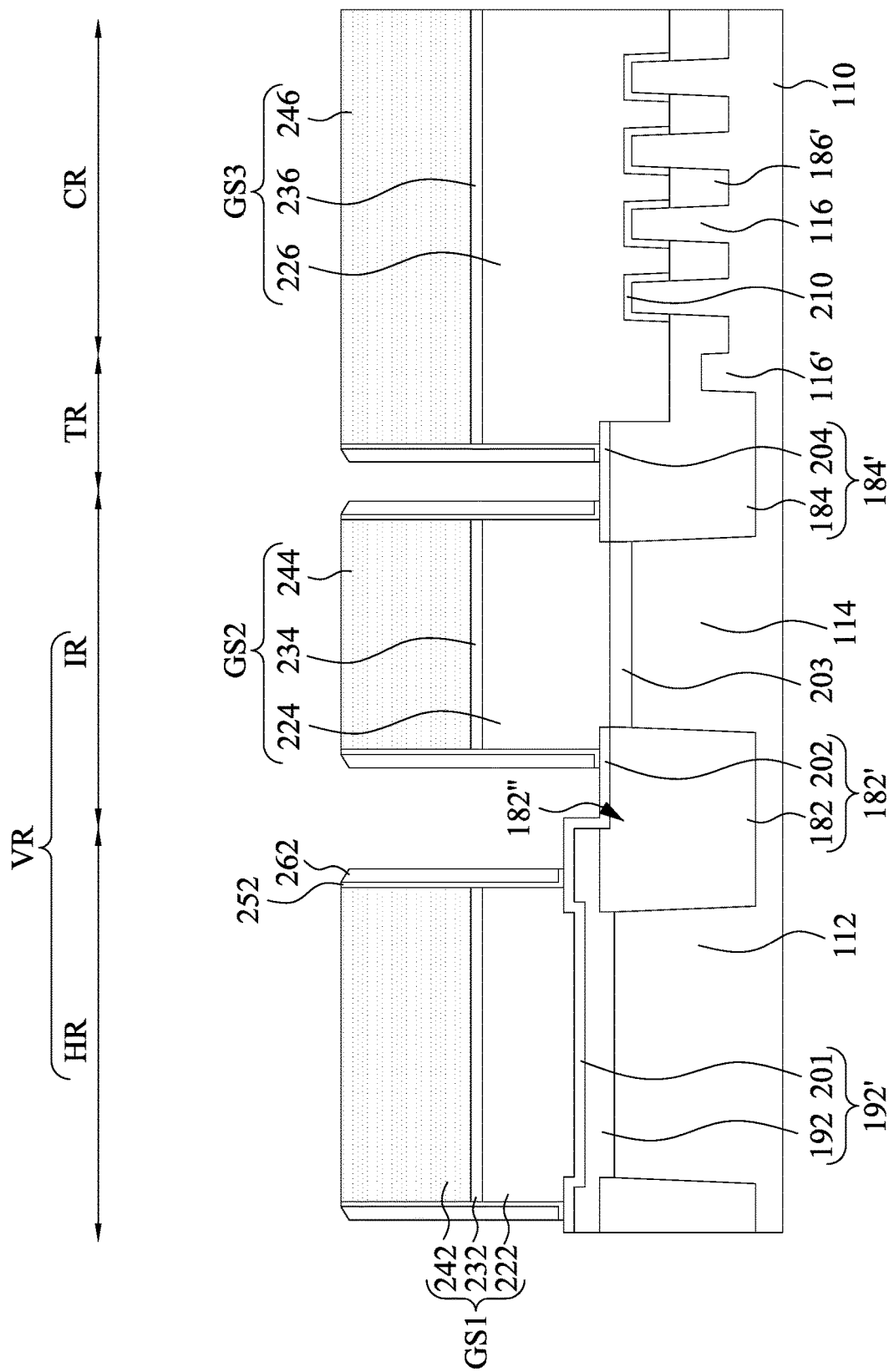
Figure 26B:
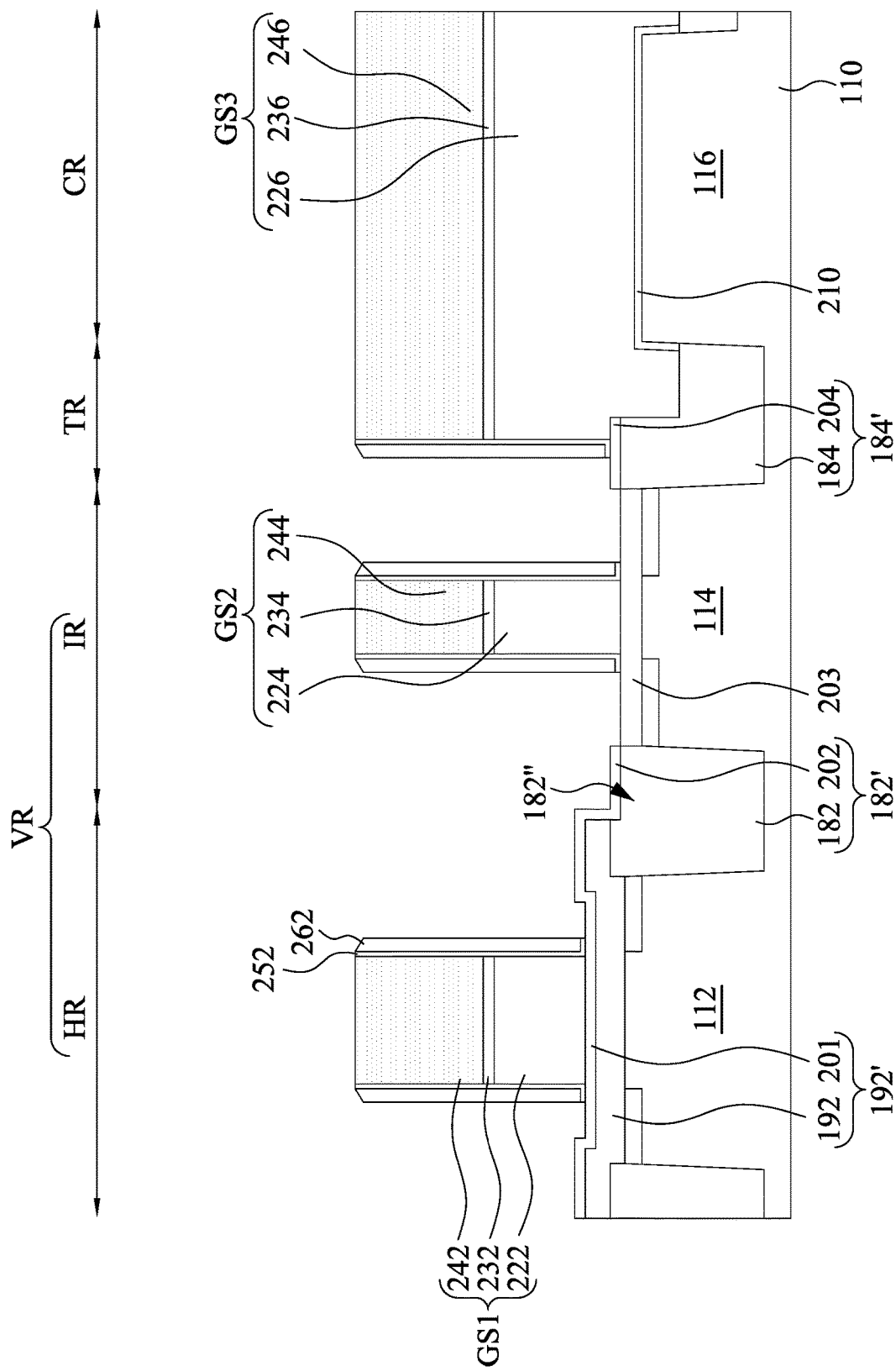

Reference is made to FIGS. 26A and 26B. Subsequently, the seal layer 250 and the spacer layer 260 (referring to FIGS. 25A and 25B) are respectively patterned into the seal layers 252 and the spacers 262 by suitable anisotropic etching process. For example, a dry etch process, using suitable gas etchants, may be performed to remove horizontal portions of the seal layer 250 and the spacer layer 260 (referring to FIGS. 25A and 25B), and remaining vertical portions of the seal layer 250 and the spacer layer 260 (referring to FIGS. 25A and 25B) respectively form the seal layers 252 and the spacers 262 on opposite sidewalls of the gate electrode stacks GS1 and GS2 and the gate electrode extending portion GS3.

Figure 27:
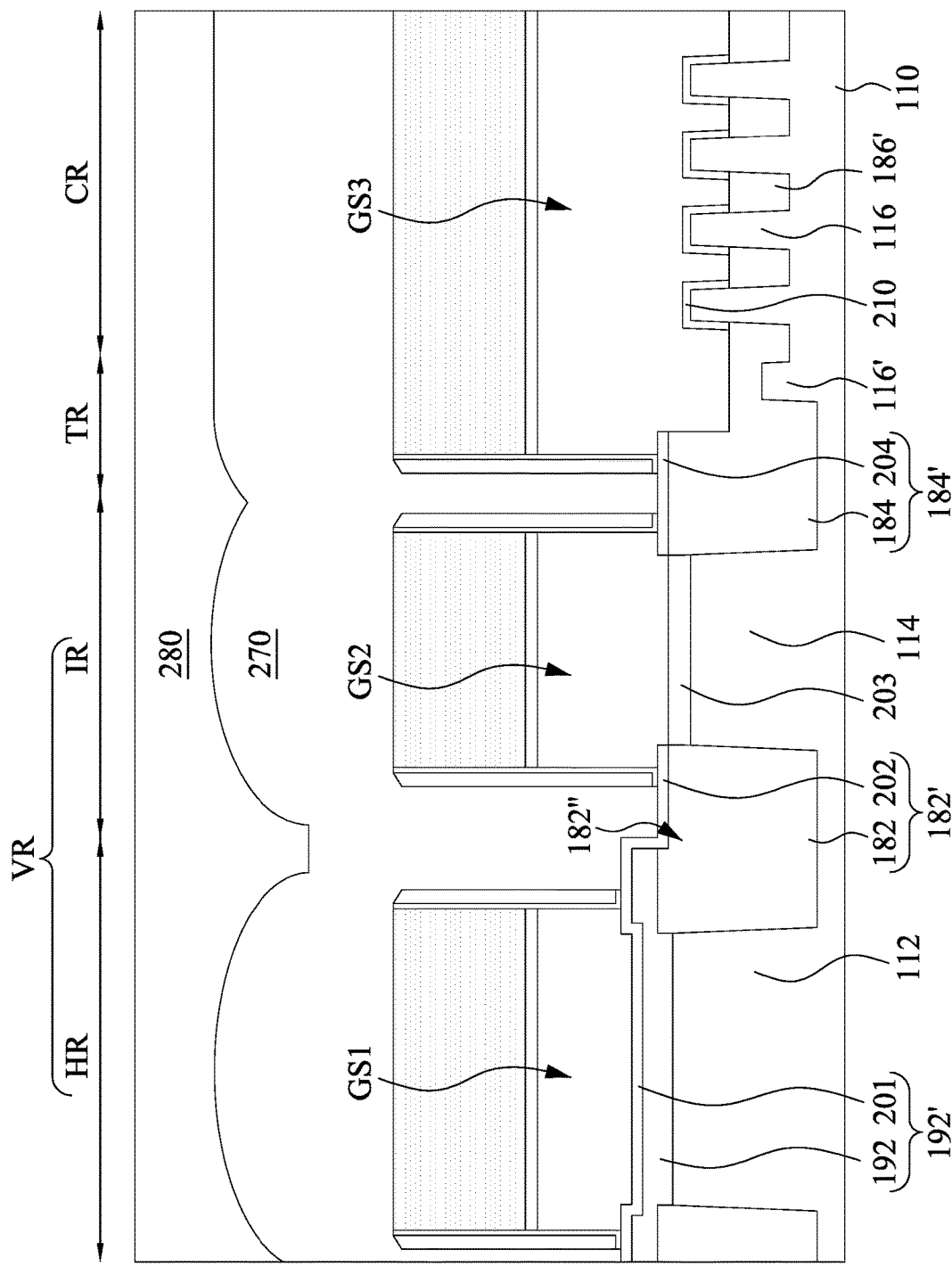

Reference is made to FIG. 27. An amorphous silicon filling material 270 is deposited over the structure of FIGS. 26A-26B, and a bottom anti-reflection coating (BARC) layer 280 is then coated over the amorphous silicon filling material 270. The amorphous silicon filling material 270 may be deposited by suitable deposition methods, such as CVD. The deposited amorphous silicon filling material 270 may fill the gaps between the gate electrode stacks GS1 and GS2 and the gate electrode extending portion GS3. The deposited amorphous silicon filling material 270 may have a top surface conforming to the profile of the gate electrode stacks GS1 and GS2 and the gate electrode extending portion GS3. For example, the deposited amorphous silicon filling material 270 have recesses over the gaps between the gate electrode stacks GS1 and GS2 and the gate electrode extending portion GS3. The BARC layer 280 may include suitable organic material. In some embodiments, BARC layer 280 may include silicon oxycarbide (SiOC). The BARC 280, with good flowability, may fill the recesses in the amorphous silicon filling material 270, and have a more planar top surface than the top surface of the deposited amorphous silicon filling material 270.

Figure 28A:
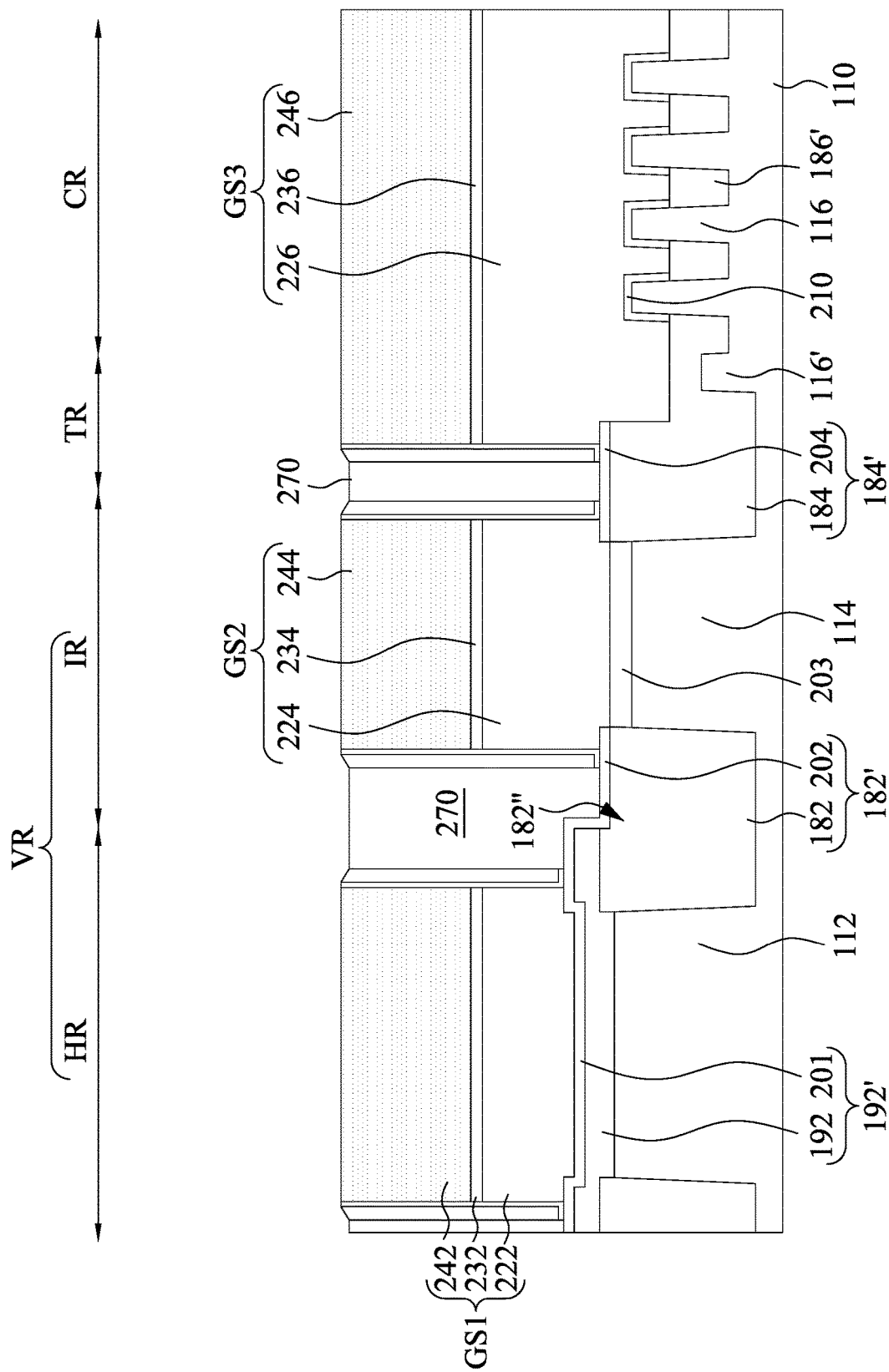
Figure 28B:
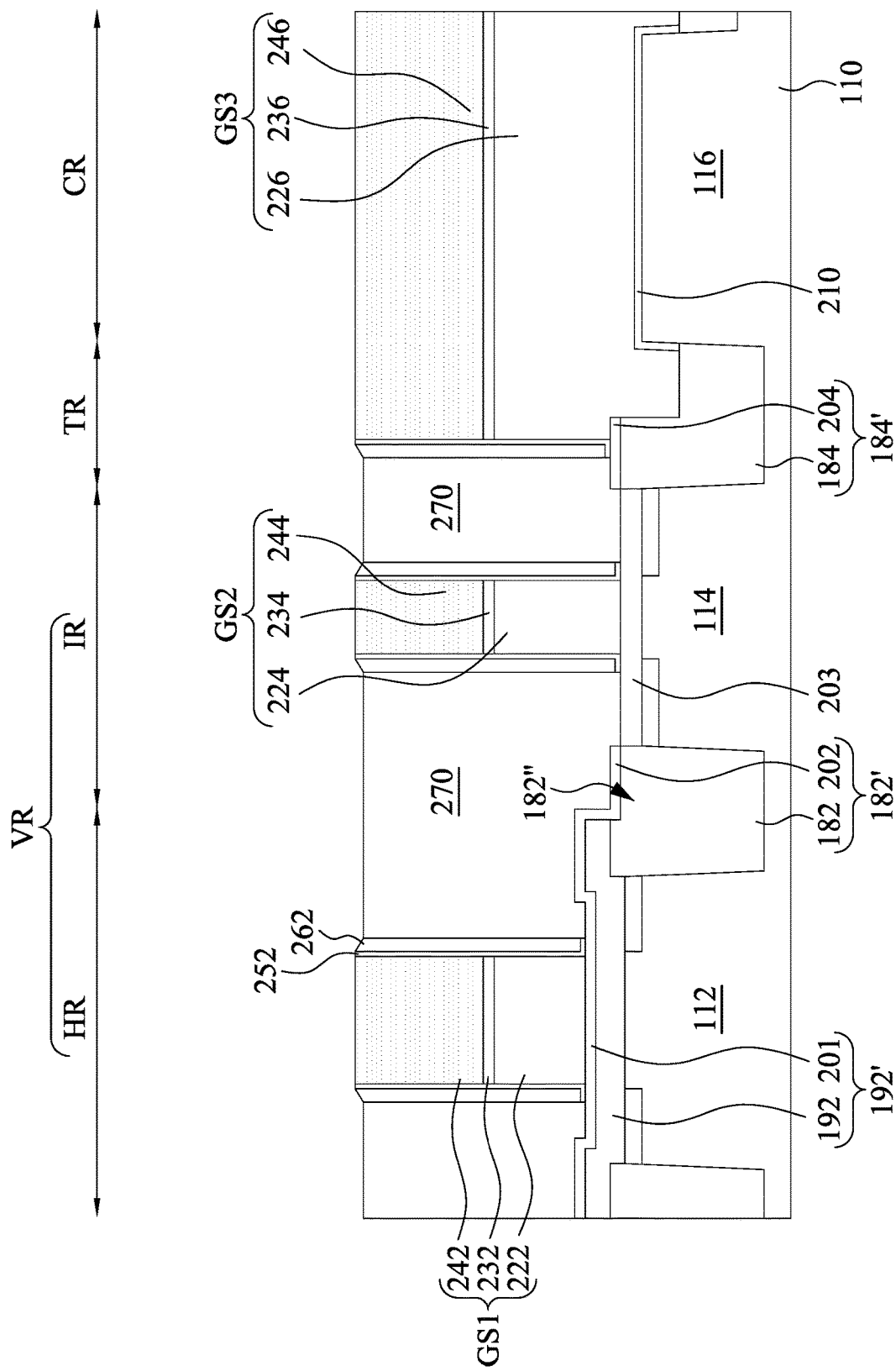

Reference is made to FIGS. 28A-28B. An etching back process is performed to remove the BARC 280 and a top portion of the amorphous silicon filling material 270 (referring to FIG. 27), and followed by a planarization process. The etching back process may show little etch selectively between the BARC 280 and the amorphous silicon filling material 270 (referring to FIG. 27), such that the amorphous silicon filling material 270 may have a planar top surface according to the planar top surface of BARC 280 (referring to FIG. 27) after the etching back process. The planarization process, such as CMP process, is then performed to level the top surface of the remaining amorphous silicon filling material 270 with top surfaces of the gate stacks GS1 and GS2 and the gate electrode extending portion GS3, thereby expose the top surfaces of the gate stacks GS1 and GS2 and the gate electrode extending portion GS3. The planarization process may also increase the planarity of the top surface of the amorphous silicon filling material 270. The configuration of the amorphous silicon filling material 270 may improve the flatness of a top surface of the structure, which is beneficial the lithography process for patterning the gate electrode stack layer GS in subsequent process.

Figure 29A:
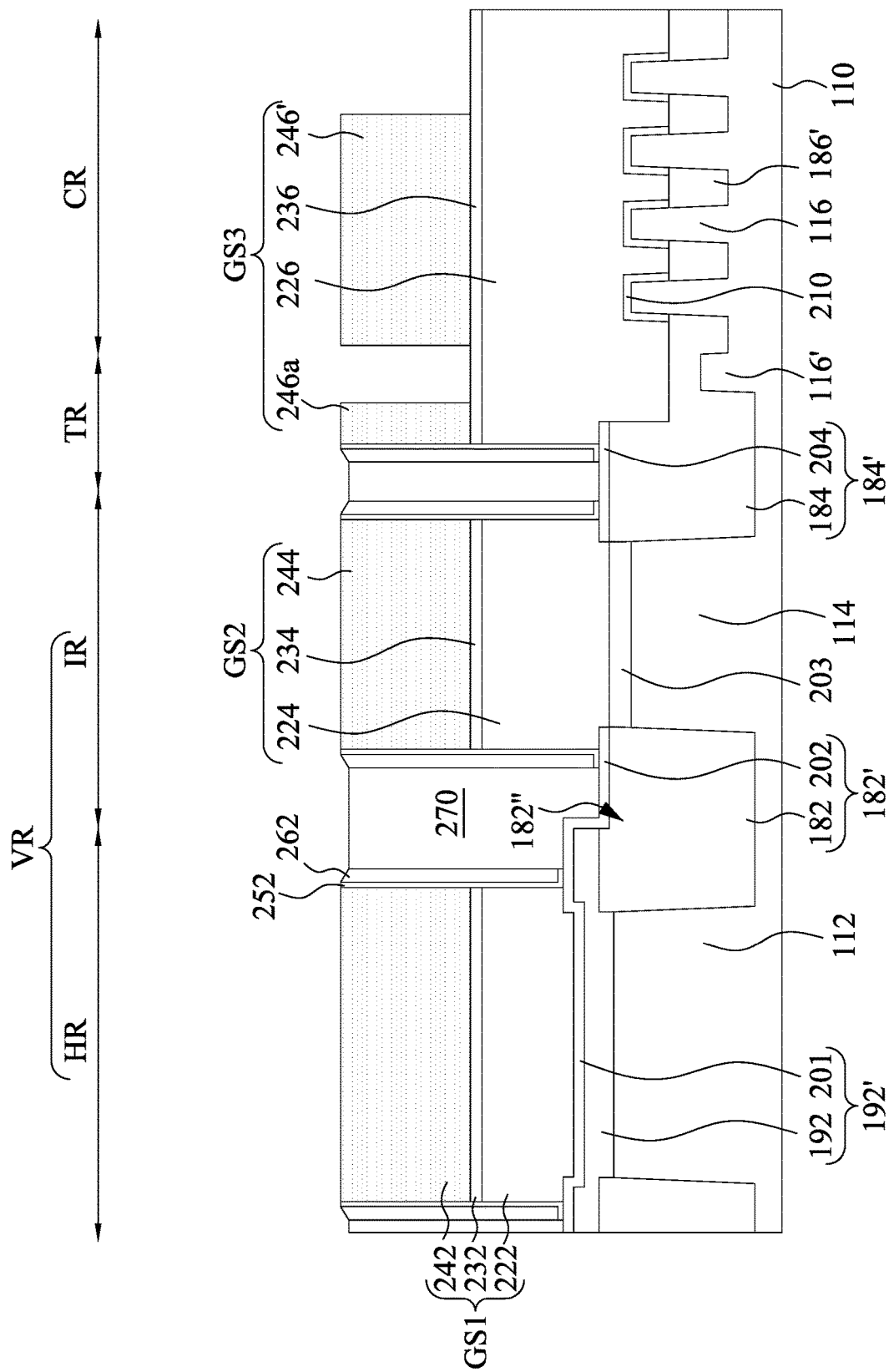
Figure 29B:
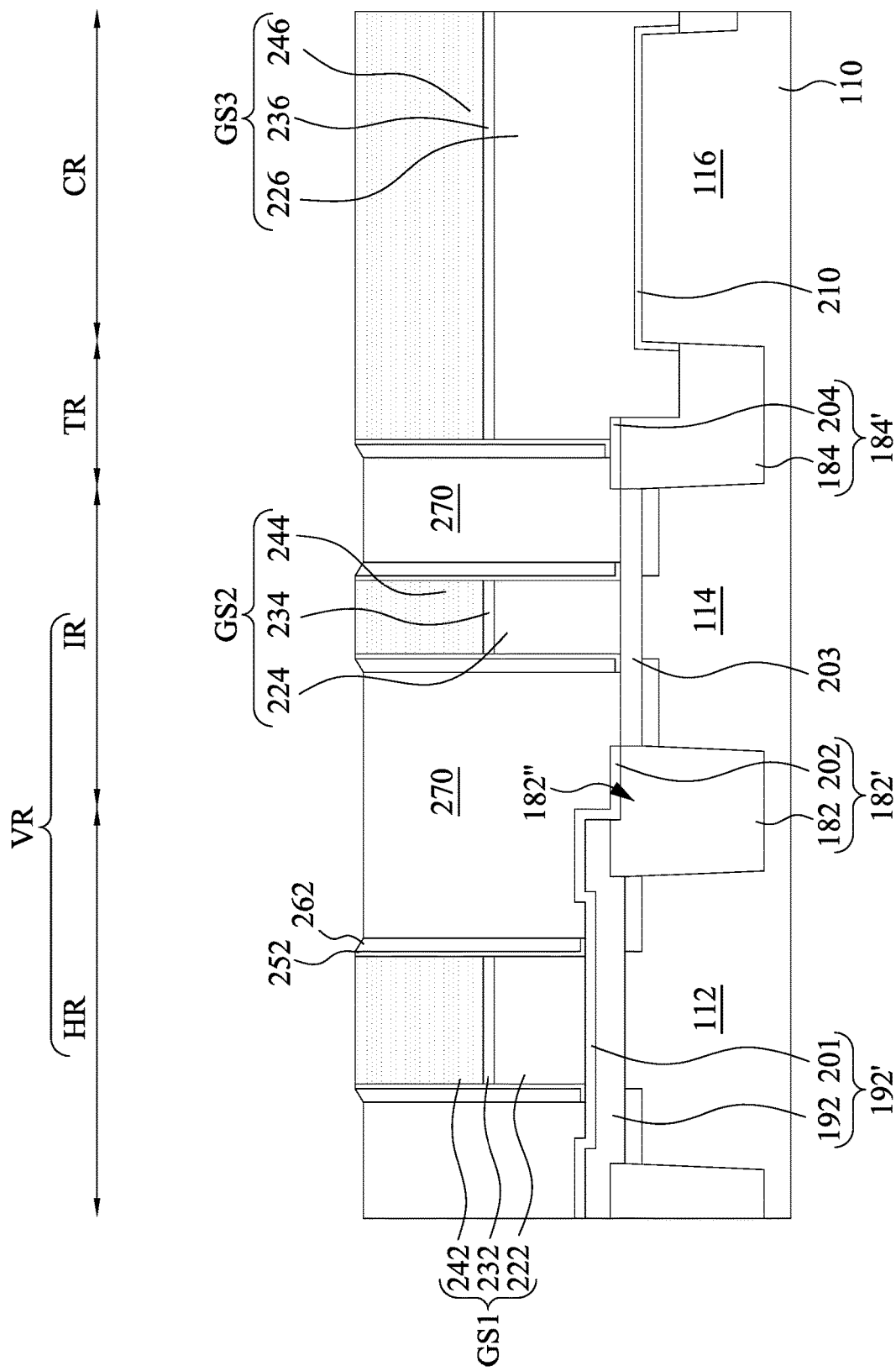

Reference is made to FIGS. 29A-29B. The oxide mask layer 246 (referring to FIGS. 28A-28B) is patterned into an oxide mask layer 246' and an oxide mask 246a in the transition region TR. In some embodiments, the patterning process comprises a photolithography process and an etching process. For example, the photolithography process may include spin-on coating a photoresist layer over the structure as illustrated in FIGS. 28A-28B, performing post-exposure bake processes, and developing the photoresist layer to form a patterned resist layer. Subsequently, the etching process is performed to etch portions of the oxide mask layer 246 (referring to FIGS. 28A-28B) exposed by the patterned resist layer, thereby forming the oxide mask layer 246' and the oxide mask 246a. The etching process may include a dry etch, a wet etch, or the combination thereof. For example, suitable gas etchants may be used for etching the oxide mask layer 246 (referring to FIGS. 28A-28B). The hard mask layer 236 may have a higher etch resistance to the etching process than that of the oxide mask layer 246 (referring to FIGS. 28A-28B), and may act as an etch stop layer during the etching process.

Figure 30A:
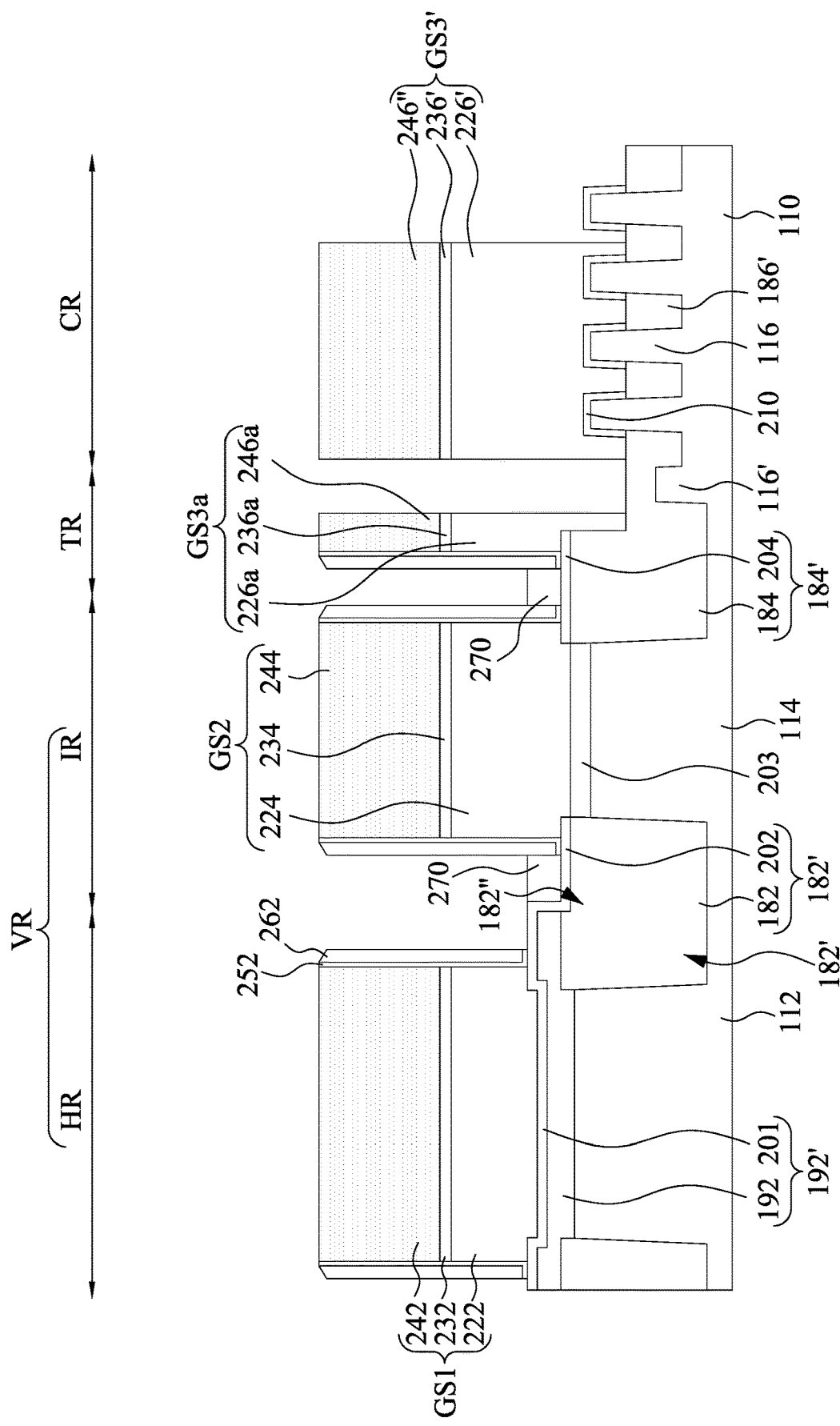
Figure 30B:
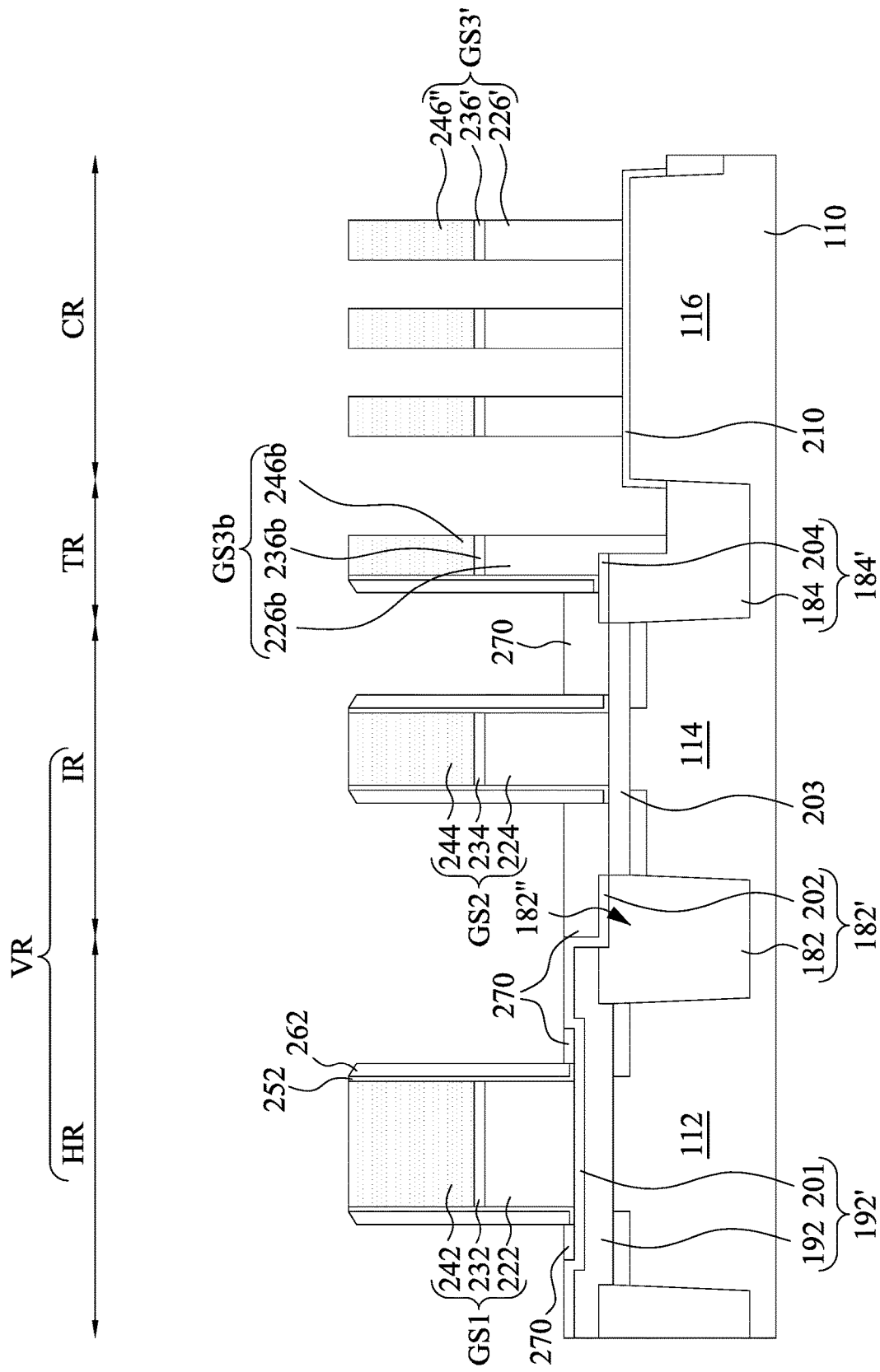

Reference is made to FIGS. 30A-30B. The oxide mask layer 246' (referring to FIGS. 29A-29B) is patterned into plural masks 246" in the core region CR and an oxide mask 246b in the transition region TR. In some embodiments, the patterning process comprises a photolithography process and an etching process. For example, the photolithography process may include spin-on coating a photoresist layer over the structure as illustrated in FIGS. 29A-29B, performing post-exposure bake processes, and developing the photoresist layer to form a patterned resist layer. Subsequently, the etching process is performed to etch portions of the oxide mask layer 246' (referring to FIGS. 29A-29B) exposed by the patterned resist layer, thereby forming the masks 246" and the oxide mask 246b. The etching process may include a dry etch, a wet etch, or the combination thereof. The hard mask layer 236 (referring to FIGS. 29A-29B may have a higher etch resistance to the etching process than that of the oxide mask layer 246' (referring to FIGS. 29A-29B), and may act as an etch stop layer during the etching process.

Subsequently, the hard mask layer 236 (referring to FIGS. 29A-29B) is then patterned through the masks 246a, 246b, and 246" into the layers 236a, 236b, and 236', and the gate electrode layer 226 (referring to FIGS. 29A-29B) is then patterned through the masks 246a, 246b, and 246" into the gate electrodes 226a, 226b, and 226'. By the patterning process, gate stacks GS3a and GS3b are formed over the transition region TR, and gate stacks GS3' are formed over the core region CR. The gate stack GS3a may include the oxide mask 246a, the hard mask layer 236a, and the gate electrode 226a. The gate stack GS3b may include the oxide mask 246b, the hard mask layer 236b, and the gate electrode 226b. The gate stack GS3' may include one of the masks 246", one of the layers 236', and one of the gate electrodes 226'. In some embodiments, the gate stacks GS3a, and GS3b may be referred to as dummy gate stacks, and the gate electrodes 226a and 226b may be referred to as dummy gate electrodes. In some embodiments, a bottommost surface of the gate electrode 226' is lower than a bottommost surface of the gate electrode 222/224, and a bottommost surface of the gate electrode 222/224 is over a top surface of the active region 112/114. In some embodiments, some or all of the gate stacks GS1, GS2, GS3', GS3a, and GS3b will be replaced with a replacement gate structure using a "gate-last" or replacement-gate process.

In some embodiments, the patterning process performed to the oxide mask layer 246', hard mask layer 236, and the gate electrode layer 226 (referring to FIGS. 29A-29B) may include plural etching process using different suitable etchants. For example, the etching process may include a dry etch, a wet etch, or the combination thereof. In some embodiments, first gats etchants may be used for etching the oxide mask layer 246' (referring to FIGS. 29A-29B); second gas etchants may be used for etching the hard mask layer 236 (referring to FIGS. 29A-29B); and third gas etchants may be used for etching the gate electrode layer 226 (referring to FIGS. 29A-29B), in which the first to third gas etchants may be different from each other. The dielectric layer 210 may have a higher etch resistance to third gas etchants used to etch the gate electrode layer 226 (referring to FIGS. 29A-29B) than that of the gate electrode layer 226 (referring to FIGS. 29A-29B), and therefore may act as an etch stop layer during etching the gate electrode layer 226 (referring to FIGS. 29A-29B).

In some embodiments, a portion of the amorphous silicon filling material 270 may be consumed during patterning the gate electrode layer 226 (referring to FIGS. 29A-29B), such that a top surface of the amorphous silicon filling material 270 are lowered after patterning the gate electrode layer 226 (referring to FIGS. 29A-29B).

Figure 31A:
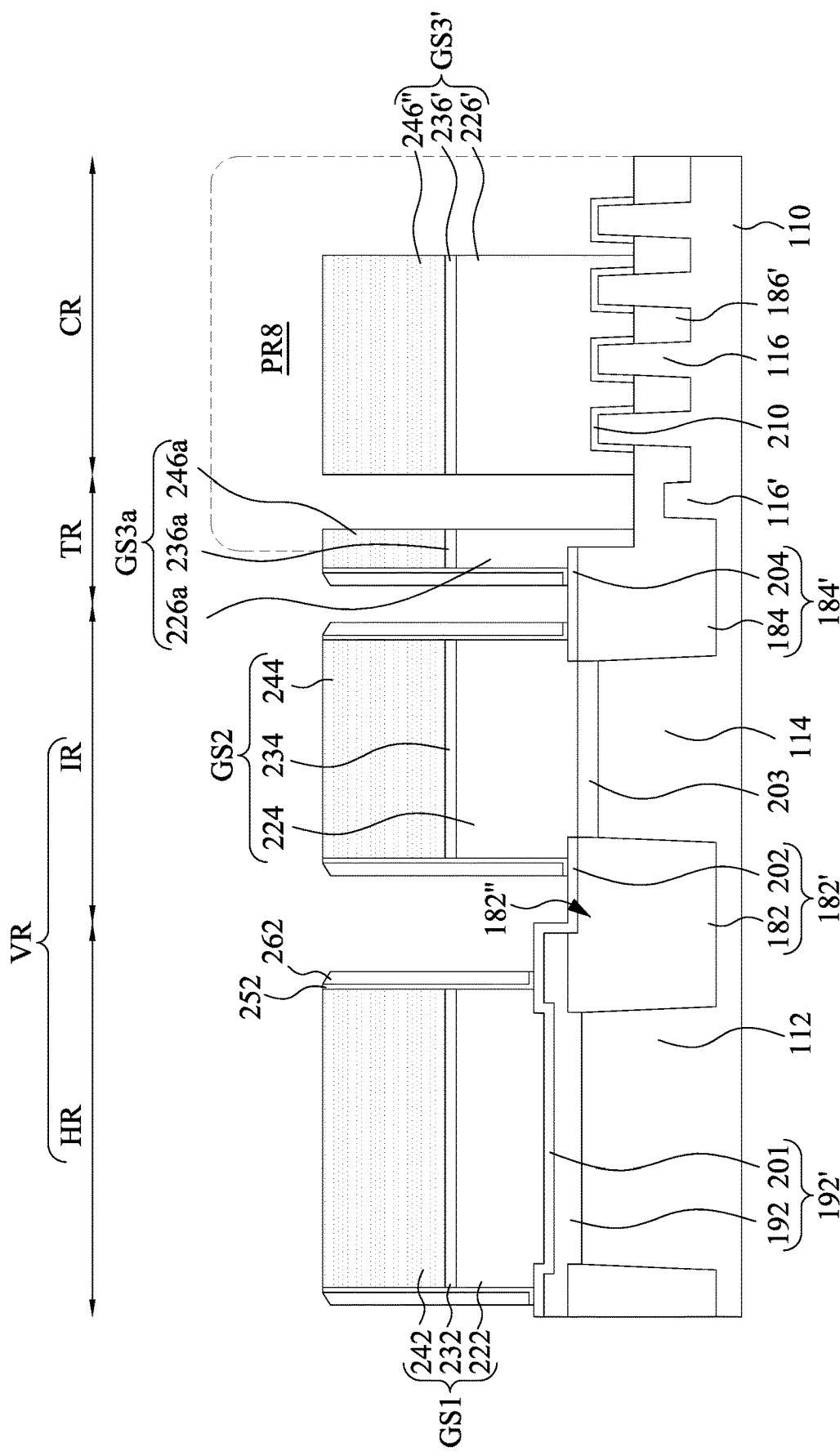
Figure 31B:
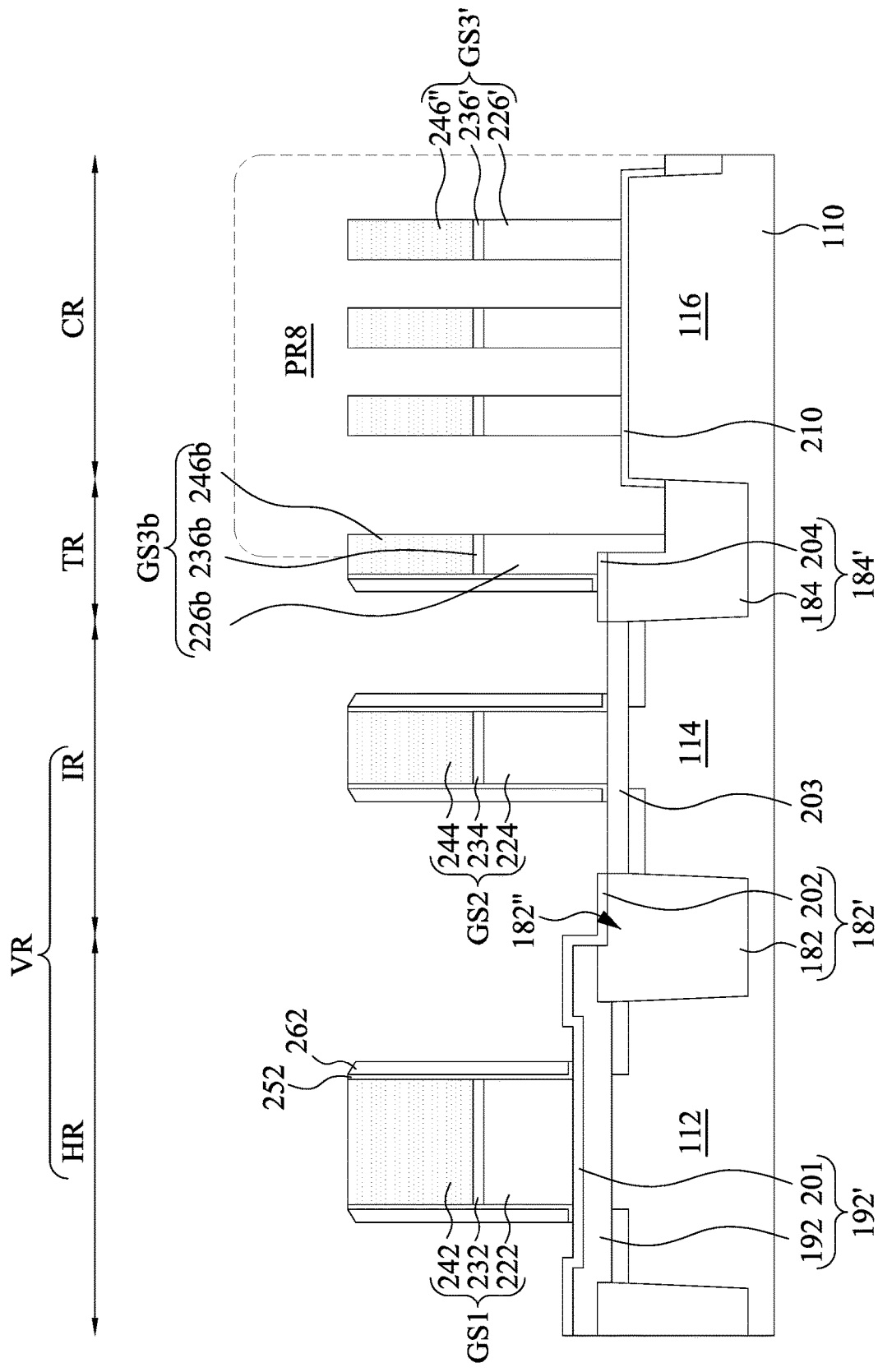

Reference is made to FIGS. 31A-31B. A patterned resist layer PR8 is formed over the core region CR, and then the remaining amorphous silicon filling material 270 is removed by suitable etching process. The patterned resist layer PR8 covers the core region CR and exposes the region VR, thereby protecting the gate electrode 226', 226a, and 226b from being etched during removing the remaining amorphous silicon filling material 270. In some embodiments, the etching process for removing the remaining amorphous silicon filling material 270 may include dry etch, wet etch, or the combination thereof. The patterned resist layer PR8 may include plural layers made of suitable material or composition. In some embodiments, the patterned resist layer PR8 may be a photoresist mask formed by suitable photolithography process. For example, the photolithography process may include spin-on coating a photoresist layer over the structure of FIGS. 30A and 30B, performing post-exposure bake processes, and developing the photoresist layer to form the patterned resist layer PR8. In some embodiments, patterning the resist to form the patterned mask element may be performed using an electron beam (e-beam) lithography process or an extreme ultraviolet (EUV) lithography process. In some other embodiments, the patterned resist layer PR8 may be tri-layer resist layer, for example, including a bottom layer (e.g., $C_xH_yO_z$), a middle layer (e.g., $SiC_xH_yO_z$), and a photoresist top layer.

The etching process may use suitable etchants that show etch selectivity between the amorphous silicon filling material 270 and the oxide material (e.g., isolation feature 182" and 184', dielectric layers 192' and 203, and the oxide mask layer 240) and show etch selectivity between the amorphous silicon filling material 270 and the nitride material (e.g., the seal layers 252 and the spacers 262). In other word, the isolation feature 182" and 184' and dielectric layers 192' and 203 may have a higher etch resistance to the etchants than that of the amorphous silicon filling material 270, thereby protecting the silicon substrate 100 from being etched during removing the remaining amorphous silicon filling material 270. The seal layers 252 and the spacers 262 may have a higher etch resistance to the etchants than that of the amorphous silicon filling material 270, thereby protecting polysilicon gate electrode from being etched during removing the remaining amorphous silicon filling material 270. The oxide mask layer 240 may have a higher etch resistance to the etchants than that of the amorphous silicon filling material 270, thereby protecting polysilicon gate electrode from being etched during removing the remaining amorphous silicon filling material 270.

Figure 32B:
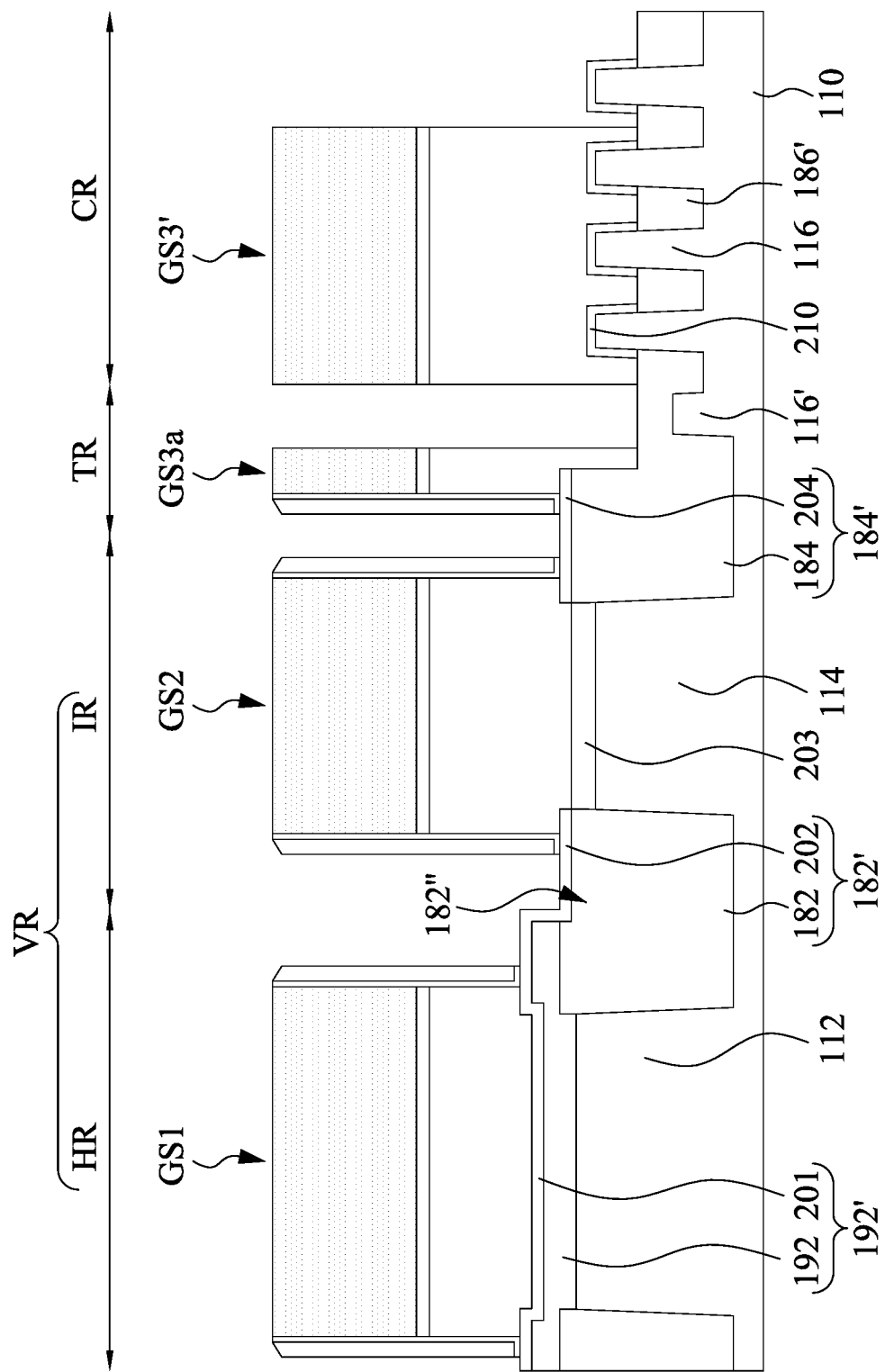
Figure 32C:
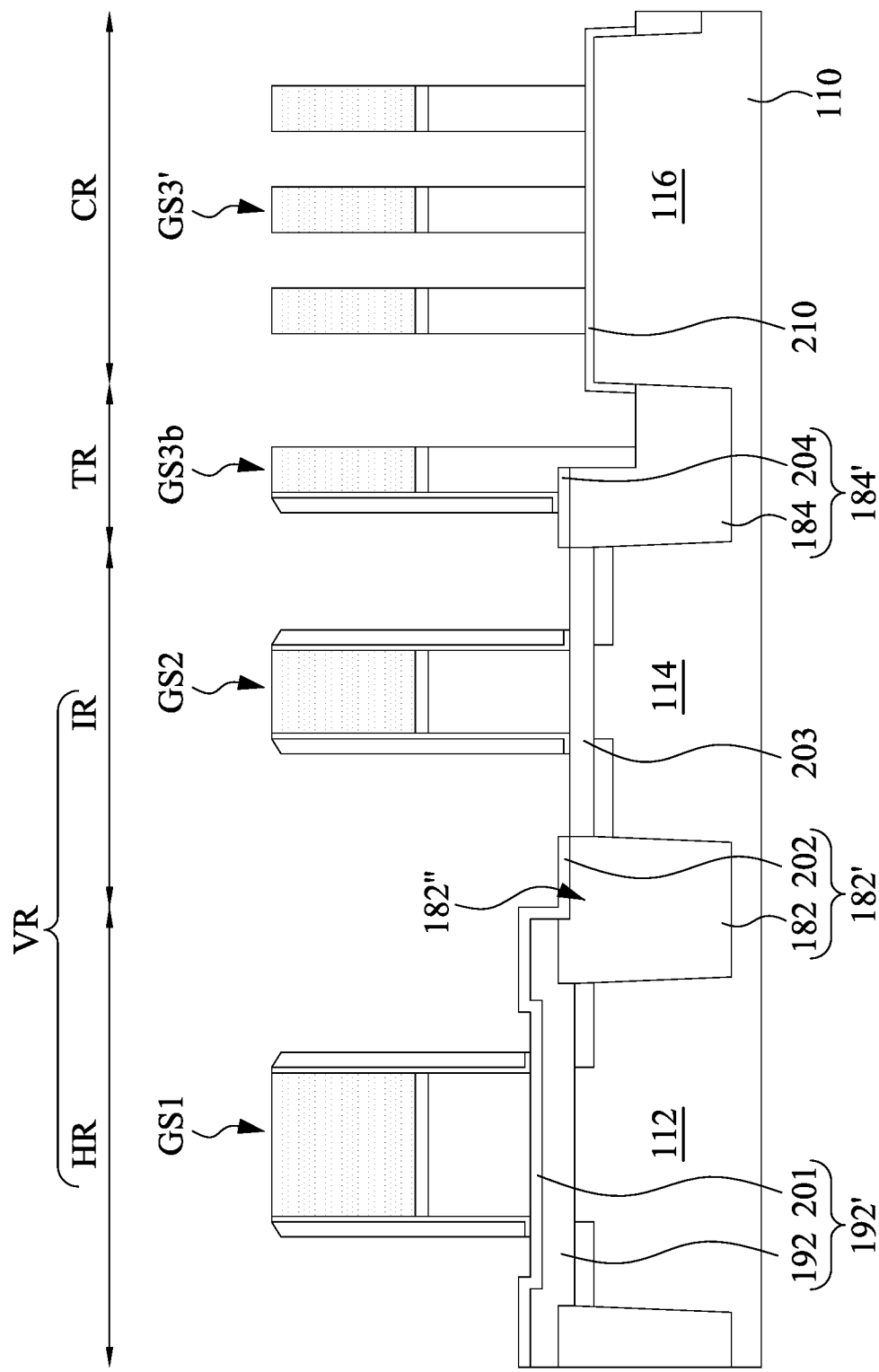

Reference is made to FIGS. 32A-32C. FIG. 32B is a cross-sectional view taken along line B-B in FIG. 32A. FIG. 32C is a cross-sectional view taken along line C-C in FIG. 32A. The resist layer PR8 is removed by suitable stripping method.

Figure 33A:
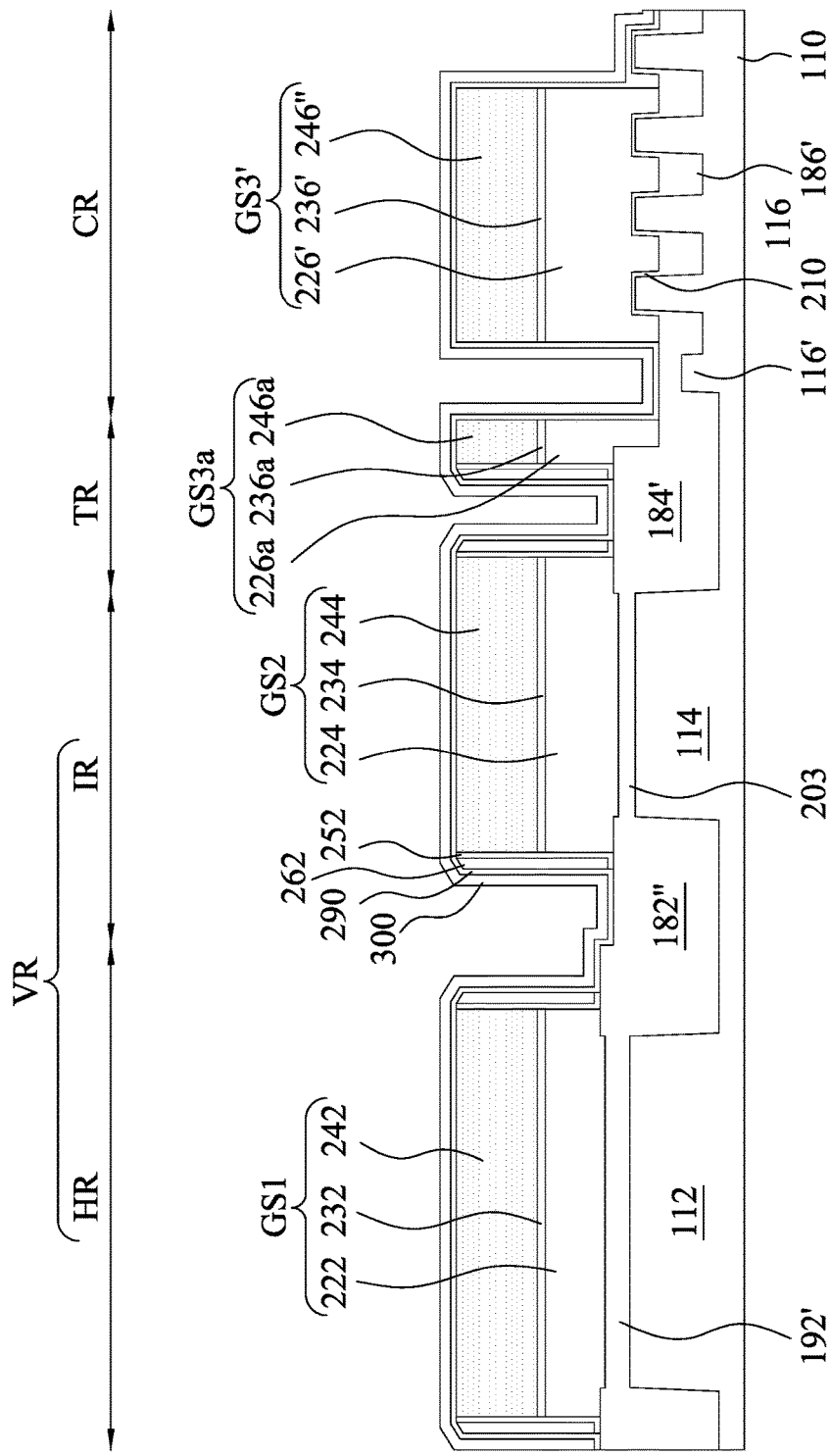
Figure 33B:
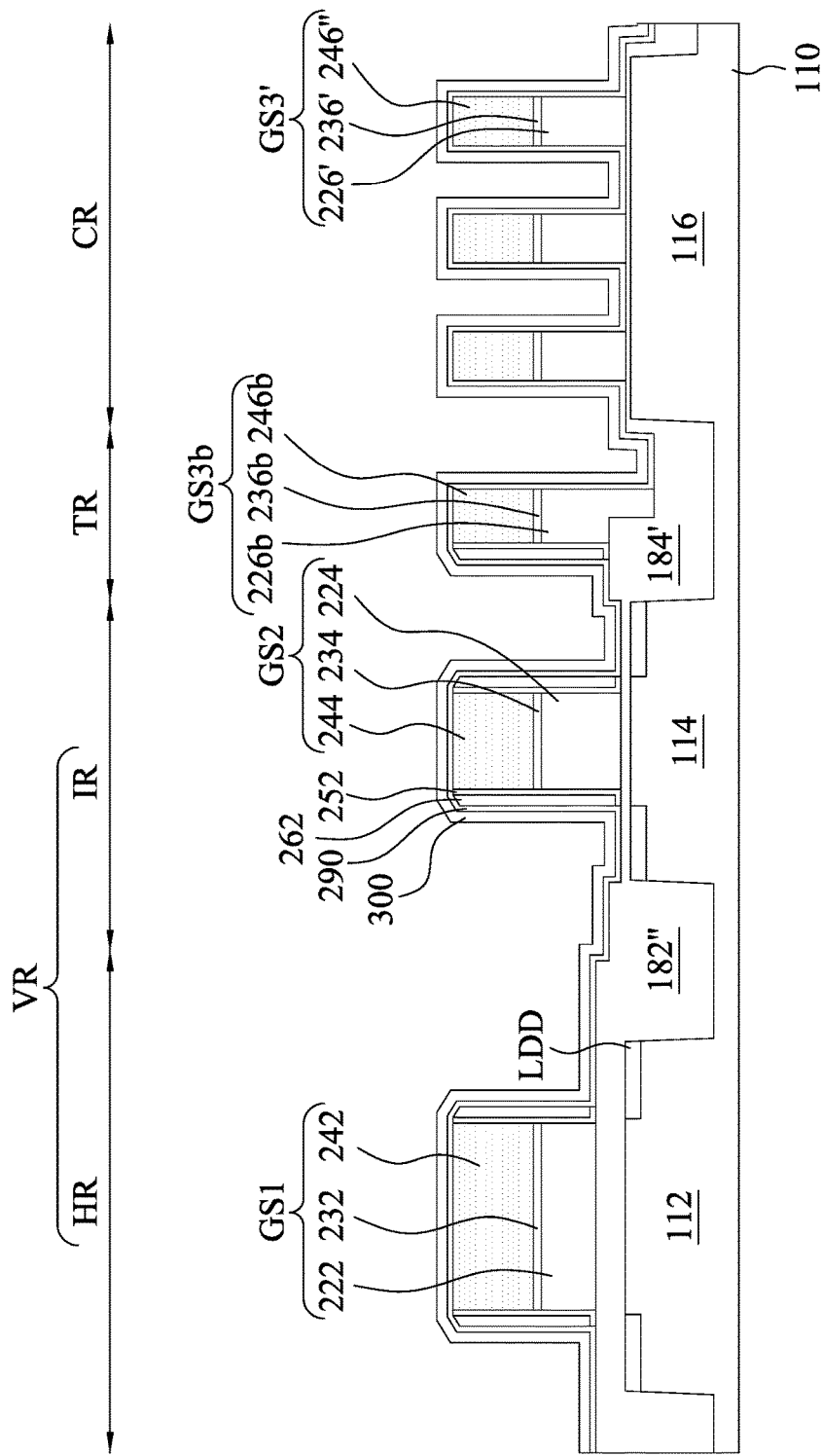

Reference is made to FIGS. 33A-33B. A seal layer 290 is conformably deposited over the structure of FIGS. 32A-32C, and then, a spacer layer 300 is conformably deposited over the seal layers 290. The seal layer 290 may include suitable dielectric materials, such as semiconductor nitride (e.g., silicon nitride (SiN)), semiconductor oxynitride (e.g., silicon oxynitride (SiON)), the like, or the combination thereof. The spacer layer 300 may include suitable dielectric materials, such as semiconductor nitride (e.g., silicon nitride (SiN)), semiconductor oxynitride (e.g., silicon oxynitride (SiON)), carbon-doped silicon oxynitride, the like, or the combination thereof. In some embodiments, the spacer layer 300 may include a material different from that of the seal layers 252, the spacers 262, and the seal layer 290. For example, the seal layers 252, the spacers 262, and the seal layer 290 may include silicon nitride, and the spacer layer 300 may include carbon-doped silicon oxynitride. In some embodiments, the seal layer 290 and the spacer layer 300 are formed around the gate electrode stacks GS1, GS2, and GS3'. The deposition of the seal layer 290 and the spacer layer 300 may include ALD, CVD, the like, or the combination thereof.

Figure 34A:
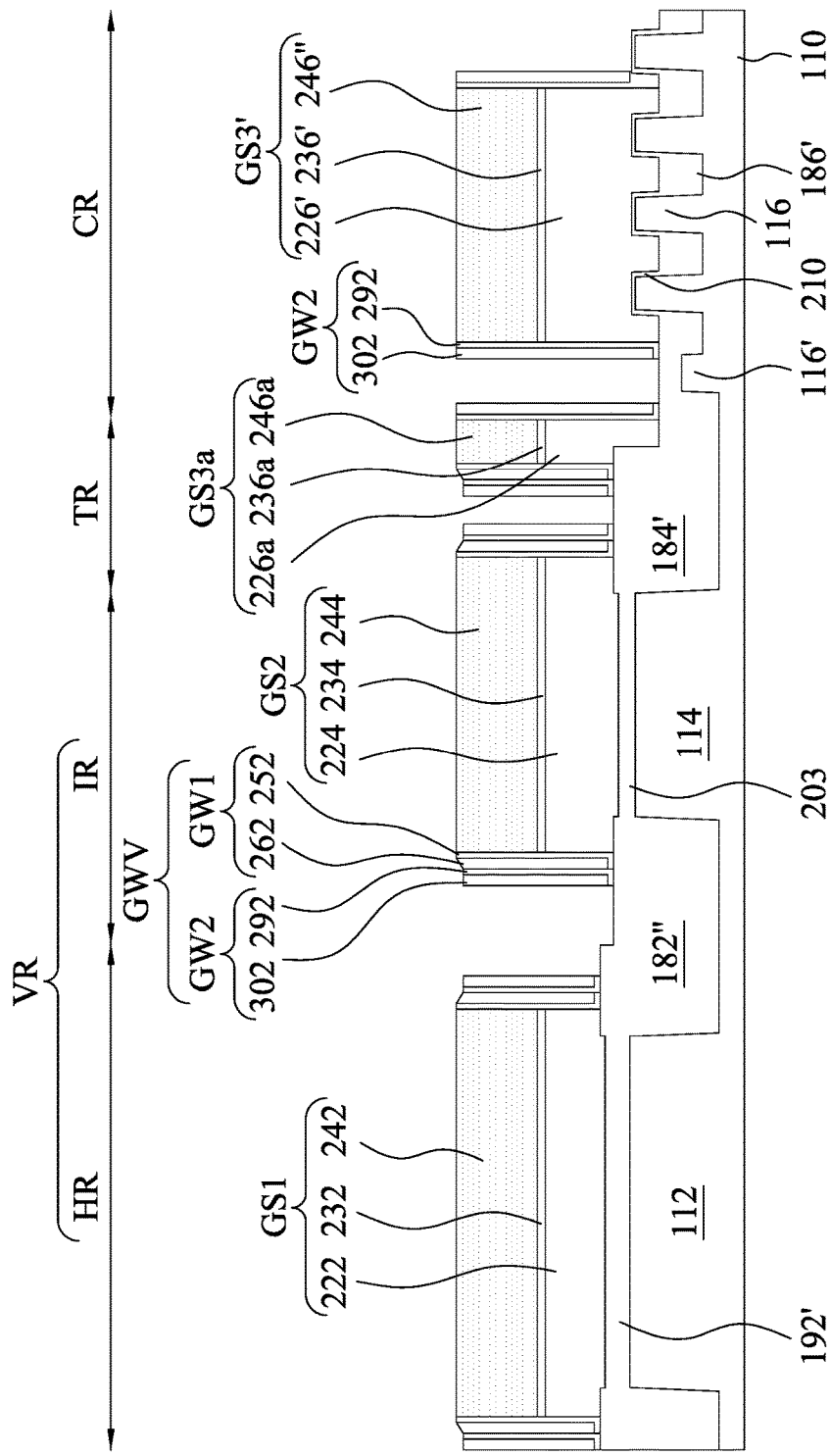
Figure 34B:
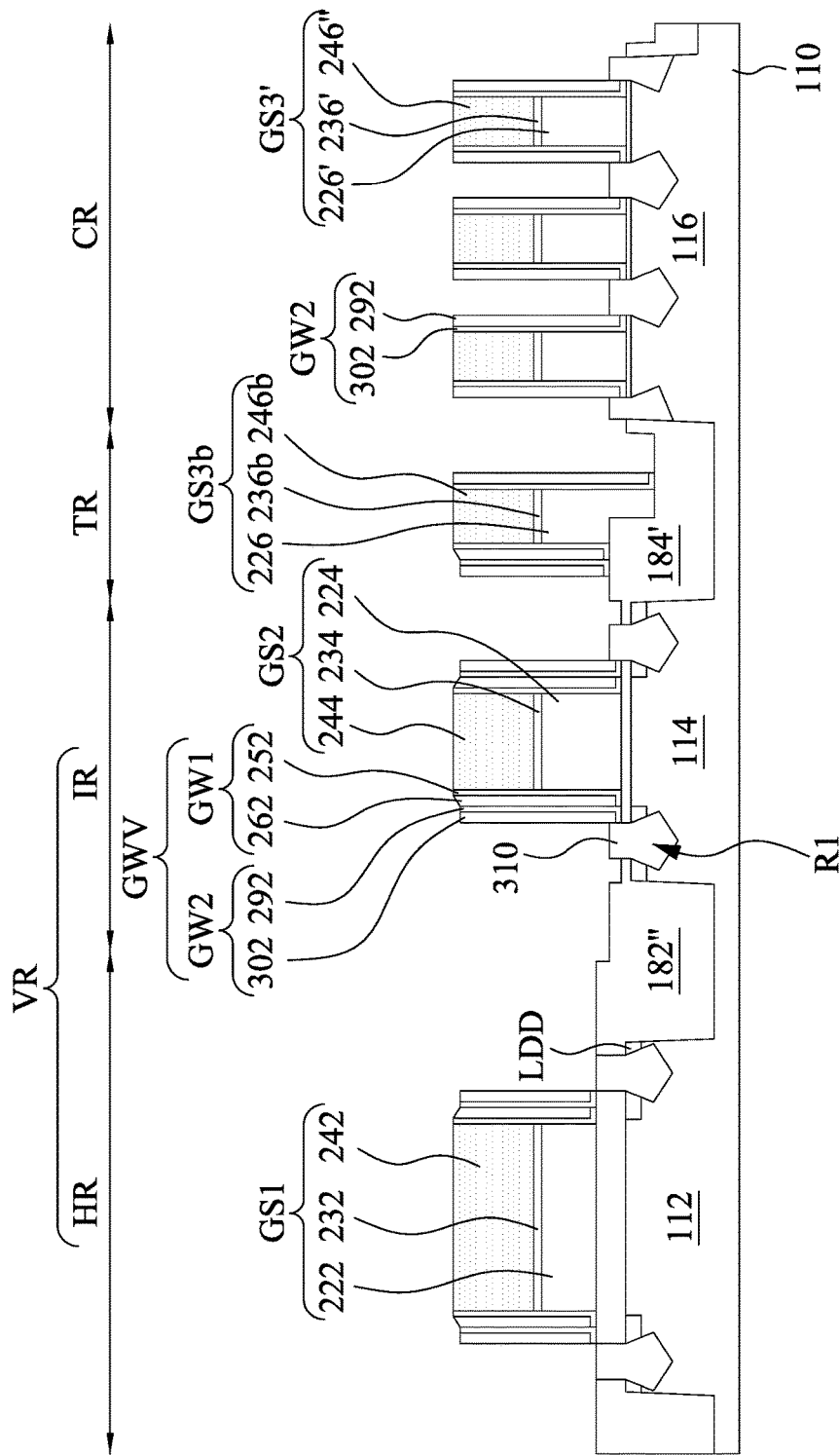

Reference is made to FIGS. 34A-34B. The seal layer 290 and spacer layer 300 may be patterned into seal layers 292 and spacers 302 (referring to FIGS. 33A and 33B) by suitable anisotropic etching process. For example, a dry etch process, using suitable gas etchants, may be performed to remove horizontal portions of the seal layer 290 and spacer layer 300 (referring to FIGS. 33A and 33B), and remaining vertical portions of the seal layer 290 and spacer layer 300 (referring to FIGS. 33A and 33B respectively form the seal layers 292 and spacers 302. In some embodiments, a combination of the seal layers 252 and the spacers 262 are referred to as gate spacers GW1, a combination of the seal layers 292 and the spacers 302 are referred to as gate spacers GW2. In some embodiments, a combination of the gate spacers GW1 and GW2 over the region VR are referred to as gate spacers GWV. The gate spacers GWV may leave some regions of the active regions 112 and 114 exposed, and the gate spacers GW2 over the core region CR may leave some regions of the semiconductor fins 116 exposed.

In some embodiments, the exposed regions of the active regions 112 and 114 and the semiconductor fins 116 are then etched to form recesses R1, and epitaxial source/drain structures 310 are formed in the recesses R1. The epitaxial source/drain structures 310 may include Ge, Si, GaAs, AlGaAs, SiGe, GaAsP, SiP, or other suitable material. The epitaxial source/drain structures 310 may be in-situ doped during the epitaxial process by introducing doping species including: p-type dopants, such as boron or $BF_2$; n-type dopants, such as phosphorus or arsenic; and/or other suitable dopants including combinations thereof. If the epitaxial source/drain structures 310 are not in-situ doped, an implantation process (i.e., a junction implant process) is performed to dope the epitaxial source/drain structures 310. In some exemplary embodiments, the epitaxial source/drain structures 310 in an NFET device include SiP, while those in a PFET device include SiGe, SiGeSnB, and/or GeSnB. In some other embodiments, doped source/drain regions may be formed in the exposed regions of the active regions 112 and 114 and the semiconductor fins 116, and the epitaxial source/drain structures 310 may be omitted.

In the present embodiments, the gate spacers GWV is thicker than the gate spacers GW2 over the core region CR. For example, a width of the gate spacers GWV is greater than a width of the gate spacers GW2 over the core region CR. By the configuration of thicker sidewall spacer, a distance between the gate electrode stack GS1/GS2 and adjacent source/drain structures 310 in the region VR is greater than a distance between the gate electrode stack GS3' and adjacent source/drain structures 310 in the core region CR. Therefore, for I/O devices in the I/O region IR and high voltage devices in the high voltage region HR, better hot carrier injection (HCI) reliability performance can be achieved.

Figure 35A:
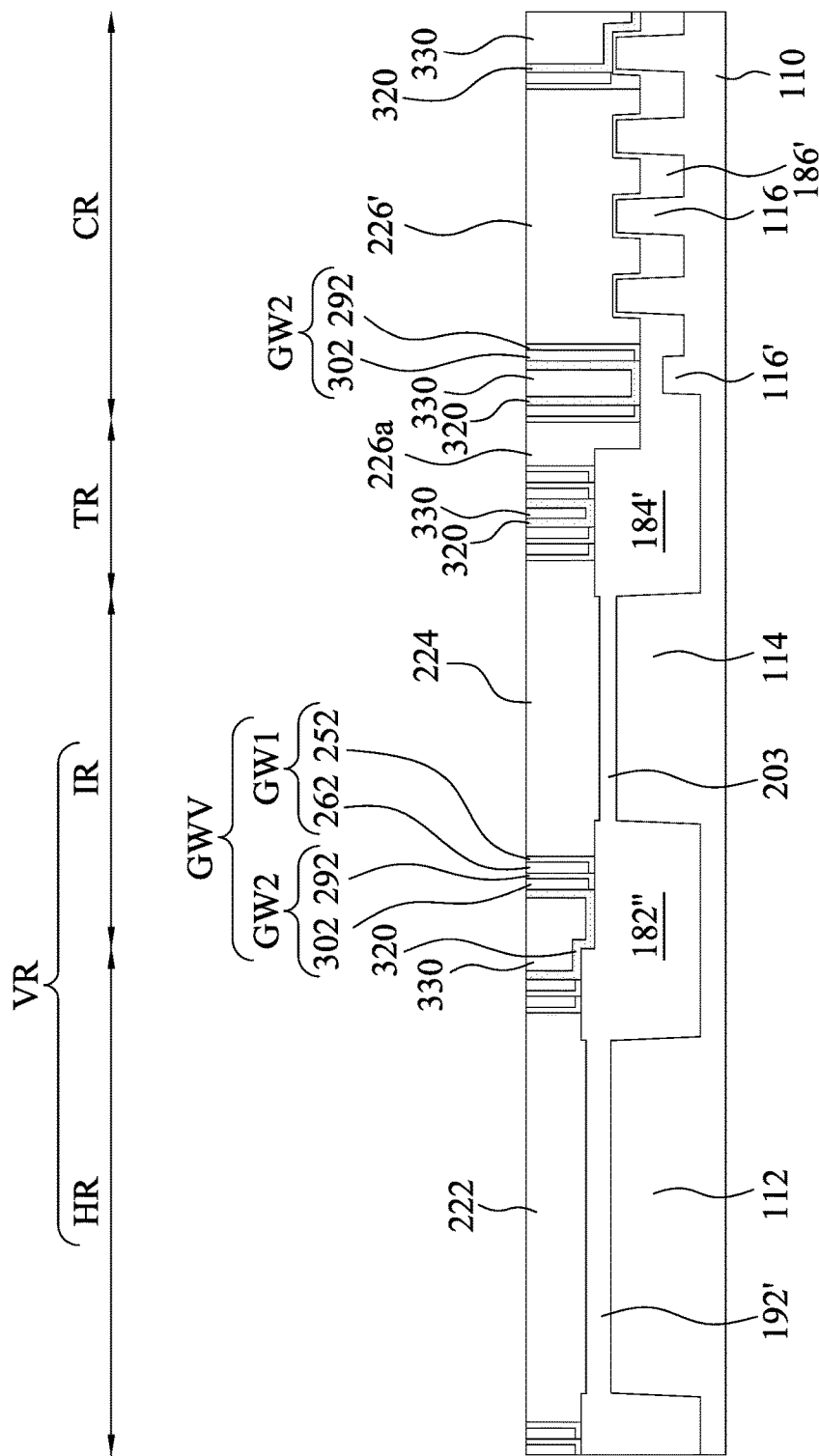
Figure 35B:
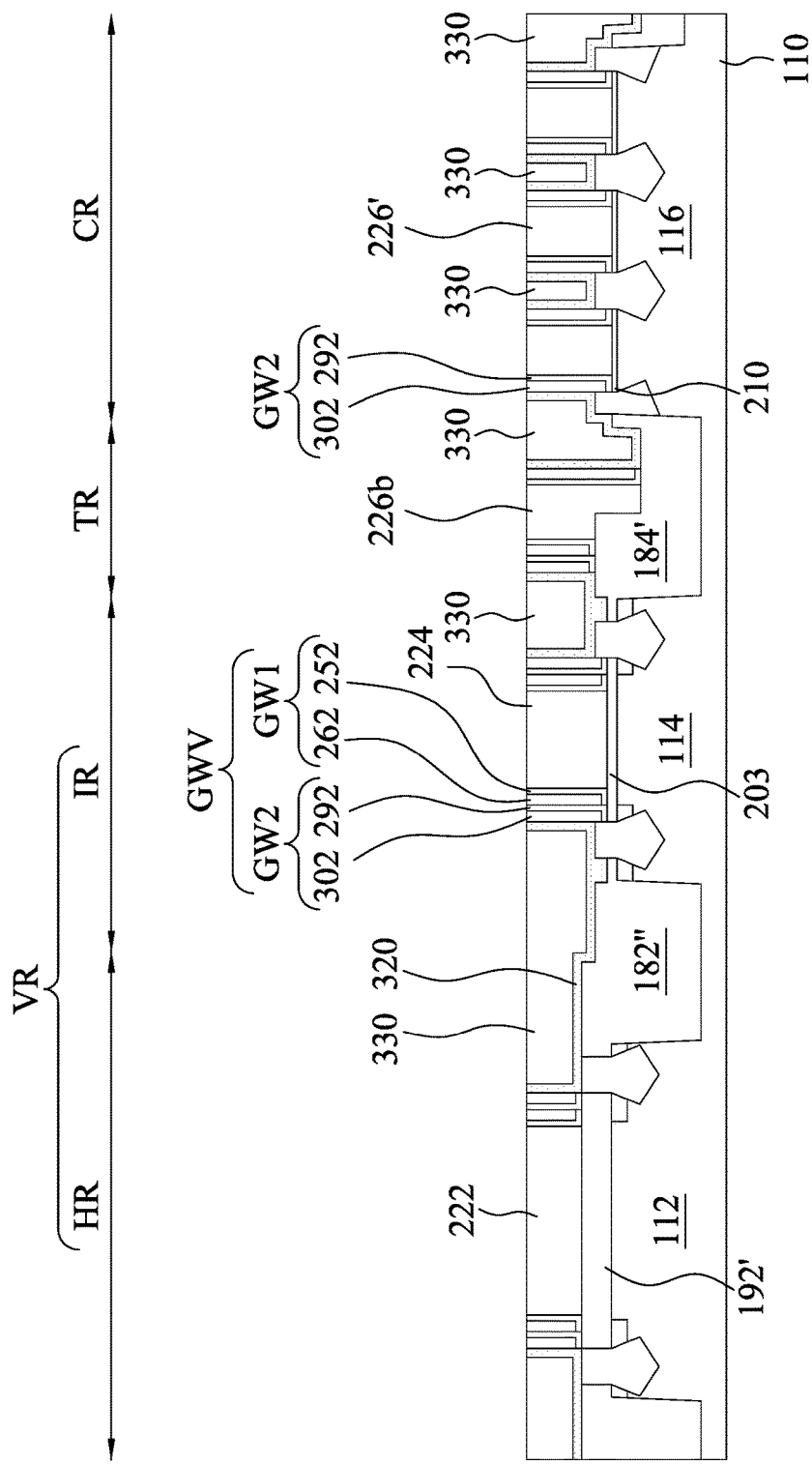

Reference is made to FIGS. 35A and 35B. An interlayer dielectric (ILD) layer 330 is formed on the structure shown in FIGS. 34A and 34B. Afterwards, a CMP process may be performed to remove excessive material of the ILD layer 330. The CMP process may also remove the masks 242, 244, 246a, 246b, 246" and the hard mask layers 232, 234, 236a, 236b, 236' (referring to FIGS. 34A and 34B), thereby exposing the gate electrodes 222, 224, 226a, 226b, and 226'. The CMP process may planarize a top surface of the ILD layer 330 with top surfaces of the gate electrodes 222, 224, 226a, 226b, and 226'. In some embodiments, the ILD layer 330 may include silicon oxide, silicon nitride, silicon oxynitride, tetraethoxysilane (TEOS), phosphosilicate glass (PSG), borophosphosilicate glass (BPSG), low-k dielectric material, and/or other suitable dielectric materials. Examples of low-k dielectric materials include, but are not limited to, fluorinated silica glass (FSG), carbon doped silicon oxide, amorphous fluorinated carbon, parylene, bis-benzocyclobutenes (BCB), or polyimide. The ILD layer 330 may be formed using, for example, CVD, ALD, spin-on-glass (SOG) or other suitable techniques.

In some embodiments, a contact etch stop layer (CESL) 320 may be optionally blanket formed on the structure shown in FIGS. 34A-34B, and then the ILD layer 330 is formed over the CESL 320. That is, there is a CESL 320 between the isolation features 182", 184', 186' and the ILD layer 330 and between the epitaxial source/drain structures 310 and the ILD layer 330. The CESL 320 may include a material different from the ILD layer 330. The CESL 320 includes silicon nitride, silicon oxynitride or other suitable materials. The CESL 320 can be formed using, for example, plasma enhanced CVD, low pressure CVD, ALD or other suitable techniques.

Figure 36A:
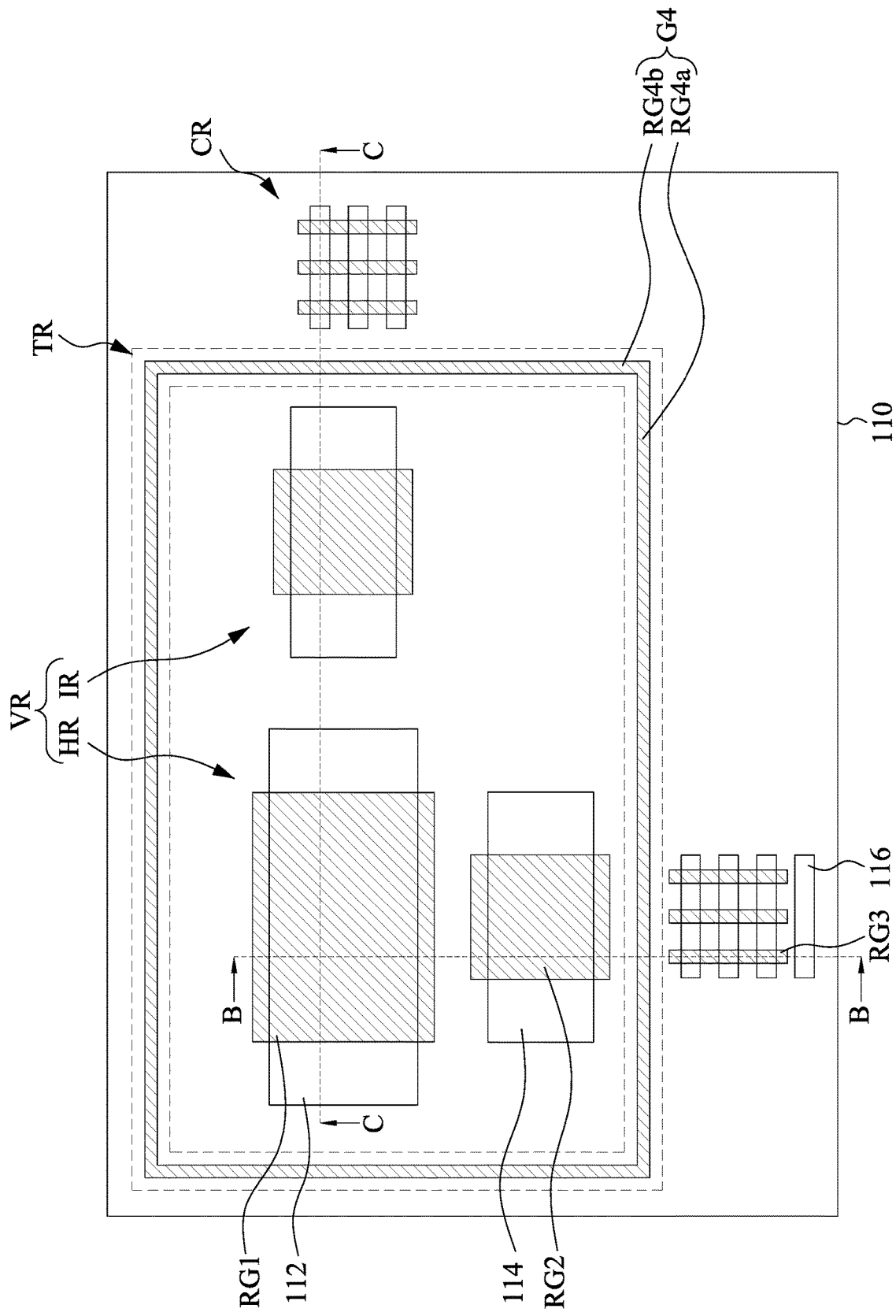
Figure 36B:
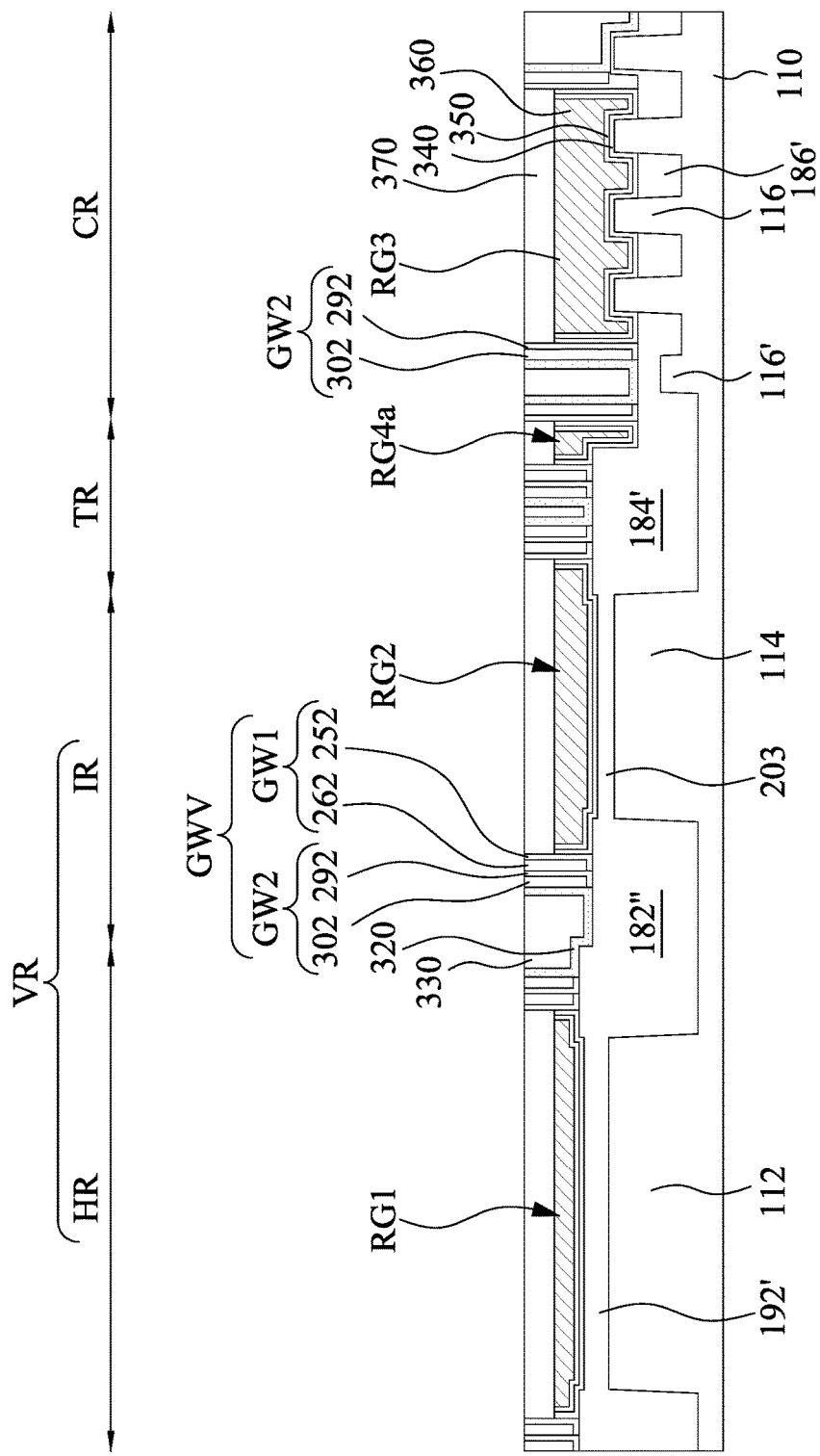
Figure 36C:
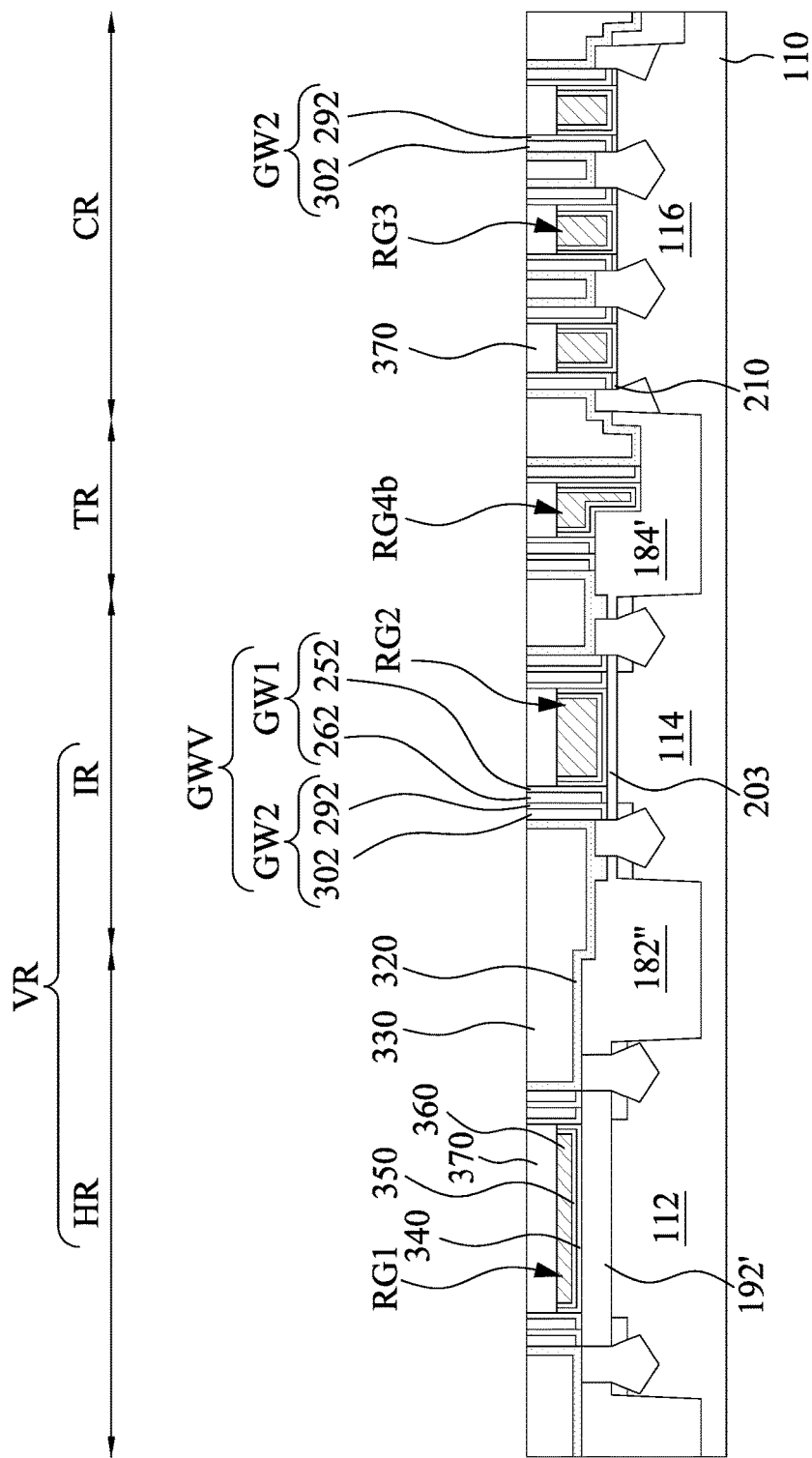

Reference is made to FIGS. 36A-36C. FIG. 36B is a cross-sectional view taken along line B-B in FIG. 36A. FIG. 36C is a cross-sectional view taken along line C-C in FIG. 36A. The gate electrodes 222, 224, 226', 226a, and 226b are respectively replaced by replacement gate structures RG1, RG2, RG3, RG4a, and RG4b. Herein, the gate electrodes 222, 224, 226', 226a, and 226b are removed to leave gate trenches between the gate spacers (e.g., the gate spacers GW2 in the core region CR and/or the gate spacers GWV in the region VR), and then the replacement gate structure RG1, RG2, RG3, RG4a, and RG4b are formed in the gate trenches. Formation of the replacement gate structures RG1, RG2, RG3, RG4a, and RG4b in the gate trenches may include depositing a high-k dielectric layer and a work function conductive layer into the gate trenches, filling the gate trenches with a filling metal, followed by a CMP process to remove excess materials out of the gate trenches. A combination of the gate structures RG4a and RG4b may be referred to as a gate structure RG4. Each of the formed replacement gate structures RG1-RG4 may include a gate dielectric layer 340, a work function conductive layer 350, and a filling metal 360.

In some embodiments, the gate dielectric layer 340 may include an interfacial layer and a high-k dielectric layer over the interfacial layer. The interfacial layer may include silicon oxide, for example, formed by thermal oxidation or CVD. The high-k dielectric layer may have a dielectric constant greater than about 3.9. In some embodiments, the high-k dielectric layer is made of high-k dielectric materials, such as metal oxides, transition metal-oxides, or the like. Examples of the high-k dielectric material include, but are not limited to, hafnium oxide ($HfO_2$), hafnium silicon oxide (HfSiO), hafnium tantalum oxide (HfTaO), hafnium titanium oxide (HfTiO), hafnium zirconium oxide (HfZrO), zirconium oxide, titanium oxide, aluminum oxide, hafnium dioxide-alumina ($HfO_2$—$Al_2O_3$) alloy, or other applicable dielectric materials. The high-k dielectric layer may be formed by a deposition processes, such as chemical vapor deposition (CVD), physical vapor deposition (PVD), atomic layer deposition (ALD), plasma enhanced CVD (PECVD) or other suitable techniques.

In some embodiments, the work function conductive layer 350 includes work function metals to provide a suitable work function for the conductive metal. In some embodiments, the work function conductive layer 350 may include one or more n-type work function metals (N-metal) for forming an n-type transistor on the substrate 110. The n-type work function metals may exemplarily include, but are not limited to, titanium aluminide (TiAl), titanium aluminium nitride (TiAlN), titanium nitride (TiN), carbo-nitride tantalum (TaCN), hafnium (Hf), zirconium (Zr), titanium (Ti), tantalum (Ta), aluminum (Al), metal carbides (e.g., hafnium carbide (HfC), zirconium carbide (ZrC), titanium carbide (TiC), aluminum carbide (AlC)), aluminides, and/or other suitable materials. In alternative embodiments, the work function conductive layer 350 may include one or more p-type work function metals (P-metal) for forming a p-type transistor on the substrate 110. The p-type work function metals may exemplarily include, but are not limited to, titanium nitride (TiN), tungsten nitride (WN), tungsten (W), ruthenium (Ru), palladium (Pd), platinum (Pt), cobalt (Co), nickel (Ni), conductive metal oxides, and/or other suitable materials. In some embodiments, the work function conductive layer 350 is formed by ALD process. In some embodiments, the filling metal 360 may include, for example, tungsten, aluminum, copper, nickel, cobalt, titanium, tantalum, titanium nitride, tantalum nitride, nickel silicide, cobalt silicide, TaC, TaSiN, TaCN, TiAl, TiAlN, or other suitable materials.

After the formation of the replacement gate structures RG1-RG4, the replacement gate structures RG1-RG4 may be etched backed, such that a top surface of the replacement gate structures RG1-RG4 is lower than a top surface of the ILD layer 330. Then, a dielectric material is deposited to fill the gate trenches, followed by a CMP process to remove excess portions of the dielectric material from the gate trenches. The remaining portions of the dielectric material forms the masks 370 over the replacement gate structures RG1-RG4. The masks 370 may include suitable dielectric materials, such as silicon nitride, silicon carbide, silicon oxynitride, or the like.

Figure 37A:
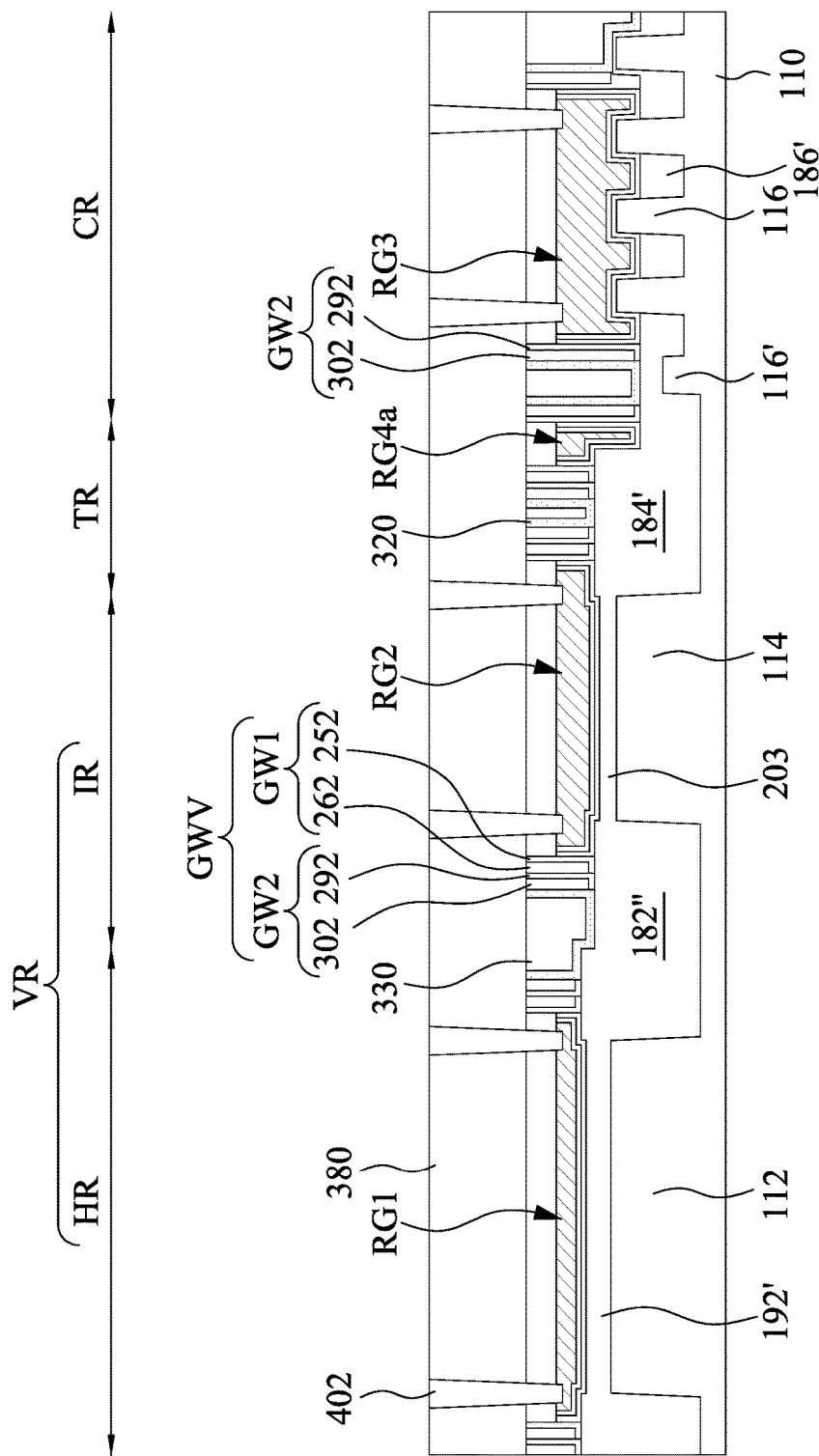
Figure 37B:
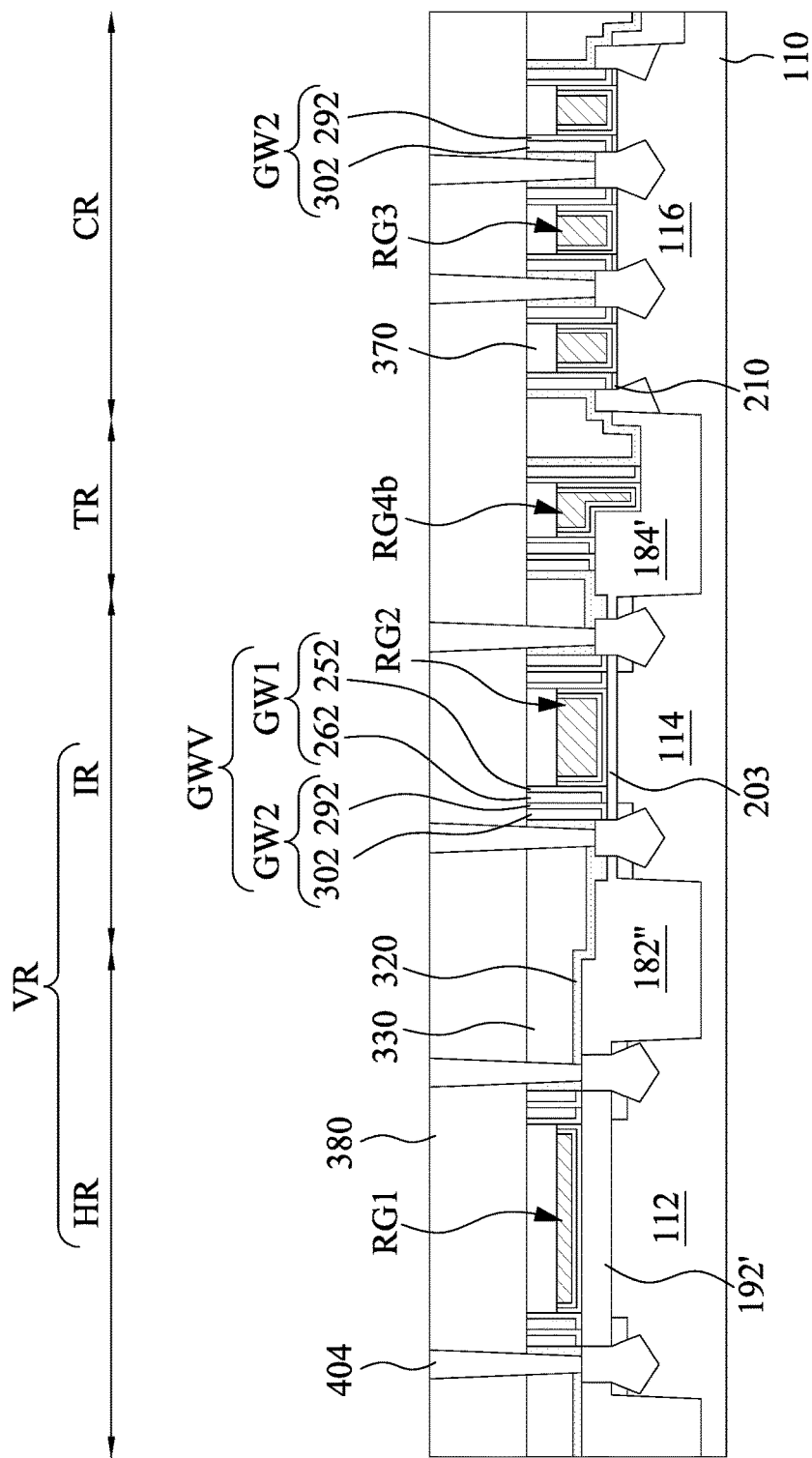

Reference is made to FIGS. 37A and 37B. An interlayer dielectric (ILD) layer 380 is formed on the structure shown in FIGS. 36A-36C. In some embodiments, the ILD layer 380 may include silicon oxide, silicon nitride, silicon oxynitride, tetraethoxysilane (TEOS), phosphosilicate glass (PSG), borophosphosilicate glass (BPSG), low-k dielectric material, and/or other suitable dielectric materials. Examples of low-k dielectric materials include, but are not limited to, fluorinated silica glass (FSG), carbon doped silicon oxide, amorphous fluorinated carbon, parylene, bis-benzocyclobutenes (BCB), or polyimide. The ILD layer 380 may be formed using, for example, CVD, ALD, spin-on-glass (SOG) or other suitable techniques.

Contacts 402 and 404 are formed in the ILD layers 330 and 380. Formation of the contacts 402 and 404 include etching holes to expose the source/drain structures 310, etching holes to expose the gate structures RG1-RG3 (performed before or after etching holes to expose the source/drain structures 310), and filling the holes with a metal layer. An excess portion of the metal layer outside the holes are removed by suitable etching or planarization process. Through the steps, the gate contacts 402 respectively connected to the gate structures RG1-RG3 are formed, and the source/drain contacts 404 respectively connected to the source/drain structures 310 are formed.

FIGS. 38A-39B illustrate various stages of manufacturing an IC structure in accordance with some embodiments. The present embodiments are similar to those illustrated in FIGS. 2-37B, except that the gate replacement process is performed such that the gate electrode 222 is not replaced with a replacement gate structure.

Figure 38A:
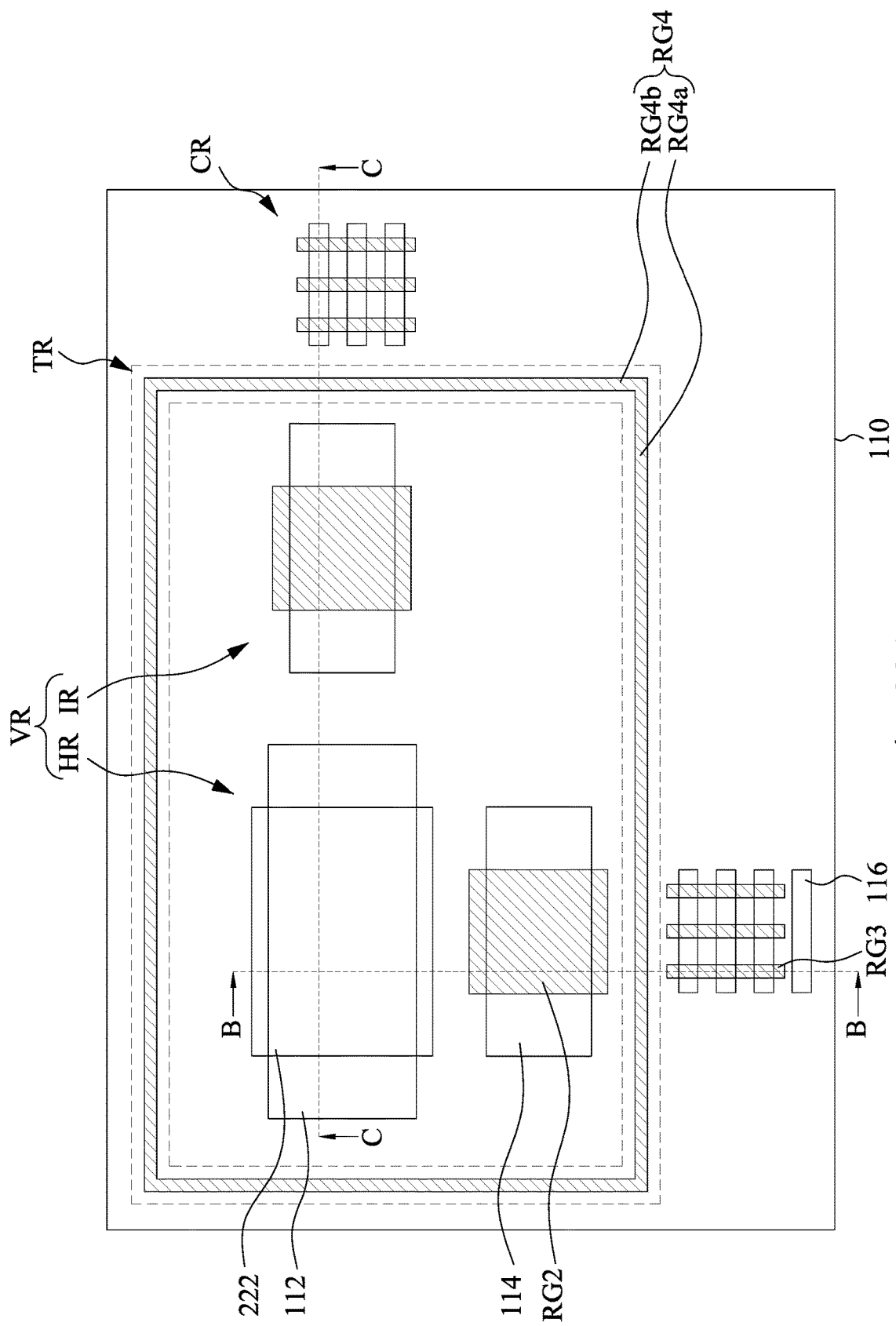
FIGS. 38A-39B illustrate various stages of manufacturing an IC structure in accordance with some embodiments.
Figure 38B:
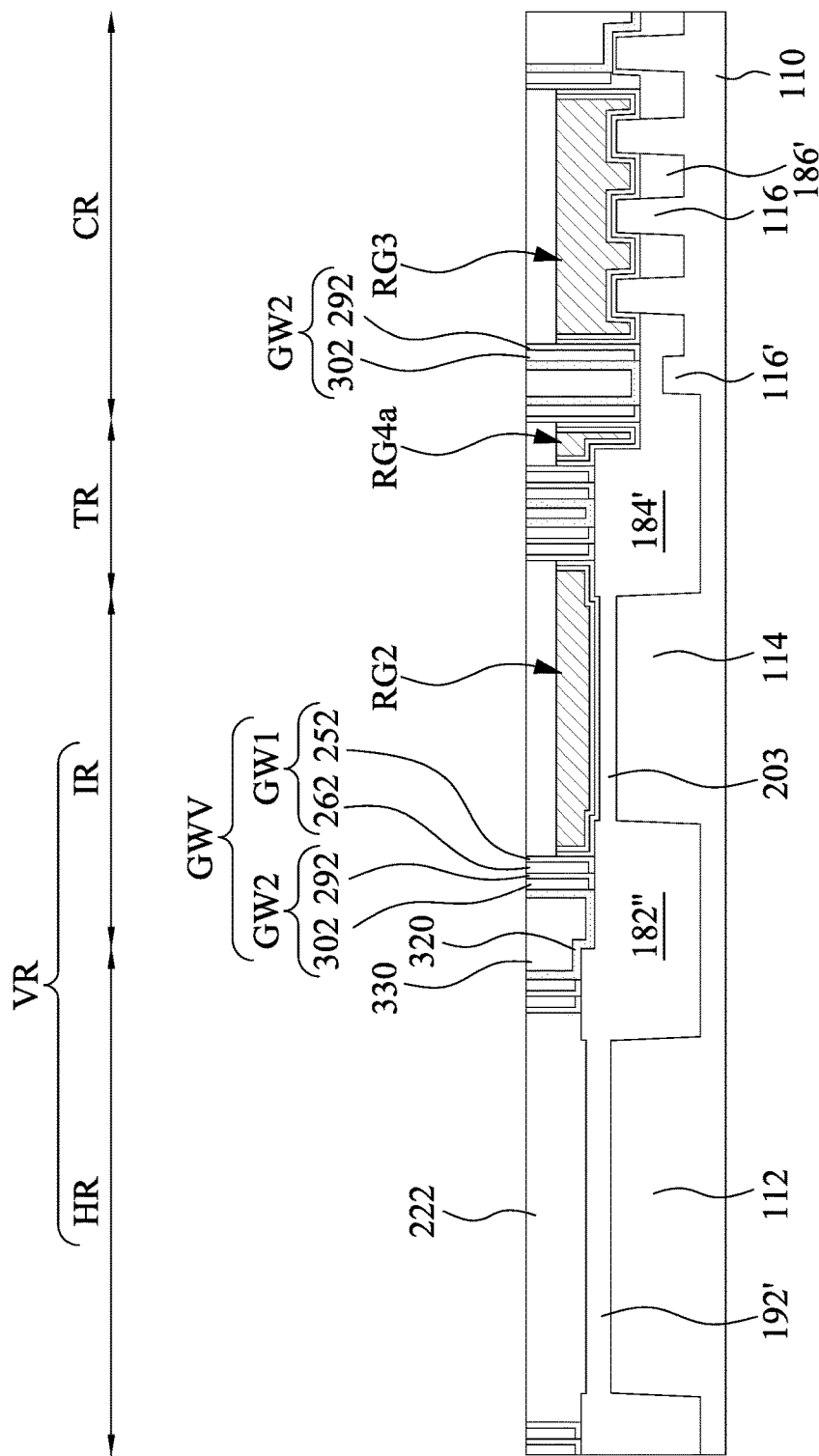
Figure 38C:
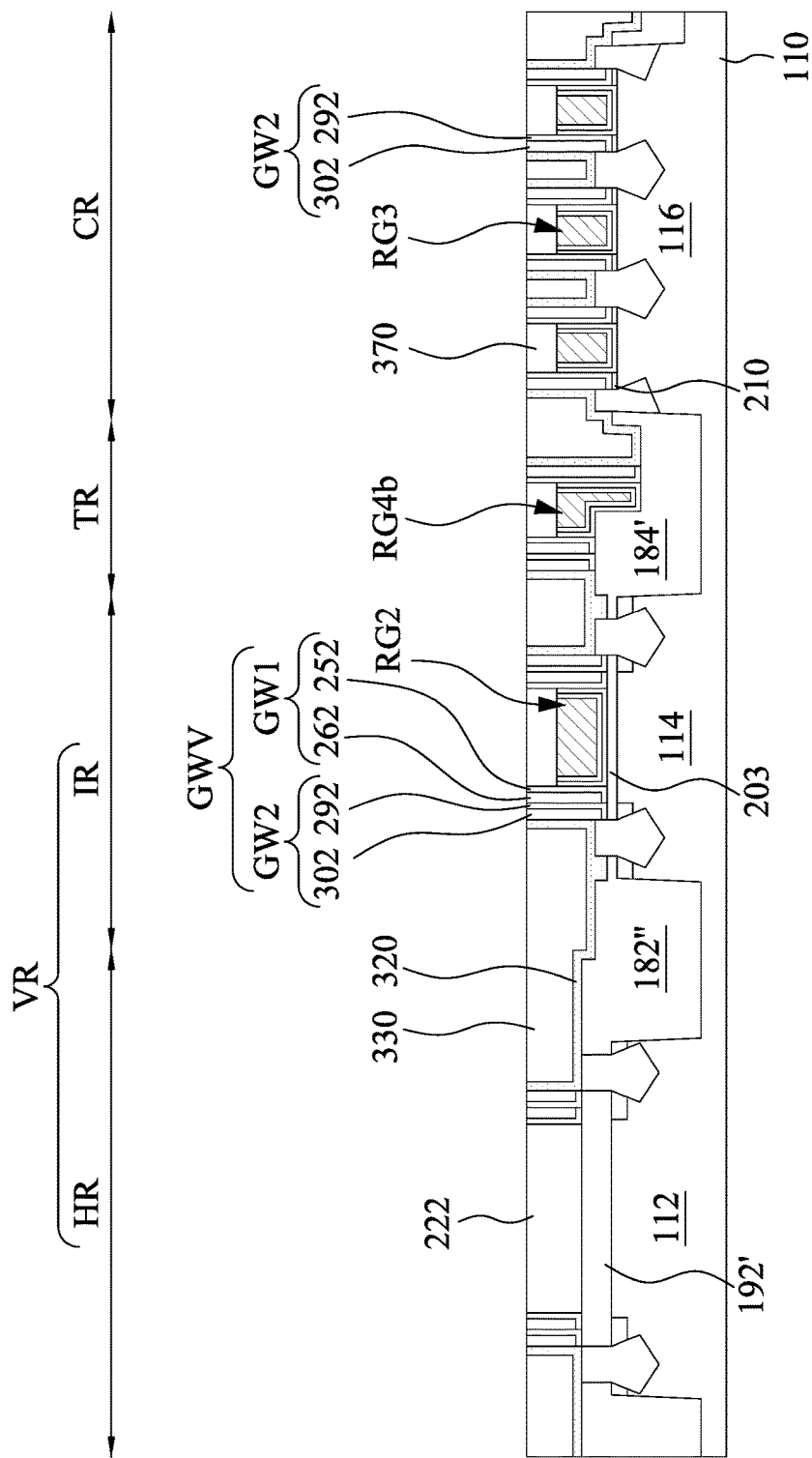

Reference is made to FIGS. 38A-38C. FIG. 38B is a cross-sectional view taken along line B-B in FIG. 38A. FIG. 38C is a cross-sectional view taken along line C-C in FIG. 38A. In the present embodiments, the gate electrodes 224, 226a, 226b, and 226' in FIGS. 35A and 35B are removed to leave gate trenches between the gate spacers (e.g., the gate spacers GW2 in the core region CR and/or the gate spacers GWV in the region VR), and then the replacement gate structures RG2-RG4 are formed in the gate trenches.

In the present embodiments, etching the gate trenches is performed such that the gate electrode 222 is not substantially etched. For example, a mask layer (e.g., photoresist mask) may be formed to cover the gate electrode 222 and expose the gate electrodes 224, 226a, 226b, and 226' during etching the gate trenches. The mask layer then removed after etching the gate trenches or forming the replacement gate structure RG2-RG4. Formation of the replacement gate structures RG2-RG4 in the gate trenches may include depositing a high-k dielectric layer and a work function conductive layer into the gate trenches, filling the gate trenches with a filling metal, followed by a CMP process to remove excess materials out of the gate trenches. Each of the formed replacement gate structures RG2-RG4 may include a gate dielectric layer 340, a work function conductive layer 350, and a filling metal 360.

After the formation of the replacement gate structures RG2-RG4, the replacement gate structures RG2-RG4 may be etched backed, such that a top surface of the replacement gate structures RG2-RG4 is lower than top surfaces of the ILD layer 330 and the gate electrode 222. Then, a dielectric material is deposited to fill the gate trenches, followed by a CMP process to remove excess portions of the dielectric material from the gate trenches. The remaining portions of the dielectric material forms the masks 370 over the replacement gate structures RG2-RG4. The masks 370 may include suitable dielectric materials, such as silicon nitride, silicon carbide, silicon oxynitride, or the like.

Figure 39A:
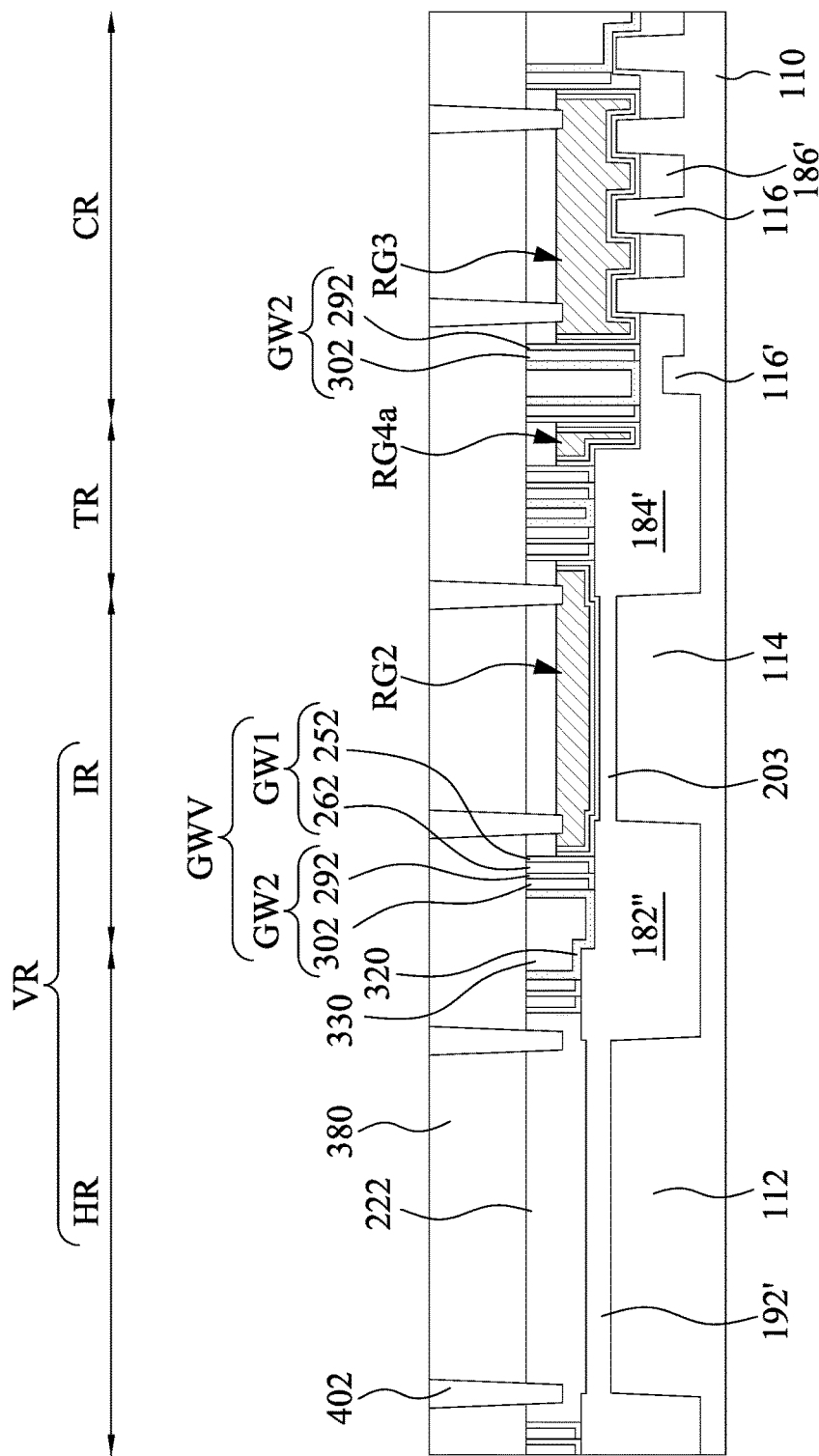
Figure 39B:
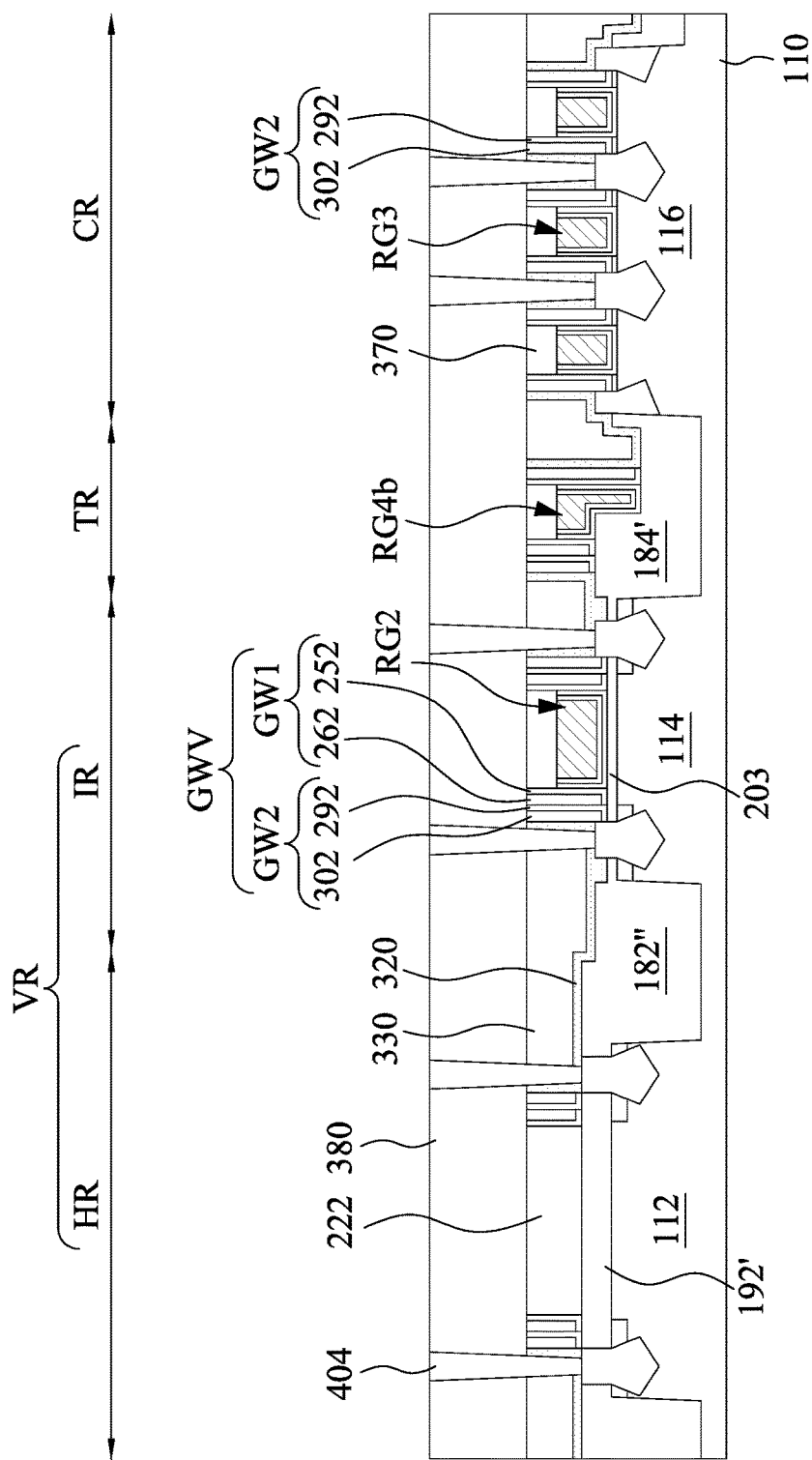

Reference is made to FIGS. 39A and 39B. An ILD layer 380 is formed over the structure shown in FIGS. 38A-38C, and contacts 402 and 404 are then formed in the ILD layers 330 and 380. Formation of the contacts 402 and 404 include etching holes to expose the source/drain structures 310, etching holes to expose the gate electrode 222 and the gate structures RG2 and RG3 (performed before or after etching holes to expose the source/drain structures 310), and filling the holes with a conductive material. The conductive material may include, for example, tungsten, aluminum, copper, nickel, cobalt, titanium, tantalum, titanium nitride, tantalum nitride, nickel silicide, cobalt silicide, TaC, TaSiN, TaCN, TiAl, TiAlN, or other suitable materials. An excess portion of the conductive material outside the holes are removed by suitable etching or planarization process. Through the steps, the gate contacts 402 respectively connected to the gate electrode 222 and the gate structures RG2 and RG3 are formed, and the source/drain contacts 404 respectively connected to the source/drain structures 310 are formed. Other details regarding the present embodiments are similar to those illustrated in FIGS. 2-37B, and not repeated herein.

Figure 40A:
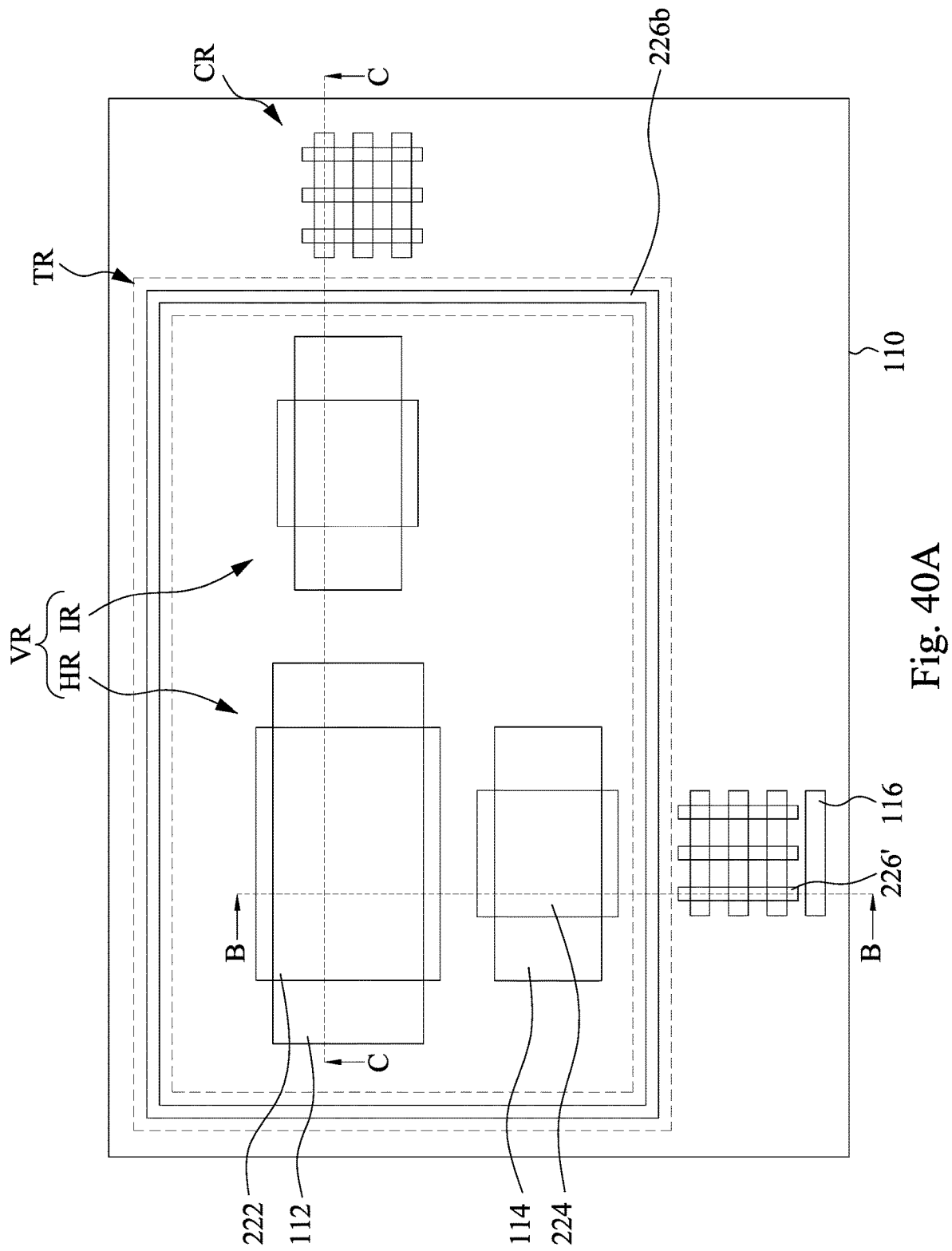
FIG. 40A is a top view of an IC structure in accordance with some embodiments.
Figure 40B:
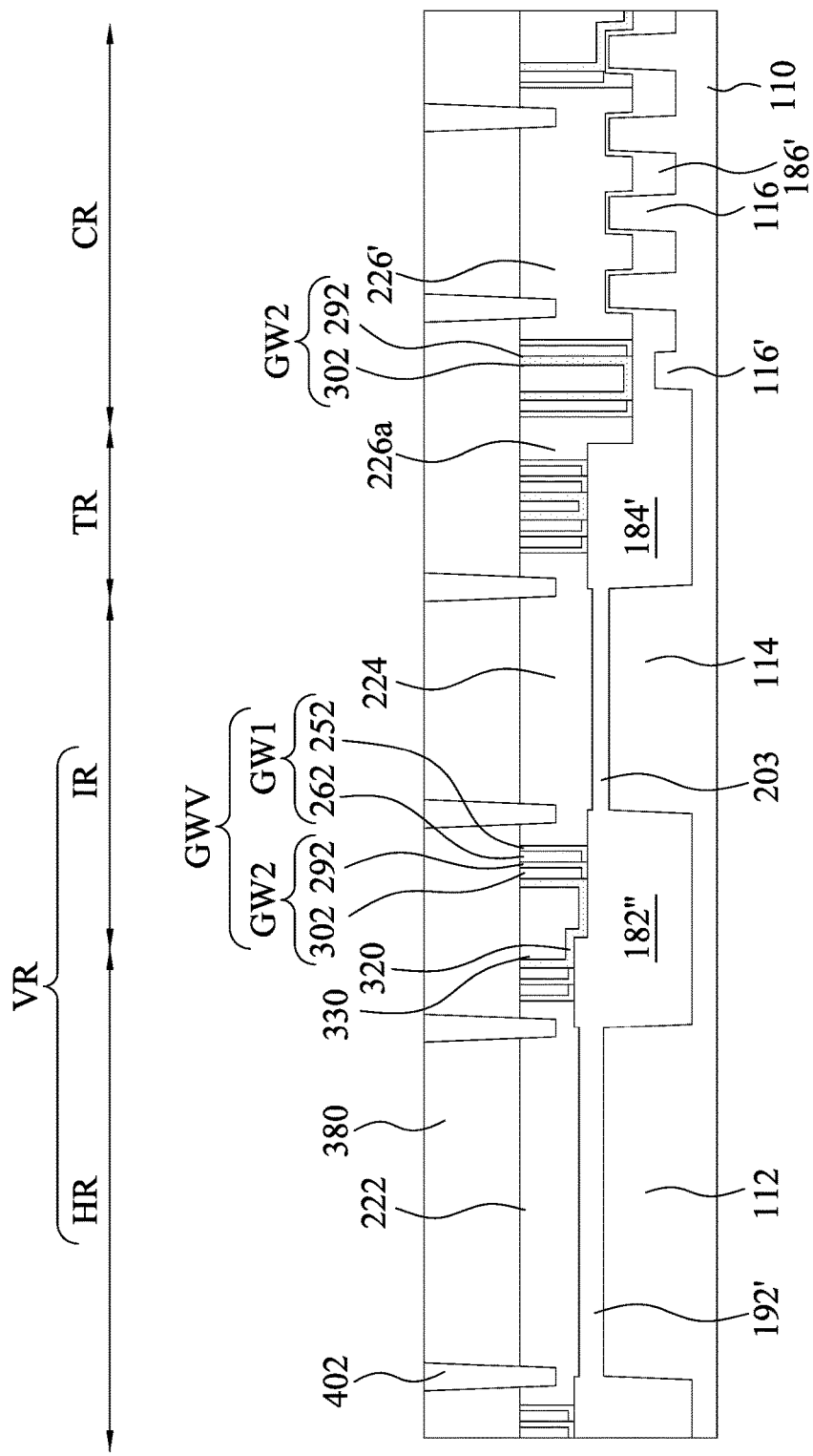
FIG. 40B is a cross-sectional view taken along line B-B in FIG. 40A.
Figure 40C:
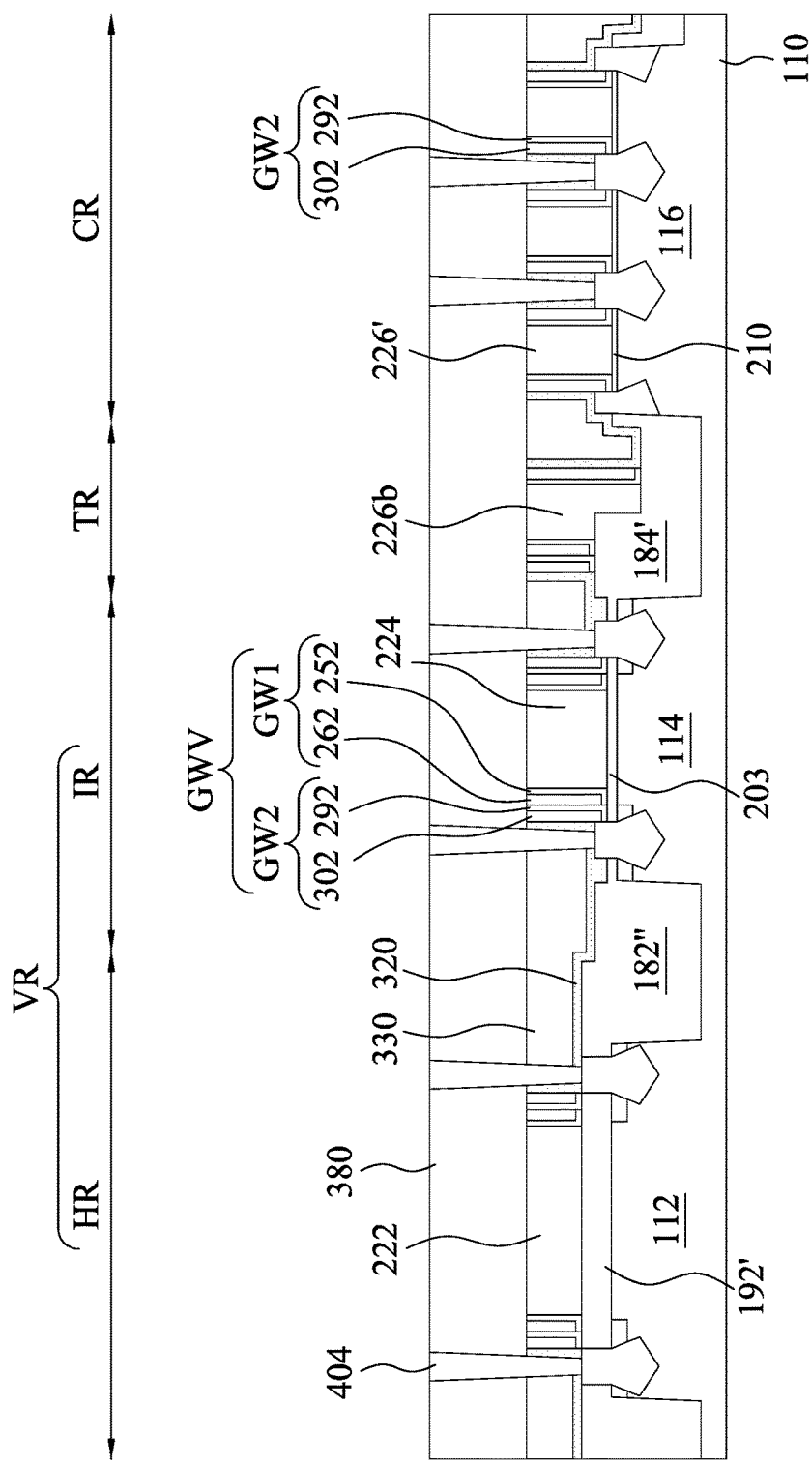
FIG. 40C is a cross-sectional view taken along line C-C in FIG. 40A.

FIG. 40A is a top view of an IC structure in accordance with some embodiments. FIG. 40B is a cross-sectional view taken along line B-B in FIG. 40A. FIG. 40C is a cross-sectional view taken along line C-C in FIG. 40A. The present embodiments are similar to those illustrated in FIGS. 2-37B, except that the gate in the regions CR, IR, and HR are polysilicon gate electrode. In the present embodiments, the gate electrodes 222, 224, 226a, 226b, and 226' in FIGS. 35A and 35B are not replaced with metal replacement gate structures.

An ILD layer 380 is formed over the gate electrodes 222, 224, 226a, 226b, and 226' and the ILD layer 330 in FIGS. 35A and 35B, and then contacts 402 and 404 are formed in the ILD layers 330 and 380. Formation of the contacts 402 and 404 include etching holes to expose the source/drain structures 310, etching holes to expose the gate electrodes 222, 224, 226' (performed before or after etching holes to expose the source/drain structures 310, and filling the holes with a metal layer. An excess portion of the metal layer outside the holes are removed by suitable etching or planarization process. Through the steps, the gate contacts 402 respectively connected to the gate electrodes 222, 224, 226' are formed, and the source/drain contacts 404 respectively connected to the source/drain structures 310 are formed. Other details regarding the present embodiments are similar to those illustrated in FIGS. 2-37B, and not repeated herein.

Figure 41:
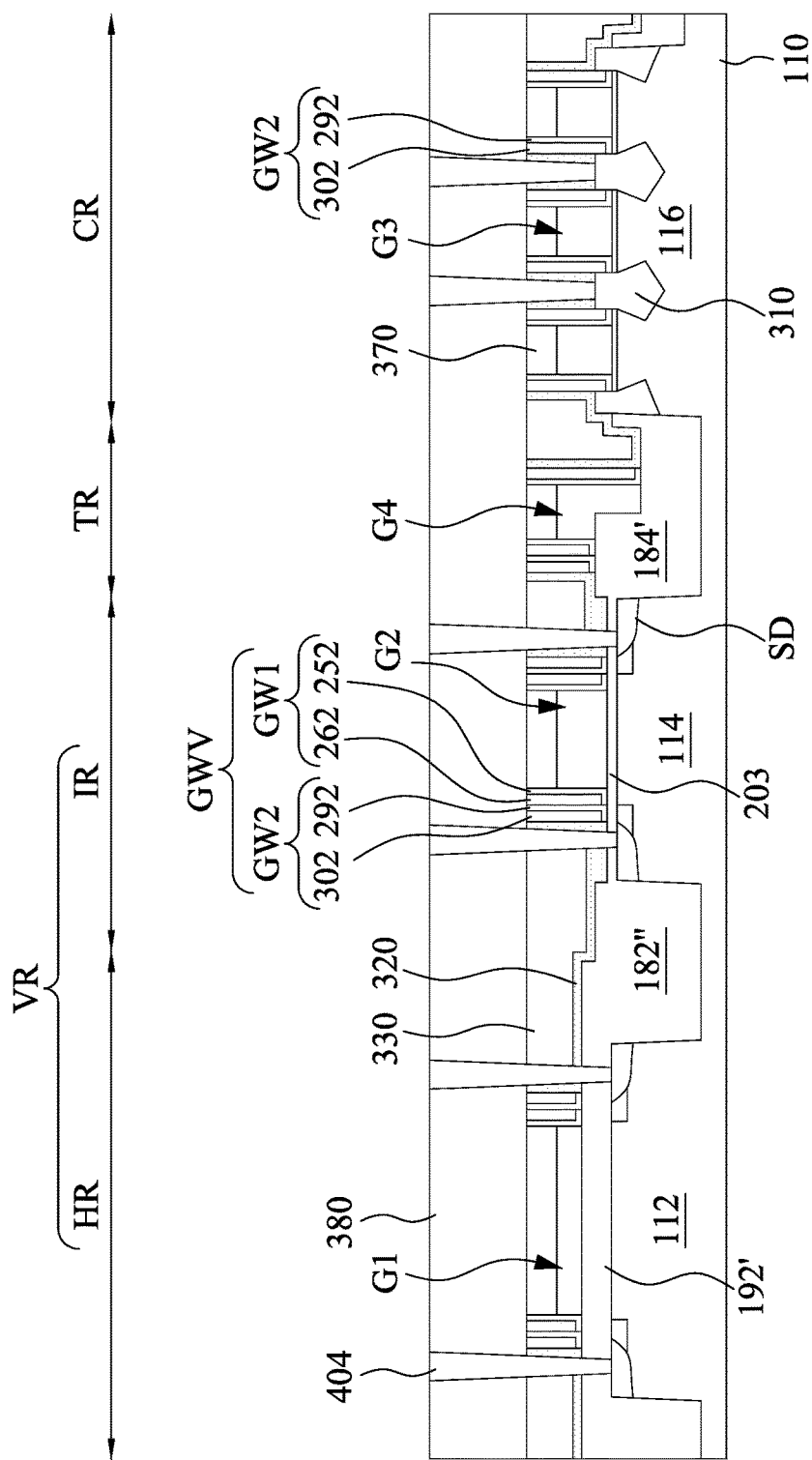
FIG. 41 is a cross-sectional view of an IC structure in accordance with some embodiments.

FIG. 41 is a cross-sectional view of an IC structure in accordance with some embodiments. The present embodiments are similar to those illustrated in FIGS. 1A-1C, except that source/drain regions SD are formed in the substrate 110 in the high voltage region HR and the I/O region IR, and the epitaxial source/drain structures 310 are formed in the core region CR. In the present embodiments, the high voltage region HR and the I/O region IR are free of the epitaxial source/drain structures 310.

The formation of the source/drain regions SD includes doping regions of the substrate exposed by the gate stacks RG1-RG4 and the gate spacers GWV and the gate spacer GW2 over the core region CR by suitable implantation process. The implantation process may be performed with n-type dopants, such as phosphorus or arsenic, and/or p-type dopants, such as boron or $BF_2$, depending on design requirements. In the present embodiments, a doping concentration of the source/drain regions SD is higher than that a doping concentration of the well or a doping concentration of the LDD lightly doped regions LLD. For example, a doping concentration of the source/drain regions SD is greater than about 1E15 atoms/$cm^2$, a doping concentration of the source/drain regions SD is in a range of 1E14 to about 1E15, and a doping concentration of the well regions (e.g., well regions HW, IW, and CW in FIG. 20) is lower than about 1E13 atoms/$cm^2$. Other details regarding the present embodiments are similar to those illustrated in FIGS. 1A-1C, and not repeated herein.

Embodiments of the present disclosure are applicable to integrate I/O/high device in FinFet technology. Based on the above discussions, it can be seen that the present disclosure offers advantages. It is understood, however, that other embodiments may offer additional advantages, and not all advantages are necessarily disclosed herein, and that no particular advantage is required for all embodiments. One advantage is that better hot carrier injection (HCI) reliability performance can be achieved by the configuration of thicker sidewall spacer for I/O/high voltage devices. Another advantage is that the thickness of the sidewall spacers around I/O/high voltage devices may be selectively increased without affecting the thickness of the sidewall spacers around other devices. Still another advantage is that the fabrication process is compatible with FinFet process without impact on existing devices, SRAM yield, and intellectual property core (IP).

According to some embodiments, a method for manufacturing an IC structure is provided. The method includes depositing a gate electrode layer over a semiconductor substrate; patterning the gate electrode layer into a first gate electrode and a gate electrode extending portion; forming a first gate spacer alongside the first gate electrode; patterning the gate electrode extending portion into a second gate electrode after forming the first gate spacer; and forming a second gate spacer alongside the second gate electrode and a third gate spacer around the first gate spacer.

According to some embodiments, a method for manufacturing an IC structure is provided. The method includes forming a semiconductor fin over a first region of the semiconductor substrate; forming an isolation structure surrounding the semiconductor fin; recessing a top surface of the isolation structure to a level lower than a top of the semiconductor fin; forming a first gate structure over the semiconductor fin; and forming a second gate structure over the second region of the semiconductor substrate. The second gate structure is larger than the first gate structure from a top view.

According to some embodiments, an IC structure includes a semiconductor substrate, a first gate electrode, a first gate spacer, a second gate electrode, and a second gate spacer. The first gate electrode is over a first region of the semiconductor substrate. The first gate spacer is alongside the first gate electrode. The second gate electrode is over a second region of the semiconductor substrate and is larger than the first gate electrode from a top view. The second gate spacer is alongside the second gate electrode. A width of the second gate spacer is greater than a width of the first gate spacer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A method comprising:
forming a semiconductor fin over a semiconductor substrate;
depositing a gate electrode layer over the semiconductor substrate;
patterning the gate electrode layer into a first gate electrode and a gate electrode extending portion, wherein patterning the gate electrode layer is performed such that the gate electrode extending portion is over the semiconductor fin;
forming a first gate spacer alongside the first gate electrode;
patterning the gate electrode extending portion into a second gate electrode after forming the first gate spacer; and forming a second gate spacer alongside the second gate electrode and a third gate spacer around the first gate spacer.

2. The method of claim 1, wherein forming the second gate spacer and the third gate spacer comprises:
depositing a spacer layer over the semiconductor substrate, the first gate electrode, the first gate spacer, and the second gate electrode; and
patterning the spacer layer into the second gate spacer and the third gate spacer.

3. The method of claim 1, wherein patterning the gate electrode layer is performed such that the first gate electrode is over a region of the semiconductor substrate free of the semiconductor fin.

4. The method of claim 1, further comprising:
depositing a filling material on a side of the first gate spacer facing away from the first gate electrode prior to patterning the gate electrode extending portion.

5. The method of claim 4, further comprising:
removing the filling material after patterning the gate electrode extending portion and prior to forming the second gate spacer.

6. The method of claim 5, further comprising:
masking the second gate electrode when removing the filling material.

7. A method comprising:
forming a semiconductor fin over a first region of a semiconductor substrate;
forming an isolation structure surrounding the semiconductor fin;
depositing a first dielectric layer over a second region of the semiconductor substrate after forming the isolation structure;
recessing a top surface of the isolation structure to a level lower than a top of the semiconductor fin;
forming a first gate structure over the semiconductor fin; and
forming a second gate structure over the second region of the semiconductor substrate, wherein the second gate structure is larger than the first gate structure from a top view.

8. The method of claim 7, further comprising:
masking the second region of the semiconductor substrate when recessing the top surface of the isolation structure.

9. The method of claim 7, further comprising:
forming a well region in the semiconductor fin prior to recessing the top surface of the isolation structure.

10. The method of claim 7, further comprising:
removing a portion of the first dielectric layer over the first region of the semiconductor substrate prior to recessing the top surface of the isolation structure.

11. The method of claim 7, wherein recessing the top surface of the isolation structure is performed such that a portion of the first dielectric layer over the first region of the semiconductor substrate is removed.

12. The method of claim 7, further comprising:
forming a second dielectric layer over the semiconductor fin after recessing the top surface of the isolation structure.

13. An integrated circuit (IC) structure, comprising:
a semiconductor substrate;
a first gate electrode over a first region of the semiconductor substrate;
a first gate spacer alongside the first gate electrode;
a first source/drain feature adjacent to the first gate spacer;
a second gate electrode over a second region of the semiconductor substrate, the second gate electrode being larger than the first gate electrode from a top view;
a second gate spacer alongside the second gate electrode, wherein a width of the second gate spacer is greater than a width of the first gate spacer; and
a second source/drain feature adjacent to the second gate spacer, wherein a first distance between the first gate electrode and the first source/drain feature is less than a second distance between the second gate electrode and the second source/drain feature.

14. The IC structure of claim 13, further comprising:
a dummy gate electrode over a third region of the semiconductor substrate between the first region and the second region of the semiconductor substrate.

15. The IC structure of claim 14, further comprising:
an isolation structure between the first region and the second region of the semiconductor substrate, wherein the dummy gate electrode is over the isolation structure.

16. The IC structure of claim 14, wherein the dummy gate electrode forms a closed loop encircling the second gate electrode and the second source/drain feature.

17. The IC structure of claim 13, wherein a bottommost surface of the first gate electrode is lower than a bottommost surface of the second gate electrode.

18. The IC structure of claim 13, wherein the semiconductor substrate comprises a semiconductor fin over the first region, the first gate electrode surrounds the semiconductor fin, and a bottommost surface of the second gate electrode is over a top surface of the second region of the semiconductor substrate.

19. The IC structure of claim 13, wherein the semiconductor substrate comprises a plurality of semiconductor fins over the first region, the second region of the semiconductor substrate is free of the semiconductor fins.

20. The IC structure of claim 19, wherein the semiconductor fins are aligned with the second region of the semiconductor substrate from a top view.

* * * * *